United States Patent
Tetiker et al.

(10) Patent No.: US 10,534,257 B2
(45) Date of Patent: Jan. 14, 2020

(54) LAYOUT PATTERN PROXIMITY CORRECTION THROUGH EDGE PLACEMENT ERROR PREDICTION

(71) Applicant: Lam Research Corporation, Fremont, CA (US)

(72) Inventors: Mehmet Derya Tetiker, San Francisco, CA (US); Saravanapriyan Sriraman, Fremont, CA (US); Andrew D. Bailey, III, Pleasanton, CA (US); Richard Wise, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 211 days.

(21) Appl. No.: 15/583,610

(22) Filed: May 1, 2017

(65) Prior Publication Data

US 2018/0314148 A1    Nov. 1, 2018

(51) Int. Cl.
*G03F 1/70* (2012.01)
*G03F 1/36* (2012.01)
(Continued)

(52) U.S. Cl.
CPC .............. *G03F 1/70* (2013.01); *G03F 1/36* (2013.01); *H01J 37/32009* (2013.01);
(Continued)

(58) Field of Classification Search
CPC ..... G03F 1/70; G03F 1/36; G03F 1/84; H01L 21/0274; H01L 21/67069; H01L 21/3081;
(Continued)

(56) References Cited

U.S. PATENT DOCUMENTS 5,114,233 A    5/1992    Clark et al.
5,421,934 A    6/1995    Misaka et al.
(Continued)

FOREIGN PATENT DOCUMENTS

CN    101313308 A    11/2008
CN    104736744 A    6/2015
WO    WO 2018/204193    11/2018

OTHER PUBLICATIONS

U.S. Office Action, dated Jan. 25, 2018, issued in U.S. Appl. No. 14/972,969.
(Continued)

*Primary Examiner* — Yuechuan Yu
(74) *Attorney, Agent, or Firm* — Weaver Austin Villeneuve & Sampson LLP

(57) ABSTRACT

Disclosed are methods of generating a proximity-corrected design layout for photoresist to be used in an etch operation. The methods may include identifying a feature in an initial design layout, and estimating one or more quantities characteristic of an in-feature plasma flux (IFPF) within the feature during the etch operation. The methods may further include estimating a quantity characteristic of an edge placement error (EPE) of the feature by comparing the one or more quantities characteristic of the IFPF to those in a look-up table (LUT, and/or through application of a multi-variate model trained on the LUT, e.g., constructed through machine learning methods (MLM)) which associates values of the quantity characteristic of EPE with values of the one or more quantities characteristics of the IFPF. Thereafter, the initial design layout may be modified based on at the determined quantity characteristic of EPE.

14 Claims, 33 Drawing Sheets

(51) Int. Cl.
*H01J 37/32* (2006.01)
*H01L 21/027* (2006.01)

(52) U.S. Cl.
CPC ........ *H01J 37/3244* (2013.01); *H01L 21/027* (2013.01); *H01J 2237/334* (2013.01)

(58) Field of Classification Search
CPC .............. H01L 21/3065; H01L 21/027; G06F 17/5072; G06F 17/5081; G06F 2217/12; H01J 37/32009; H01J 37/3244; H01J 2237/334
See application file for complete search history.

(56) References Cited

U.S. PATENT DOCUMENTS

| | | | |
|---|---|---|---|
| 6,268,226 | B1 | 7/2001 | Angell et al. |
| 6,410,351 | B1 | 6/2002 | Bode et al. |
| 6,650,423 | B1 | 11/2003 | Markle et al. |
| 6,684,382 | B2 | 1/2004 | Liu |
| 6,753,115 | B2 | 6/2004 | Zhang et al. |
| 6,804,572 | B1 | 10/2004 | Cooperberg et al. |
| 6,903,826 | B2 | 6/2005 | Usui et al. |
| 7,139,632 | B2 | 11/2006 | Cooperberg et al. |
| 7,402,257 | B1 | 7/2008 | Sonderman et al. |
| 7,504,182 | B2 | 3/2009 | Stewart et al. |
| 7,588,946 | B2 | 9/2009 | Tso et al. |
| 7,600,212 | B2 | 10/2009 | Zach et al. |
| 7,739,651 | B2 | 6/2010 | Melvin, III et al. |
| 7,812,966 | B2 | 10/2010 | Hoffmann et al. |
| 7,849,423 | B1 | 12/2010 | Yenikaya et al. |
| 7,962,867 | B2 | 6/2011 | White et al. |
| 8,001,512 | B1 | 8/2011 | White |
| 8,279,409 | B1 | 10/2012 | Sezginer et al. |
| 8,832,610 | B2 | 9/2014 | Ye et al. |
| 9,015,016 | B2 | 4/2015 | Lorenz et al. |
| 9,471,746 | B2 | 10/2016 | Rieger et al. |
| 9,547,740 | B2 | 1/2017 | Moroz et al. |
| 9,659,126 | B2 | 5/2017 | Greiner et al. |
| 9,792,393 | B2 | 10/2017 | Tetiker et al. |
| 9,996,647 | B2 | 6/2018 | Tetiker et al. |
| 10,032,681 | B2 | 7/2018 | Bailey, III et al. |
| 10,197,908 | B2 | 2/2019 | Sriraman et al. |
| 10,254,641 | B2 | 4/2019 | Mailfert et al. |
| 10,386,828 | B2 | 8/2019 | Tetiker et al. |
| 2003/0008507 | A1 | 1/2003 | Bell et al. |
| 2003/0113766 | A1 | 6/2003 | Pepper et al. |
| 2004/0019872 | A1 | 1/2004 | Lippincott et al. |
| 2005/0074907 | A1 | 4/2005 | Kriz et al. |
| 2006/0141484 | A1 | 6/2006 | Rucker et al. |
| 2007/0050749 | A1 | 3/2007 | Ye et al. |
| 2007/0249071 | A1 | 10/2007 | Lian et al. |
| 2007/0281478 | A1 | 12/2007 | Ikegami et al. |
| 2008/0035608 | A1 | 2/2008 | Thomas et al. |
| 2009/0048813 | A1 | 2/2009 | Ichikawa et al. |
| 2009/0087143 | A1 | 4/2009 | Jeon et al. |
| 2009/0253222 | A1 | 10/2009 | Morisawa et al. |
| 2011/0022215 | A1 | 1/2011 | Keil et al. |
| 2011/0292375 | A1 | 12/2011 | Marx et al. |
| 2012/0002912 | A1 | 1/2012 | Studenkov et al. |
| 2015/0079500 | A1 | 3/2015 | Shih et al. |
| 2015/0154145 | A1 | 6/2015 | Watanabe et al. |
| 2016/0313651 | A1 | 10/2016 | Middlebrooks et al. |
| 2017/0115556 | A1 | 4/2017 | Shim et al. |
| 2017/0147724 | A1 | 5/2017 | Regli et al. |
| 2017/0176983 | A1 | 6/2017 | Tetiker et al. |
| 2017/0228482 | A1 | 8/2017 | Tetiker et al. |
| 2017/0256463 | A1 | 9/2017 | Bailey, III et al. |
| 2017/0363950 | A1 | 12/2017 | Sriraman et al. |
| 2017/0371991 | A1 | 12/2017 | Tetiker et al. |
| 2018/0157161 | A1 | 6/2018 | Mailfert et al. |
| 2018/0182632 | A1 | 6/2018 | Ye et al. |
| 2018/0239851 | A1 | 8/2018 | Ypma et al. |
| 2018/0260509 | A1 | 9/2018 | Tetiker et al. |
| 2019/0049937 | A1 | 2/2019 | Tetiker et al. |
| 2019/0250501 | A1 | 8/2019 | Sriraman et al. |
| 2019/0311083 | A1 | 10/2019 | Feng et al. |

OTHER PUBLICATIONS

U.S. Final Office Action, dated Aug. 27, 2018, issued in U.S. Appl. No. 14/972,969.
U.S. Office Action, dated Jan. 10, 2019, issued in U.S. Appl. No. 14/972,969.
U.S. Notice of Allowance, dated Apr. 5, 2019, issued in U.S. Appl. No. 14/972,969.
U.S. Notice of Allowance, dated Feb. 6, 2018 issued in U.S. Appl. No. 15/698,458.
U.S. Office Action, dated Oct. 2, 2017, issued in U.S. Appl. No. 15/698,458.
Office Action dated Jun. 14, 2018 issued in U.S. Appl. No. 15/972,063.
Final Office Action dated Nov. 7, 2018 issued in U.S. Appl. No. 15/972,063.
Notice of Allowance dated Feb. 1, 2019 issued in U.S. Appl. No. 15/972,063.
U.S. Office Action, dated Aug. 10, 2017, issued in U.S. Appl. No. 15/059,073.
Notice of Allowance dated Jan. 11, 2018 issued in U.S. Appl. No. 15/059,073.
U.S. Office Action, dated Dec. 7, 2017, issued in U.S. Appl. No. 15/188,910.
U.S. Final Office Action, dated May 23, 2018 issued in U.S. Appl. No. 15/188,910.
U.S. Notice of Allowance, dated Sep. 27, 2018 issued in U.S. Appl. No. 15/188,910.
U.S. Office Action, dated Jul. 11, 2018, issued in U.S. Appl. No. 15/367,060.
U.S. Notice of Allowance, dated Nov. 26, 2018 issued in U.S. Appl. No. 15/367,060.
U.S. Office Action, dated Mar. 4, 2019 issued in U.S. Appl. No. 15/673,321.
International Search Report and Written Opinion dated Aug. 10, 2018 issued in Application No. PCT/US2018/029874.
Chinese First Office Action dated Feb. 25, 2019 issued in Application No. CN 201710121052.8.
"SEMulator3D." [*Product Brochure*] Coventor, A Lam Research Company, pp. 1-3. URL:https://www.coventor.com/semiconductor-solutions/semulator3d/, known as of Mar. 2, 2018.
U.S. Appl. No. 15/946,940, filed Apr. 6, 2018, Feng et al.
U.S. Appl. No. 16/224,651, filed Dec. 18, 2018, Sriraman et al.
U.S. Appl. No. 16/260,870, filed Feb. 14, 2019, Bowes et al.
Cooperberg, D.J., et al. "Semiempirical profile simulation of aluminum etching in a $Cl_2$ / $BCl_3$ plasma," Journal of Vacuum Science & Technology A., vol. 20, No. 5, Sep./Oct. 2002, pp. 1536-1556. [doi: http://dx.doi.org/10.1116/1.1494818].
Goodlin et al. (May 2002) "Quantitative Analysis and Comparison of Endpoint Detection Based on Multiple Wavelength Analysis," 201st Meeting of the Electrochemical Society, International Symposium on Plasma Processing XIV, Abs. 415, Philadelphia, PA, 30 pages.
Hoekstra, R. et al. "Comparison of two-dimensional and three-dimensional models for profile simulation of poly-Si etching of finite length trenches," Journal of Vacuum Science & Technology A, vol. 16, No. 6, Nov. 1, 1998, pp. 3274-3280. [doi:http://dx.doi.org/10.1116/1.581533].
Hoekstra, R. et al. "Integrated plasma equipment model for polysilicon etch profiles in an inductively coupled plasma reactor with subwafer and superwafer topography," Journal of Vacuum Science & Technology A, vol. 15, No. 4, Jul./Aug. 1997, pp. 1913-1921. [doi: http://dx.doi.org/10.1116/1.580659].
Hoekstra, R. et al. "Microtrenching resulting from specular reflection during chlorine etching of silicon," Journal of Vacuum Science & Technology B, Nanotechnology and Microelectronics, vol. 16, No. 4, Jul./Aug. 1998, pp. 2102-2104. [doi: http://dx.doi.org/10.1116/1.590135].

(56) References Cited

OTHER PUBLICATIONS

Huard, C.M., et al. "Role of neutral transport in aspect ratio dependent plasma etching of three-dimensional features," Journal of Vacuum Science & Technology A., vol. 35, No. 5, Jan. 17, 2017, pp. 05C301-1-05C301-18. [doi: http://dx.doi.org/10.1116/1.4973953].

Kushner, M.J., "Hybrid modelling of low temperature plasmas for fundamental investigations and equiptment design," Journal of Physics D., vol. 42, Sep. 18, 2009, pp. 1-20. [doi: 10.1088/0022-3727/42/19/194013].

Lynn et al. (2009) "Virtual Metrology for Plasma Etch using Tool Variables," IEEE, pp. 143-148.

Lynn, Shane (Apr. 2011) "Virtual Metrology for Plasma Etch Processes," A thesis submitted in partial fulfillment for the degree of Doctor of Philosophy in the Faculty of Science and Engineering, Electronic Engineering Department, National University of Ireland, Maynooth,361 pages.

Moharam et al. (Jul. 1981) "Rigorous coupled-wave analysis of planar-grating diffraction," J. Opt. Soc. Am., 71(7):811-818.

Radjenović et al.(2007) "3D Etching profile evolution simulations: Time dependence analysis of the profile charging during SiO2 etching in plasma," 5th EU-Japan Joint Symposium on Plasma Process, Journal of Physics: Conference Series 86:13 pages.

Ringwood et al. (Feb. 2010) "Estimation and Control in Semiconductor Etch: Practice and Possibilities," IEEE Transactions on Semiconductor Manufacturing, 23(1):87-98.

Sankaran, A. et al. (Jan. 15, 2005) "Etching of porous and solid $SiO_2$ in Ar/c-$C_4F_8$, $O_2$/c-$C_4F_8$ and Ar/$O_2$/c-$C_4F_8$ plasmas," Journal of Applied Physics, 97(2):023307-1-023307-10. [doi: http://dx.doi.org/10.1063/1.1834979] [retrieved on Jan. 29, 2005].

Sankaran, A. et al. (Jul./Aug. 2004) "Integrated feature scale modeling of plasma processing of porous and solid $SiO_2$. I. Fluorocarbon etching," Journal of Vacuum Science & Technology A., 22(4):1242-1259. [doi: http://dx.doi.org/10.1116/1.1764821].

Yue et al. (Jan./Feb. 2001) "Plasma etching endpoint detection using multiple wavelengths for small open-area wafers," J. Vac. Sci. Technol. A, 19(1):66-75.

Zeng (2012) "Statistical Methods for Enhanced Metrology in Semiconductor/Photovoltaic Manufacturing," A dissertation submitted in partial satisfaction of the requirements for the degree of Doctor of Philosophy in Engineering—Electrical Engineering and Computer Sciences in the Graduate Division of the University of California, Berkeley, 171 pages.

Zhang, D. et al. (Mar./Apr. 2001) "Investigations of surface reactions during $C_2F6$ plasma etching of $SiO_2$ with equipment and feature scale models," Journal of Vacuum Science & Technology A, 19(2):524-538. [doi: http://dx.doi.org/10.1116/1.1349728].

Zhang, Y., (Sep. 30, 2015) Doctoral Dissertation of "Low Temperature Plasma Etching Control through Ion Energy Angular Distribution and 3-Dimensional Profile Simulation," Dept. of Electrical Engineering at the University of Michigan, pp. 49-71, Appendix B. pp. 243-248. [doi: http://hdl.handle.net/2027.42/113432].

U.S. Appl. No. 14/972,969, filed Dec. 17, 2015, Tetiker et al.
U.S. Appl. No. 15/018,708, filed Feb. 8, 2016, Tetiker et al.
U.S. Appl. No. 15/059,073, filed Mar. 2, 2016, Bailey et al.
U.S. Appl. No. 15/188,910, filed Jun. 21, 2016, Sriraman et al.
U.S. Appl. No. 15/367,060, filed Dec. 1, 2016, Mailfert et al.
U.S. Office Action, dated Mar. 22, 2017, issued in U.S. Appl. No. 15/018,708.
U.S. Notice of Allowance dated Jun. 7, 2017 issued in U.S. Appl. No. 15/018,708.
U.S. Office Action, dated Jul. 10, 2019 issued in U.S. Appl. No. 16/224,651.
International Search Report and Written Opinion dated Jul. 31, 2019 issued in Application No. PCT/US2019/026851.
International Search Report and Written Opinion dated Jul. 5, 2019 issued in Application No. PCT/US2019/025668.
Office Action dated Jul. 10, 2019 issued in U.S. Appl. No. 15/946,940.
U.S. Notice of Allowance dated Oct. 16, 2019 issued in U.S. Appl. No. 15/946,940.

Edge Placement Error (EPE) Look-Up Table (LUT)

| Edge | Depth | $\Delta X_{EPE}$ | CPM Kernel Fluxes |
|---|---|---|---|
| $E_j$ | $Z_0$ $Z_1$ ⋮ $Z_i$ ⋮ $Z_N$ | $^{Fj}\Delta X^{ti}_{EPE,L} = {^{Fj}}X^{ti}_L - {^{Fj}}X^0_L$ $^{Fj}\Delta X^{ti}_{EPE,R} = {^{Fj}}X^{ti}_R - {^{Fj}}X^0_R$ ⋮ | $\Gamma^*_{Ion}(x)$ Visibility $\Gamma^*_{Neut}(x)$ Loading $\Gamma^*_{Dep}(x)$ |

Edge Placement Error (EPE) Look-Up Table (LUT)

| Edge | Loaded Fluxes | Layer Depth | Visibility | $\Delta x_{EPE}$ (From SKM) |
|---|---|---|---|---|
| $E_j$ | $\Gamma^*_{Ion}(x)$<br>$\Gamma^*_{Neut}(x)$<br>$\Gamma^*_{Dep}(x)$ | $z_0$<br>$z_1$<br>$\vdots$<br>$z_i$<br>$\vdots$<br>$z_N$ | $V_0$<br>$V_1$<br>$\vdots$<br>$V_i$<br>$\vdots$<br>$V_N$ | $^{F_i}\Delta x^i_{EPE,1} \approx {}^{F_i}x^i_1 - {}^{F_i}x^0_1$<br>$^{F_i}\Delta x^i_{EPE,2} \approx {}^{F_i}x^i_2 - {}^{F_i}x^0_2$<br>$\vdots$ |

*Fig. 13C*

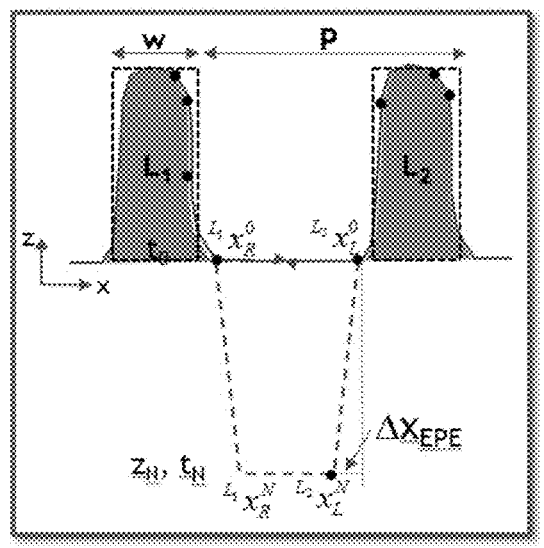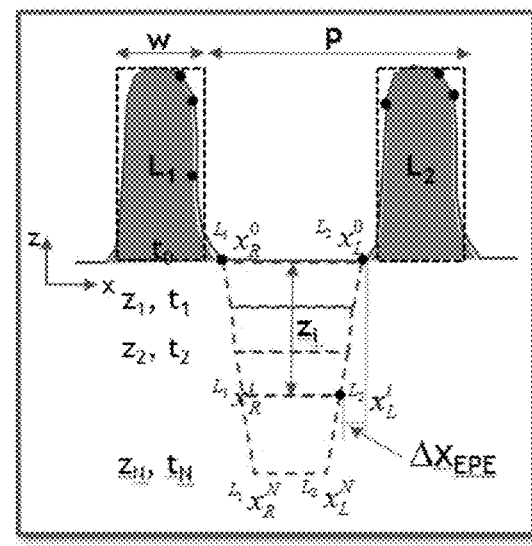
*Fig. 19A*  *Fig. 19B*

| Time Slice | Line | Pitch | Depth | EPE_0 | EPE_t | 7 | 8 | 9 | 10 | 11 | 12 | 13 | 14 | 15 | 16 | 17 | 18 |
|---|---|---|---|---|---|---|---|---|---|---|---|---|---|---|---|---|---|
| 1 | 302 | 164 | -1 | 0 | 0 | 0 | 36592000 | 97543000 | 0 | 57572000 | 94253000 | 0 | 56572000 | 76453000 | 0 | 57572000 | 94253000 |
| 1 | 302 | 145 | -1 | 0 | 0 | 0 | 36592000 | 97543000 | 0 | 55463000 | 94253000 | 0 | 54372000 | 86353000 | 0 | 43572000 | 94253000 |
| 1 | 302 | 198 | -1 | 0 | 0 | 0 | 36592000 | 97543000 | 0 | 54367000 | 95453000 | 0 | 57572000 | 75623000 | 0 | 58572000 | 94253000 |
| 1 | 302 | 165 | -1 | 0 | 0 | 0 | 36592000 | 97543000 | 0 | 53547000 | 96753000 | 0 | 52472000 | 94253000 | 0 | 55272000 | 94253000 |
| 1 | 304 | 176 | -1 | 0 | 0 | 0 | 36592000 | 97543000 | 0 | 52456000 | 94253000 | 0 | 54332000 | 93426000 | 0 | 57862000 | 94253000 |
| 1 | 298 | 154 | -1 | 0 | 0 | 0 | 36592000 | 97543000 | 0 | 58756000 | 94253000 | 0 | 56782000 | 82573000 | 0 | 53462000 | 94253000 |
| 1 | 246 | 164 | -1 | 0 | 0 | 0 | 36592000 | 97543000 | 0 | 53674000 | 96753000 | 0 | 56892000 | 73893000 | 0 | 43522000 | 94253000 |
| 1 | 245 | 203 | -1 | 0 | 0 | 0 | 36592000 | 97543000 | 0 | 52782000 | 96253000 | 0 | 53672000 | 84253000 | 0 | 43632000 | 94253000 |
| 1 | 232 | 164 | -1 | 0 | 0 | 0 | 36592000 | 97543000 | 0 | 54677000 | 94253000 | 0 | 57372000 | 78253000 | 0 | 46772000 | 94253000 |
| 1 | 196 | 241 | -1 | 0 | 0 | 0 | 36592000 | 97543000 | 0 | 53675000 | 94253000 | 0 | 57562000 | 75843000 | 0 | 53452000 | 94253000 |
| 1 | 145 | 212 | -1 | 0 | 0 | 0 | 36592000 | 97543000 | 0 | 50890000 | 94253000 | 0 | 58652000 | 78943000 | 0 | 53452000 | 94253000 |
| 1 | 111 | 147 | -1 | 0 | 0 | 0 | 36592000 | 97543000 | 0 | 53889000 | 94253000 | 0 | 52352000 | 95673000 | 0 | 55572000 | 94253000 |
| 1 | 112 | 209 | -1 | 0 | 0 | 0 | 36592000 | 97543000 | 0 | 54783000 | 96253000 | 0 | 51672000 | 84623000 | 0 | 56785000 | 94253000 |
| 1 | 113 | 265 | -1 | 0 | 0 | 0 | 36592000 | 97543000 | 0 | 53793000 | 94253000 | 0 | 54782000 | 84253000 | 0 | 44572000 | 94253000 |
| 1 | 113 | 123 | -1 | 0 | 0 | 0 | 36592000 | 97543000 | 0 | 53764000 | 94253000 | 0 | 50762000 | 73253000 | 0 | 43572000 | 94253000 |
| 1 | 114 | 114 | -1 | 0 | 0 | 0 | 36592000 | 97543000 | 0 | 55723000 | 96853000 | 0 | 56952000 | 82253000 | 0 | 54562000 | 94253000 |
| 1 | 114 | 297 | -1 | 0 | 0 | 0 | 36592000 | 97543000 | 0 | 52457000 | 94253000 | 0 | 53572000 | 82633000 | 0 | 43772000 | 94253000 |
| 1 | 114 | 124 | -1 | 0 | 0 | 0 | 36592000 | 97543000 | 0 | 52456000 | 94253000 | 0 | 57694000 | 74673000 | 0 | 56742000 | 94253000 |
| 1 | 114 | 164 | -1 | 0 | 0 | 0 | 36592000 | 97543000 | 0 | 58654000 | 96153000 | 0 | 53673000 | 94453000 | 0 | 48572000 | 94253000 |

Neutral, Radical, Ion fluxes at various points on the profile

*Fig. 24*

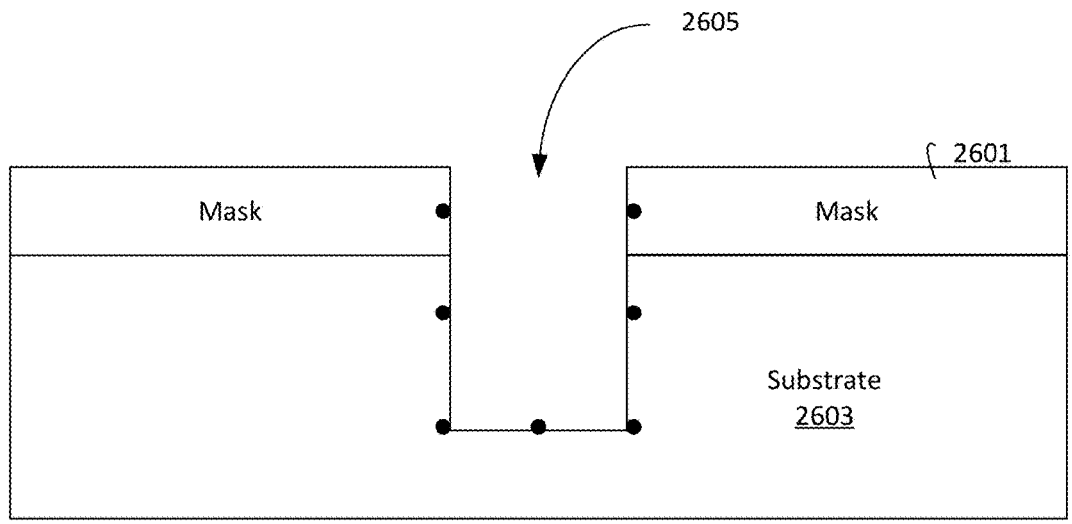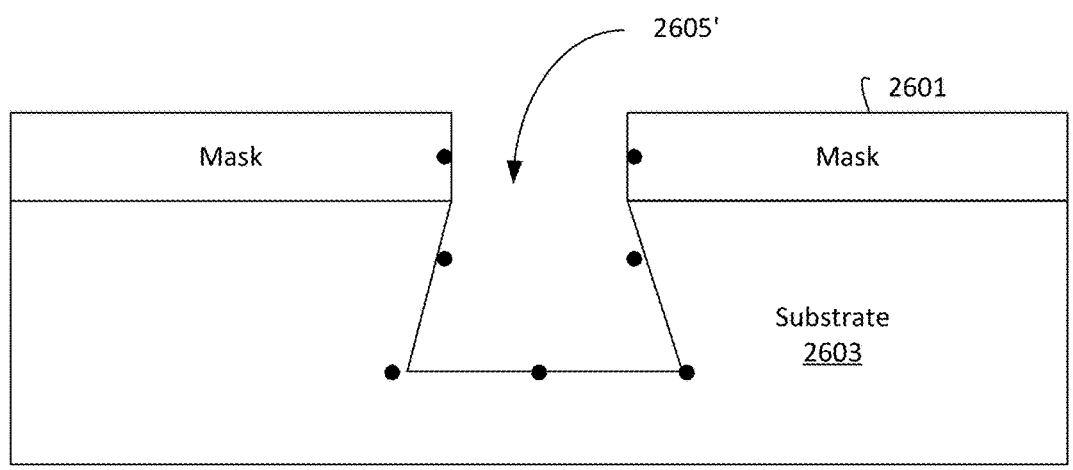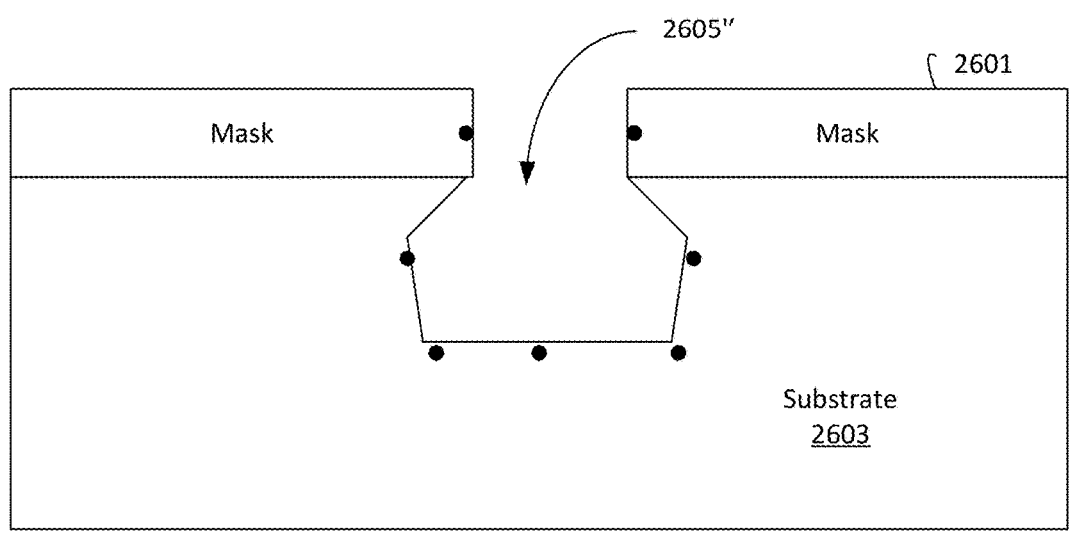
Figure 26

LAYOUT PATTERN PROXIMITY CORRECTION THROUGH EDGE PLACEMENT ERROR PREDICTION

BACKGROUND

The performance of plasma-assisted etch processes is frequently critical to the success of a semiconductor processing workflow. However, optimizing the etch processes can be difficult and time-consuming, oftentimes involving process engineers manually tweaking etch process parameters in an ad hoc fashion in attempt to generate the desired target feature profile. There is currently simply no automated procedure of sufficient accuracy which may be relied upon by process engineers to determine the values of process parameters which will result in a given desired etch profile.

Some models attempt to simulate the physical chemical processes occurring on semiconductor substrate surfaces during etch processes. Examples include the etch profile models of M. Kushner and co-workers as well as the etch profile models of Cooperberg and co-workers. The former are described in Y. Zhang, "Low Temperature Plasma Etching Control through Ion Energy Angular Distribution and 3-Dimensional Profile Simulation," Chapter 3, dissertation, University of Michigan (2015), and the latter in Cooperberg, Vahedi, and Gottscho, "Semiempirical profile simulation of aluminum etching in a $Cl_2/BCl_3$ plasma," J. Vac. Sci. Technol. A 20(5), 1536 (2002), each of which is hereby incorporated by reference in its entirety for all purposes. Additional description of the etch profile models of M. Kushner and co-workers may be found in J. Vac. Sci. Technol. A 15(4), 1913 (1997), J. Vac. Sci. Technol. B 16(4), 2102 (1998), J. Vac. Sci. Technol. A 16(6), 3274 (1998), J. Vac. Sci. Technol. A 19(2), 524 (2001), J. Vac. Sci. Technol. A 22(4), 1242 (2004), J. Appl. Phys. 97, 023307 (2005), each of which is also hereby incorporated by reference in its entirety for all purposes. Despite the extensive work done to develop these models, they do not yet possess the desired degree of accuracy and reliability to find substantial use within the semiconductor processing industry.

SUMMARY

Disclosed are methods of generating a proximity-corrected design layout for photoresist to be used in an etch operation. The methods may include receiving an initial design layout and identifying a feature in the initial design layout, the feature's pattern corresponding to a feature that would be etched into a material stack on a semiconductor substrate's surface via a plasma-based etch process, performed in a processing chamber under a set of process conditions, when the stack is overlaid with a layer of photoresist pattern corresponding to the design layout. The methods may further include estimating one or more quantities characteristic of an in-feature plasma flux (IFPF) within the feature at a time t during such a plasma-based etch process, and estimating a quantity characteristic of edge placement error (EPE) of the edge of the feature at time t by comparing the one or more estimated quantities characteristic of the IFPF to those in a look-up table (LUT) which associates values of the quantity characteristic of EPE at time t with values of the one or more quantities characteristics of the IFPF. Thereafter, the initial design layout may be modified based on the quantity characteristic of EPE.

In some embodiments, the LUT may be constructed by running a computerized etch profile model (EPM) under the set of process conditions at least to time t on a calibration pattern of photoresist overlaid on the material stack. In some embodiments, various of the foregoing operations may be repeated for one or more additional features whose patterns are in the initial design layout, and the initial design may be modified further based on the estimated quantity characteristic of EPE corresponding to these one or more additional features.

In some embodiments, the one or more quantities characteristic of the IFPF may include a quantity characteristic of in-feature plasma ion flux (IFPIF), and/or a quantity characteristic of in-feature plasma neutral flux (IFPNF). In some embodiments, the LUT comprises a list of entries, at least some of these entries comprising fields for the quantity characteristic of IFPIF, the quantity characteristic of IFPNF, and the corresponding quantity characteristic of EPE. In some embodiments, at least some of the entries in the LUT further comprise one or more fields for etch time and/or feature depth. In some embodiments, at least some of the entries in the LUT further comprises a field for in-feature passivant deposition flux (IFPDF). In some embodiments, at least some of the entries in the LUT further comprise a field for edge shape indicator which corresponds to an edge shape present in the calibration pattern. In various embodiments, one or more of the parameters IFPIF, IFPNF, IFPDF, etch time, etch depth, and edge shape serve as independent variables, and EPE serves as a dependent variable or result. In such embodiments, many different forms of relationship between independent variables and the EPE may be employed. These include regression models, neural networks, classification trees (e.g., random forests models), and the like. The concept of a LUT may be viewed as including any of these. Certain aspects of the disclosure pertain to methods of determining a layout of a lithography mask for an integrated circuit fabrication etch process. Such methods may be characterized by the following operations: (a) receiving a starting lithography mask layout for a feature to be etched in a partially fabricated integrated circuit; (b) obtaining an in-feature plasma flux condition for at least one location within the feature to be etched or within an opening in the mask over the feature; (c) identifying an in-feature edge placement error for the feature by applying the plasma flux condition to a lookup table or a model that provides predictions of in-feature edge placement error caused by the integrated circuit fabrication etch process within the feature; and (d) modifying a position of the starting lithography mask layout for the feature to compensate for the in-feature edge placement error identified in (c) by applying the plasma flux condition to the look up table or the model.

In various embodiments, the in-feature plasma flux condition is predicted to be produced during the integrated circuit fabrication etch process. In certain embodiments, applying the plasma flux condition to the lookup table or the model identifies one or more putative values of in-feature edge placement error that correspond to the in-feature plasma flux condition.

In some implementations, the starting lithography mask layout was produced by an optical proximity correction process. In some implementations, modifying the position of the starting lithography mask layout includes providing the in-feature edge placement error identified in (c) to an optical proximity correction process.

In certain embodiments, the methods additionally include calculating the in-feature plasma flux condition using process conditions expected to be produced in a plasma reactor where the integrated circuit fabrication etch process is to be performed. Calculating the in-feature plasma flux condition may involve applying the process conditions to a compact physical model. In some implementations, the compact physical model is configured to account for loading caused by features on the integrated circuit and/or visibility to plasma within the feature.

In certain embodiments, obtaining the in-feature plasma flux condition obtains in-feature plasma flux conditions for a plurality of locations within the feature or within the opening in the mask. In such cases, a method may apply the in-feature plasma flux conditions for the plurality of locations to the lookup table or the model. As an example, the lookup table or the model may be configured to identify the one or more putative values of in-feature edge placement error that correspond to the in-feature plasma flux conditions for the plurality of locations.

In certain embodiments, applying the in-feature plasma flux condition to the lookup table or the model identifies a plurality of putative values of edge placement error. In such embodiments, a method may additionally interpolate between the plurality of putative values of edge placement error to provide the in-feature edge placement error identified by applying the in-feature plasma flux condition to the lookup table or the model in (d).

In certain embodiments, the methods include additional operations, performed after (c) and before (d), of determining a profile of the feature to be etched from the in-feature edge placement error identified in (c). Such methods may additionally: use the profile to obtain an updated in-feature plasma flux condition; and apply the updated in-feature plasma flux condition to the lookup table or the model to obtain an updated in-feature edge placement error. In some cases, modifying the position of the starting mask layout in (d) involves compensating for the updated edge placement error.

In certain embodiments, the methods determine a layout in two or more time steps, each representing a portion of the integrated circuit fabrication etch process. In such embodiments, (a)-(c) are performed for an initial time step of the integrated circuit fabrication etch process. The methods then determine a profile of the feature to be etched at the end of the initial time step of the integrated circuit fabrication etch process, and apply the profile of the feature to repeat operations (a)-(c) for a subsequent time step of the integrated circuit fabrication etch process. The operation of modifying the position of the starting mask layout in (d) may include compensating for the in-feature edge placement error identified for the subsequent time step of the integrated circuit fabrication etch process.

Another aspect of the disclosure pertains to computer systems for determining a layout of a lithography mask for an integrated circuit fabrication etch process. Such systems may be characterized by: one or more processors, and a memory, the memory storing computer-readable instructions for execution on the one or more processors. The instructions are for: (a) receiving a starting lithography mask layout for a feature to be etched in a partially fabricated integrated circuit; (b) obtaining an in-feature plasma flux condition for at least one location within the feature to be etched or within an opening in the mask over the feature; (c) identifying an in-feature edge placement error for the feature by applying the plasma flux condition to a lookup table or a model that provides predictions of in-feature edge placement error caused by the integrated circuit fabrication etch process within the feature; and (d) modifying a position of the starting lithography mask layout for the feature to compensate for the in-feature edge placement error identified in (c) by applying the plasma flux condition to the look up table or the model.

In certain embodiments, the in-feature plasma flux condition is predicted to be produced during the integrated circuit fabrication etch process. In certain embodiments, the instructions for applying the plasma flux condition to the lookup table or the model include instructions for identifying one or more putative values of in-feature edge placement error that correspond to the in-feature plasma flux condition.

In certain embodiments, the instructions for receiving the starting lithography design layout in (a) include instructions for receiving the starting lithography design layout from a computer-readable medium, where the computer-readable instructions stored in the memory for execution on the processor further include instructions for (e) writing the modified lithography mask layout from (d) to the computer-readable medium. In certain embodiments, the instructions for receiving the starting lithography mask layout include instructions for receiving the starting lithography mask layout produced by an optical proximity correction process. In certain embodiments, the instructions for modifying the position of the starting lithography mask layout include instructions for providing the in-feature edge placement error identified in (c) to an optical proximity correction process.

In certain embodiments, the system includes additional instructions for calculating the in-feature plasma flux condition using process conditions expected to be produced in a plasma reactor where the integrated circuit fabrication etch process is to be performed.

In certain embodiments, the instructions for calculating the in-feature plasma flux condition include instructions for applying the process conditions to a compact physical model. In such embodiments, the compact physical model may be configured to account for loading caused by features on the integrated circuit and/or visibility to plasma within the feature.

In certain embodiments, the instructions for obtaining the in-feature plasma flux condition include instructions for obtaining in-feature plasma flux conditions for a plurality of locations within the feature or within the opening in the mask, and the system also includes instructions for applying the in-feature plasma flux conditions for the plurality of locations to the lookup table or the model. In such embodiments, the lookup table or the model may be configured to identify the one or more putative values of in-feature edge placement error that correspond to the in-feature plasma flux conditions for the plurality of locations.

In certain embodiments, the instructions for applying the in-feature plasma flux condition to the lookup table or the model include instructions for identifying a plurality of putative values of edge placement error. In certain embodiments, the system also includes instructions for interpolating between the plurality of putative values of edge placement error to provide the in-feature edge placement error identified by the instructions for applying the in-feature plasma flux condition to the lookup table or the model in (d).

In certain embodiments, the system includes the following instructions for execution after the instructions for (c) and before the instructions for (d): (i) determining a profile of the feature to be etched from the in-feature edge placement error identified in (c); (ii) using the profile to obtain an updated in-feature plasma flux condition; and (iii) applying the updated in-feature plasma flux condition to the lookup table or the model to obtain an updated in-feature edge placement error. In such embodiments, the instructions for modifying the position of the starting mask layout in (d) may include instructions for compensating for the updated edge placement error.

In certain embodiments, instructions (a)-(c) are performed for an initial time step of the integrated circuit fabrication etch process. In such embodiments, the computer system may additionally include instructions for (i) determining a profile of the feature to be etched at the end of the initial time step of the integrated circuit fabrication etch process, and (ii) applying the profile of the feature to repeat execution of instructions (a)-(c) for a subsequent time step of the integrated circuit fabrication etch process. In some such embodiments, the instructions for modifying the position of the starting mask layout in (d) includes instructions for compensating for the in-feature edge placement error identified for the subsequent time step of the integrated circuit fabrication etch process.

Another aspect of this disclosure pertains to systems for etching semiconductor substrates. Such systems may be characterized by (a) the computer system described just above; (b) a photolithography module configured to: (i) receive the modified lithography mask layout from the computer system; (ii) form a mask from the modified lithography mask layout; and (iii) perform a photolithography operation using the mask to transfer a layer of photoresist to a semiconductor substrate; and (c) a plasma-etcher configured to generate a plasma which contacts the semiconductor substrate and etches those portions of the substrate surface not covered with photoresist transferred by the photolithography module.

Also disclosed herein are methods of generating a mask design. These methods may include generating a proximity-corrected design layout for photoresist using the techniques just described, and thereafter generating a mask design based on the generated proximity-corrected photoresist design layout. Also disclosed herein are methods of etching a semiconductor substrate. These methods may include generating a mask design as just described and forming a mask based on the mask design. Thereafter, a photolithography operation may be performed using the mask to transfer a layer of photoresist to the substrate substantially conforming to the proximity-corrected photoresist design layout, after which the substrate may be exposed to a plasma which finally etches the substrate.

Also disclosed are computer systems for generating a proximity-corrected design layout for photoresist to be used in an etch operation. The systems may include a processor and a memory. The memory may store a look-up table (LUT) and computer-readable instructions for execution on the processor. The instructions stored in the memory may include instructions for receiving an initial design layout, and instructions for identifying a feature in the initial design layout, the feature's pattern corresponding to a feature that would be etched into a material stack on a semiconductor substrate's surface via a plasma-based etch process, performed in a processing chamber under a set of process conditions, when the stack is overlaid with a layer of photoresist pattern corresponding to the design layout. The instructions stored in the memory may further include instructions for estimating one or more quantities characteristic of an in-feature plasma flux (IFPF) within the feature at a time t during such a plasma-based etch process, instructions for estimating a quantity characteristic of edge placement error (EPE) of the edge of the feature at time t by comparing the one or more quantities characteristic of the IFPF estimated in (c) to those in the LUT which associates values of the quantity characteristic of EPE at time t with values of the one or more quantities characteristics of the IFPF, and instructions for modifying the initial design layout based on at the quantity characteristic of EPE.

In some embodiments, the initial design layout may be read from a computer-readable medium, and in certain such embodiments, the computer-readable instructions stored in the memory for execution on the processor further include instructions for writing the proximity-corrected design layout to a computer-readable medium.

Also disclosed herein are one or more computer-readable media having a look-up table (LUT) and computer-readable and executable instructions as just described stored thereon.

Also disclosed are systems for generating photolithography masks. Such systems may include a computer system for generating a proximity-corrected design layout for photoresist as just described, and a photolithography module. The photolithography module may be configured to receive a proximity-corrected design layout for photoresist from the computer system, and form a mask from the proximity-corrected design layout. Also disclosed are systems for etching semiconductor substrates using such masks to perform photolithography operations by transferring the proximity-corrected design layout to a layer of photoresist on a semiconductor substrate. Such systems may further include a plasma-etcher configured to generate a plasma which may be used to contact the semiconductor substrate and etch those portions of the substrate surface not covered with photoresist patterned using the mask.

These and other features of the disclosure will be described below with reference to the associated drawings.

BRIEF DESCRIPTION OF THE DRAWINGS

FIG. 12 also shows a similar timeline when instead using a physics-based etch profile model approach as disclosed herein.

FIG. 13C provides an illustration of another reduced-order model (ROM) look-up table (LUT) as described herein.

FIGS. 19A and 19B show a cross-sectional view of a feature and illustrate a single-time-step approach to edge-placement error (EPE) estimation versus a multi-time step approach.

FIGS. 21-29 show details of EPE search and estimation examples.

DETAILED DESCRIPTION

Terminology

The following terms are used in the instant specification.

Independent variable—as commonly understood, an independent variable is any variable that causes a response. An independent variable may also be known as a "predictor variable," "regressor," "controlled variable," "manipulated variable," "explanatory variable," or "input variable." An etch profile model may include various types of independent variables such as reactor process conditions (e.g., temperature, pressure, gas composition, flow rates, plasma power, and the like), local plasma conditions, and local reaction conditions. A LUT or other relationship described herein may employ IFPF parameters, etch times, feature edge shapes, and the like as independent variables.

Result variable—as commonly understood, a result variable is a variable that results from the independent variables. Often a result model is output by a model. In some contexts, a result variable is synonymous with the term dependent variable. In this disclosure an etch profile is a type of result variable. An edge placement error is another type of result variable.

Input variable—an input variable is similar to an independent variable, but may be more specific in that some independent variables may be fixed for many runs and therefore not technically "input" variables for such runs. In input variable is provided as an input for a run under consideration.

Mechanistic parameter—a mechanistic parameter is a type of independent variable that represents a physical and/or chemical condition at one or more particular locations in a reactor or substrate undergoing etching.

Plasma parameter—a plasma parameter is a type of mechanistic parameter describing local plasma conditions (e.g., plasma density and plasma temperature at particular locations on the substrate).

Reaction parameter—a reaction parameter is a type of mechanistic parameter describing a local chemical or physico-chemical condition.

Process parameter—a process parameter is a reactor parameter over which the process engineer has control (e.g., chamber pressure, RF power, bias voltage, gas flow rates, and pedestal temperature). Process parameters along with substrate characteristics may control values of the mechanistic parameters in an etch reactor.

Model parameter—a model parameter is a type of independent variable that is optimized. It is typically a mechanistic parameter such as a chemical reaction parameter. Initial values of model parameters are typically unoptimized; they may be estimates chosen based on expert knowledge or selected from literature data.

Introduction—Etch Profile Models

Disclosed herein are procedures for using etch profile models (EPMs) referred to above (and other similar models) to generate accurate representations of semiconductor feature etch profiles, which are good enough approximations to be relied upon in the semiconductor processing industry.

Figure 2:
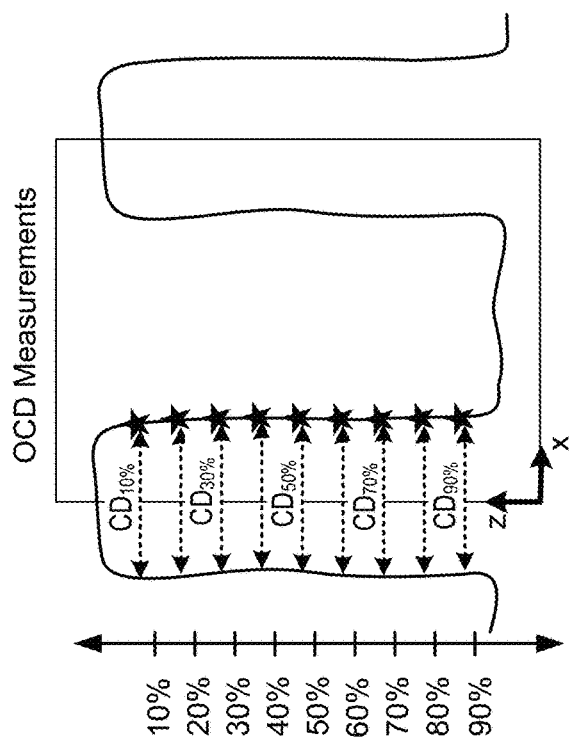
FIG. 2 represents an example of an etch profile, similar to that shown in FIG. 1, but in this figure, computed from experimental measurements made with one or more optical metrology tools.
Figure 1:
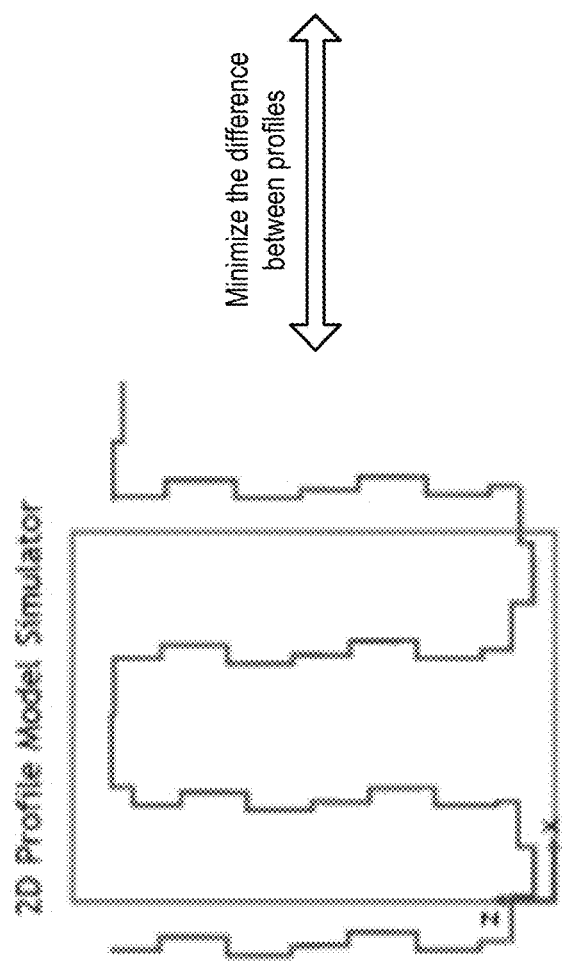
FIG. 1 represents an example of an etch profile as generated computationally from a surface kinetic model of an etch process.

Generally, EPMs and similar models attempt to simulate the etch profile evolution of a substrate feature over time—i.e., the time-dependent changes in the shape of a feature at various spatial locations on the feature's surface—by calculating reaction rates associated with the etch process at each of these spatial locations which result from an incident flux of etchant and deposition species characteristic of the plasma conditions set up in the reaction chamber, and do so over the course of the simulated etch process. The output is a simulated etch profile represented by a discrete set of data points—i.e., profile coordinates—which spatially maps out the shape of the profile. An example of such a simulated etch profile is shown in FIG. 1; the simulated profile may correspond to an actual measured etch profile as shown in FIG. 2. The simulated etch profile's evolution over time depends on the theoretically-modelled, spatially-resolved local etch reaction rates which, of course, depend on the underlying chemistry and physics of the etch process. As such, the etch profile simulation depends on various physical and chemical parameters associated with the chemical reaction mechanisms underlying the etch processes, and also any physical and chemical parameters which may characterize the chamber environment-temperature, pressure, plasma power, reactant flow rate, etc.—which are, generally speaking, under the control of the process engineer.

With respect to the former, the etch profile model thus requires a set of "fundamental" chemical and physical input parameters—examples such as reaction probabilities, sticking coefficients, ion and neutral fluxes, etc.—which are generally not independently controllable and/or even directly knowable by the process engineer, but that nevertheless must be specified as inputs to the simulation. These sets of "fundamental" or "mechanistic" input parameters are thus assumed to have certain values, generally taken from the literature, and their use implicitly invokes certain simplifications of (and approximations to) the underlying physical and chemical mechanisms behind the etch process being modeled.

This disclosure presents procedures that combine experimental techniques and data mining/analysis methodologies to improve the practical industrial applicability of these EPMs of substrate etch processes. Note that the phrase "substrate etch process" includes processes which etch a mask layer or, more generally, processes which etch any layer of material having been deposited on and/or residing on a substrate surface. The techniques focus on the "fundamental" chemical and physical input parameters which are employed by these models and improve the models by using procedures to determine what may be viewed as more effective sets of values for these parameters—effective in the sense that they improve the accuracy of the etch model—even if the optimum values determined for these "fundamental" parameters differ than what the literature (or other experiments) might determine as the "true" physical/chemical values for these parameters.

Figure 3:
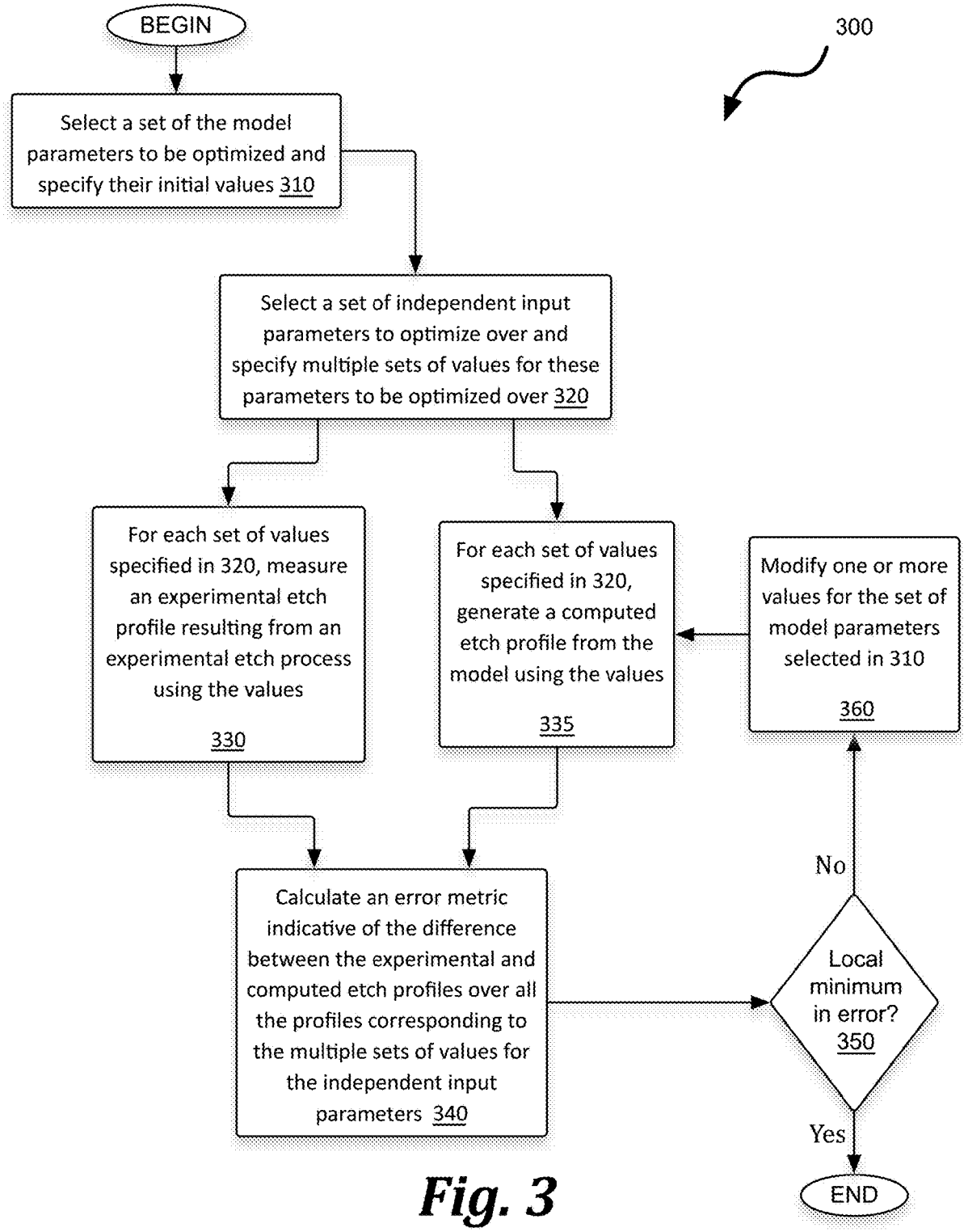
FIG. 3 is a process flow chart representing procedures for optimizing etch profile models with respect to a etch profile coordinate space.

FIGS. 3 and 4, which are discussed more fully below, present flow charts illustrating example processes for generating improved etch profile models. In FIG. 3, for example, the depicted process flow has two input branches, one from experimental measurements and the other from a current version of the model, which version is not yet optimized. Both the experimental branch and the predictive model branch produce etch profile results. These results are compared and the comparison is used to improve the model so that the deviation between the results decreases.

Characterizing etch profile data in detail, in 2 or 3 dimensions as output by an EPM, presents particular challenges for optimizing the model. In various embodiments disclosed herein, the profile data is represented as a series of elevation slices, each having a thickness. In other embodiments, the profile is represented as a series of vectors from a common origin or as a series of geometric forms such as trapezoids. When using many of these elevation slices or other components of the profile, the optimization problem of minimizing the error between experimental and EPM profile, can be computationally demanding. To reduce the required computation, a dimension reduction technique such as principal component analysis (PCA) is used to identify correlated contributions from the various profile components to the overall physical profile used in the optimization. Presenting the etch profiles in a few principal components or other vectors in a reduced dimensional space can greatly simplify the process of improving the predictive capabilities of the etch profile models. Additionally, such principle components are orthogonal to one another which assures that independent profile contributions can be optimized in isolation.

Etch Profiles

Before delving into the details of the etch profile models and the procedures for their improvement, it is useful to describe the concept of a feature's etch profile. Generally, an etch profile (EP) refers to any set of values for a set of one or more geometric coordinates which may be used to characterize the shape of an etched feature on a semiconductor substrate. In a simple case, an etch profile can be approximated as the width of a feature determined halfway to the base of the feature (the midpoint between the feature's base (or bottom) and it's top opening on the surface of the substrate) as viewed through a 2-dimensional vertical cross-sectional slice through the feature. In a more complicated example, an etch profile may be series of feature widths determined at various elevations above the base of the feature as viewed through the same 2-dimensional vertical cross-sectional slice. FIG. 2 provides an illustration of this. Note that, depending on the embodiment, the width may be the distance between one sidewall of the recess feature and the other—i.e. the width of the region which has been etched away—or the width may refer to the width of a column which has been etched on either side. The latter is schematically illustrated in FIG. 2. Note that in some cases, such a width is referred to as a "critical dimension" (labeled "CD" in FIG. 2) and that the elevation from the base of the feature may be referred to as the height or the z-coordinate (labeled as percentages in FIG. 2) of the so-referred-to critical dimension. As mentioned, the etch profile may be represented in other geometric references such as by a group of vectors from a common origin or a stack of shapes such as trapezoids or triangles or a group of characteristic shape parameters that define a typical etch profile such as bow, straight or tapered sidewall, rounded bottom, facet etc.

In this way, a series of geometric coordinates (e.g., feature widths at different elevations) maps out a discretized portrayal of a feature's profile. Note, that there are many ways to express a series of coordinates which represent feature width at different elevations. For instance, each coordinate might have a value which represents a fractional deviation from some baseline feature width (such as an average feature width, or a vertically averaged feature width), or each coordinate might represent the change from the vertically adjacent coordinate, etc. In any event, what is being referred to as "width" and, generally, the scheme being used for the set of profile coordinates used to represent an etch profile will be clear from the context and usage. The idea is that a set of coordinates are used to represent the shape of the feature's etched profile. It is also noted that a series of geometric coordinates could also be used to describe the full 3-dimensional shape of a feature's etched profile or other geometric characteristic, such as the shape of an etched cylinder or trench on a substrate surface. Thus, in some embodiments, a etch profile model may provide a full 3-D etch shape of the feature being modeled.

Etch Profile Models

The etch profile models (EPMs) compute a theoretically determined etch profile from a set of input etch reaction parameters (independent variables) characterizing the underlying physical and chemical etch processes and reaction mechanisms. These processes are modelled as a function of time and location in a grid representing features being etched and their surroundings. Examples of input parameters include plasma parameters such as fluxes of gas phase species—ions, neutrals, radicals, photons, etc.—and surface chemical reaction parameters such as the reaction probability, threshold energy, sputter yield corresponding to a particular chemical reaction. These parameters (and particularly, in some embodiments, the plasma parameters) may be obtained from various sources, including other models which calculate them from general reactor configurations and process conditions such as pressure, substrate temperature, plasma source parameters (e.g., power, frequencies, duty cycles provided to the plasma source), reactants, and their flow rates. In some embodiments, such models may be part of the EPM.

As explained, EPMs take reaction parameters as independent variables and functionally generate etch profiles as response variables. In other words, a set of independent variables are the physical/chemical process parameters used as inputs to the model, and response variables are the etch profile features calculated by the model. The EPMs employ one or more relationships between the reaction parameters and the etch profile. The relationships may include, e.g., coefficients, weightings, and/or other model parameters (as well as linear functions of, second and higher order polynomial functions of, etc. the reaction parameters and/or other model parameters) that are applied to the independent variables in a defined manner to generate the response variables, which are related to the etch profiles. Such weightings, coefficients, etc. may represent one or more of the reaction parameters described above. These model parameters are tuned or adjusted during the optimization techniques described herein. In some embodiments, some of the reaction parameters are model parameters to be optimized, while others are used as independent input variables. For example, chemical reaction parameters may be optimizable model parameters, while plasma parameters may be independent variables.

In general, a "response variable" represents an output and/or effect, and/or is tested to see if it is the effect. An "independent variable" represents an inputs and/or causes, and/or is tested to see if it is the cause. Thus, a response variable may be studied to see if and how much it varies as the independent variables vary.

As explained, some EPMs employ input variables (a type of independent variables) that may be characterized as fundamental reaction mechanistic parameters and may be viewed as fundamental to the underlying chemistry and physics and therefore the experimental process engineer generally does not have control over these quantities. In the etch profile model, these variables are applied at each location of a grid and at multiple times, separated by defined time steps. In some implementations, the grid resolution may vary between about a few Angstroms and about a micrometer. In some implementations, the time steps may vary between about 1e-15 and 1e-10 seconds. In certain embodiments, the optimization employs two types of mechanistic independent variables: (1) local plasma parameters, and, and (2) local chemical reaction parameters. These parameters are "local" in the sense that they may vary a function of position, in some cases down to the resolution of the grid. Examples of the plasma parameters include local plasma properties such as fluxes and energies of particles such ions, radicals, photons, electrons, excited species, depositor species and their energy and angular distributions etc. Examples of chemical and physico-chemical reaction parameters include rate constants (e.g., probabilities that a particular chemical reaction will occur at a particular time), sticking coefficients, energy threshold for etch, reference energy, exponent of energy to define sputter yields, angular yield functions and its parameters, etc. Further, the parameterized chemical reactions include reactions in which the reactants include the material being etched and an etchant. It should be understood that the chemical reaction parameters may include various types of reactions in addition to the reactions that directly etch the substrate. Examples of such reactions include side reactions, including parasitic reactions, deposition reactions, reactions of by-products, etc. Any of these might affect the overall etch rate. It should also be understood that the model may require other input parameters, in addition to the above-mentioned plasma and chemical reaction input parameters. Examples of such other parameters include the temperature at the reaction sites, the partial pressure or reactants, etc. In some cases, these and/or other non-mechanistic parameters may be input in a module that outputs some of the mechanistic parameters.

In some embodiments, initial (unoptimized) values for the EPM model variables, as well as independent variables that are fixed during optimization (e.g., the plasma parameters in some embodiments) may be obtained from various sources such as the literature, calculations by other computational modules or models, etc. In some embodiments, the independent input variables—such as the plasma parameters—may be determined by using a model such as, for the case of the plasma parameters, from an etch chamber plasma model. Such models may calculate the applicable input EPM parameters from various process parameters over which the process engineer does have control (e.g., by turning a knob)—e.g., chamber environment parameters such as pressure, flow rate, plasma power, wafer temperature, ICP coil currents, bias voltages/power, pulsing frequency, pulse duty cycle, and the like.

When running an EPM, some of the independent variables are set to known or expected parameter values used to perform the experiments. For example, the plasma parameters may be fixed to known or expected values at locations in modeled domain. Other independent variables—described herein as parameters of the model or the model parameters—are those which are selected to be tuned by the optimization procedure described below. For example, the chemical reaction parameters may be the tuned model parameters. Thus, in a series of runs corresponding to a given measured experimental etch profile, the model parameters are varied in order to elucidate how to choose values of these parameters to best optimize the model.

EPMs may take any of many different forms. Ultimately, they provide a relationship between the independent and response variables. The relationship may be linear or non-linear. Generally, an EPM is what is referred to in the art as a Monte Carlo surface kinetic model. These models, in their various forms, operate to simulate a wafer feature's topographical evolution over time in the context of semiconductor wafer fabrication. The models may utilize a cell-based representation of the topological evolution, but may also use a level-set type model, or a combination of the foregoing. Moreover, lumped kinetic models may also be employed such as lumped Langmuir-Hinshelwood kinetic models or other types of semi-analytical hybrid models. The models launch pseudo-particles with energy and angular distributions produced by a plasma model or experimental diagnostics for arbitrary radial locations on the wafer. The pseudo-particles are statistically weighted to represent the fluxes of radicals and ions to the surface. The models address various surface reaction mechanisms resulting in etching, sputtering, mixing, and deposition on the surface to predict profile evolution. During a Monte Carlo integration, the trajectories of various ion and neutral pseudo-particles are tracked within a wafer feature until they either react or leave the computational domain. The EPM has advanced capabilities for predicting etching, stripping, atomic layer etching, ionized metal physical vapor deposition, and plasma enhanced chemical vapor deposition on various materials. In some embodiments, an EPM utilizes a rectilinear mesh in two or three dimensions, the mesh having a fine enough resolution to adequately address/model the dimensions of the wafer feature (although, in principle, the mesh (whether 2D or 3D) could utilize non-rectilinear coordinates as well). The mesh may be viewed as an array of grid-points in two or three dimensions. It may also be viewed as an array of cells which represent the local area in 2D, or volume in 3D, associated with (centered at) each grid-point. Each cell within the mesh may represent a different solid material or a mixture of materials. Whether a 2D or 3D mesh is chosen as a basis for the modeling may depend on the class/type of wafer feature being modelled. For instance, a 2D mesh may be used to model a long trench feature (e.g., in a polysilicon substrate), the 2D mesh delineating the trench's cross-sectional shape under the assumption that the geometry of the ends of the trench are not too relevant to the reactive processes taking place down the majority of the trench's length away from its ends (i.e., for purposes of this cross-sectional 2D model, the trench is assumed infinite, again a reasonable assumption for a trench feature away from its ends). On the other hand, it may be appropriate to model a circular via feature (a through-silicon via (TSV)) using a 3D mesh (since the x,y horizontal dimensions of the feature are on par with each other).

Mesh spacing may range from sub-nanometer (e.g., from 1 Angstrom) up to several micrometers (e.g., 10 micrometers). Generally, each mesh cell is assigned a material identity, for example, photoresists, polysilicon, plasma (e.g., in the spatial region not occupied by the feature), which may change during the profile evolution. Solid phase species are represented by the identity of the computational cell; gas phase species are represented by computational pseudo-particles. In this manner, the mesh provides a reasonably detailed representation (e.g., for computational purposes) of the wafer feature and surrounding gas environment (e.g., plasma) as the geometry/topology of the wafer feature evolves over time in a reactive etch process.

Etch Experiments and Profile Measurements

To train and optimize the EPMs presented in the previous section, various experiments may be performed in order to determine—as accurately as the experiments allow—the actual etch profiles which result from actual etch processes performed under the various process conditions as specified by various sets of etch process parameters. Thus, for instance, one specifies a first set of values for a set of etch process parameters—such as etchant flow rate, plasma power, temperature, pressure, etc.—sets up the etch chamber apparatus accordingly, flows etchant into the chamber, strikes the plasma, etc., and proceeds with the etching of the first semiconductor substrate to generate a first etch profile. One then specifies a second set of values for the same set of etch process parameters, etches a second substrate to generate a second etch profile, and so forth.

Various combinations of process parameters may be used to present a broad or focused process space, as appropriate, to train the EPM. The same combinations of process parameters are then used to calculate (independent) input parameters, such as the mechanistic parameters, to the EPM to provide etch profile outputs (response variables) that can be compared against the experimental results. Because experimentation can be costly and time consuming, techniques can be employed to design experiments in a way that reduces the number of experiments that need be conducted to provide a robust training set for optimizing the EPM. Techniques such as design of experiments (DOE) may be employed for this purpose. Generally, such techniques determine which sets of process parameters to use in various experiments. They choose the combinations of process parameters by considering statistical interactions between process parameters, randomization, and the like. As an example, DOE may identify a small number of experiments covering a limited range of parameters around the center point of a process that has been finalized.

Typically, a researcher will conduct all experiments early in the model optimization process and use only those experiments in the optimization routine iterations until convergence. Alternatively, an experiment designer may conduct some experiments for early iterations of the optimization and additional experiments later as the optimization proceeds. The optimization process may inform the experiment designer of particular parameters to be evaluated and hence particular experiments to be run for later iterations.

One or more in-situ or offline metrology tools may be used to measure the experimental etch profiles which result from these experimental etch process operations. Measurements made be made at the end of the etch processes, during the etch processes, or at one or more times during the etch processes. When measurements are made at the end of an etch process, the measurement methodology may be destructive, when made at intervals during the etch process, the measurement methodology would generally be non-destructive (so not to disrupt the etch). Examples of appropriate metrology techniques include, but are not limited to, in situ and ex situ optical critical dimension (OCD) scatterometry and cross-sectional SEM. Note that a metrology tool may directly measure a feature's profile, such as is the case of SEM (wherein the experiment basically images a feature's etch profile), or it may indirectly determine a feature's etch profile, such as in the case of OCD measurements (where some post-processing is done to back-out the feature's etch profile from the actual measured data). Also note, that in some embodiments, EPM optimization may be done in the spectral space and so one would not need to back out the etch profile from the OCD measurements; instead one would use the etch profile calculated via the EPM to simulate OCD scattering.

In any event, the result of the etch experiments and metrology procedures is a set of measured etch profiles, each generally including a series of values for a series of coordinates or a set of grid values which represent the shape of the feature's profile as described above. An example is shown in FIG. 2. The etch profiles may then be used as inputs to train, optimize, and improve the computerized etch profile models as described below.

Model Parameter Tuning/Optimization

Each measured experimental etch profile provides a benchmark for tuning the computerized etch profile model. Accordingly, a series of calculations are performed with the etch profile model by applying the experimental etch profiles to see how the model deviates from reality in its prediction of etch profiles. With this information, the model may be improved.

FIG. 3 presents a flowchart illustrating a set of operations 300 for tuning and/or optimizing an etch profile model, such as those described above. In some embodiments, such a tuned and/or optimized model reduces—and in some cases substantially minimizes—a metric which is related to (indicative of, quantifies, etc.) the combined differences between the etch profiles which are measured as a result of performing the etch experiments, and the corresponding computed etch profiles as generated from the model. In other words, an improved model may reduce the combined error over the different experimental process conditions (as designated by the different sets of specified values of the selected process parameters—which are used to compute independent input parameters to the EPM).

As shown in FIG. 3, the optimization procedure 300 begins at operation 310 with the selection of a set of model parameters to be optimized. Again, these model parameters may be chosen to be parameters which characterize the underlying chemical and physical processes over which the process engineer has no control. Some or all of these will be adjusted based on the experimental data to improve the model. In some embodiments, these model parameters may be reaction parameters and include reaction probabilities and/or (thermal) rate constants, reactant sticking coefficients, etch threshold energies for physical or chemical sputtering, exponent dependence on energy, etch angular yield dependencies and parameters associated with the angular yield curve, etc. Note that, in general, the optimization is done with respect to a particular given/specified mixture of chemical species flowed into the etch chamber (though it should be understood that the chemical composition of the etch chamber will change as the etch process proceeds). In some embodiments, the reaction parameters are fed into the EPM in a separate input file from the other input parameters (such as the plasma parameters).

In some embodiments, the model parameters may include the specification of which particular chemical reactions are to be modelled by the etch process. One of ordinary skill in the art will appreciate that, for a given etch process, there may be many ongoing reactions occurring in the etch chamber at any time. These include the main etch reaction itself, but it may also include side reactions of the main etch process, and reactions involving by-products of the main etch reaction, reactions between by-products, reactions involving by-products of by-products, etc. Thus, in some embodiments, selection of the model parameters involves choosing which reactions to include in the model. Presumably, the more reactions that are included, the more accurate the model, and the more accurate the corresponding computed etch profile. However, increasing the complexity of the model by including more reactions, increases the computational cost of the simulation. It also results in there being more reaction parameters to optimize. This may be good if the particular reaction which is added is important to the overall etch kinetics. However, if the additional reaction is not critical, the addition of another set of reaction parameters may make the optimization procedure more difficult to converge. Once again, the choices of which reactions to include and the rate constants or reaction probabilities associated with these reactions may be fed into the EPM in their own input file (e.g., separate from the plasma parameters). In certain embodiments, for a given set of reactant species, the probabilities of the various alternative/competing reaction pathways for each species should sum to unity. And, once again, it should be appreciated that the specification of reactions to include, reaction probabilities, etc. (e.g., in the input file) would generally be done for a given/specified mixture of chemical species which are being flowed into the etch chamber to perform the etch process/ reaction (and the optimization would generally be with respect to this given mixture, though in some embodiments, one can see that what is learned with respect to one chemical mixture, may have applicability to similar/related chemical mixtures).

In any event, to begin the optimization process shown in the flowchart of FIG. 3, initial values generally must be chosen for the various model parameters being optimized (such as the reaction probabilities, sticking coefficients, etc.). This is done in operation 310. The initial values may be those found in the literature, those calculated based on other simulations, determined from experiment, or known from previous optimization procedures, etc.

The model parameters chosen and initialized in operation 310 are optimized over a set of independent input parameters which are given multiple sets of values in operation 320. Such independent input parameters may include parameters which characterize the plasma in the reaction chamber. In some embodiments, these plasma parameters are fed into the EPM via an input file which is separate from the input file used for the reaction parameters (just described). The multiple sets of values for the independent input parameters (e.g., plasma parameters) thus specify different points in the space of the selected independent input parameters. For example, if the input parameters chosen to be optimized over are temperature, etchant flux, and plasma density, and 5 sets of values are chosen for these selected input parameters, then one has identified 5 unique points in the selected 3-dimensional input parameter space of temperature, etchant flux, and plasma density—each of the 5 points in the space corresponding to a different combination of temperature, etchant flux, and plasma density. As mentioned, an experimental design procedure such as DOE may be employed to select the sets of input parameters.

Once chosen, for each combination of input parameters, in operation 330 an etch experiment is performed in order to measure an experimental etch profile. (In some embodiments, multiple etch experiments are performed for the same combination of values for the input parameters and the resulting etch profile measurements averaged together (possibly after discarding outliers, etc.), for example.) This set of benchmarks is then used for tuning and optimizing the model as follows: In operation 335 an etch profile is computed for each combination of values of the input parameters, and in operation 340 an error metric is calculated which is indicative of (related to, quantifies, etc.) the difference between the experimental and computed etch profiles over all the different sets of values for the input parameters.

Note that this set of computed etch profiles (from which the error metric is calculated) corresponds to a set of previously chosen model parameters as specified in operation 310. A goal of the optimization procedure is to determine more effective choices for these model parameters. Thus, in operation 350 it is determined whether the currently specified model parameters are such that the error metric calculated in operation 340 is locally minimized (in terms of the space of model parameters), and if not, one or more values of the set of model parameters are modified in operation 360, and then used to generate a new set of etch profiles repeating operation 335 as schematically indicated in FIG. 3's flowchart—and thereafter a new error metric is calculated in a repeating of operation 340. The process then proceeds again to operation 350 where it is determined whether this new combination of model parameters represents a local minimum over all the sets of input parameters as assessed by the error metric. If so, the optimization procedure concludes, as indicated in the figure. If not, the model parameters are again modified in operation 360 and the cycle repeats.

Figure 4A:
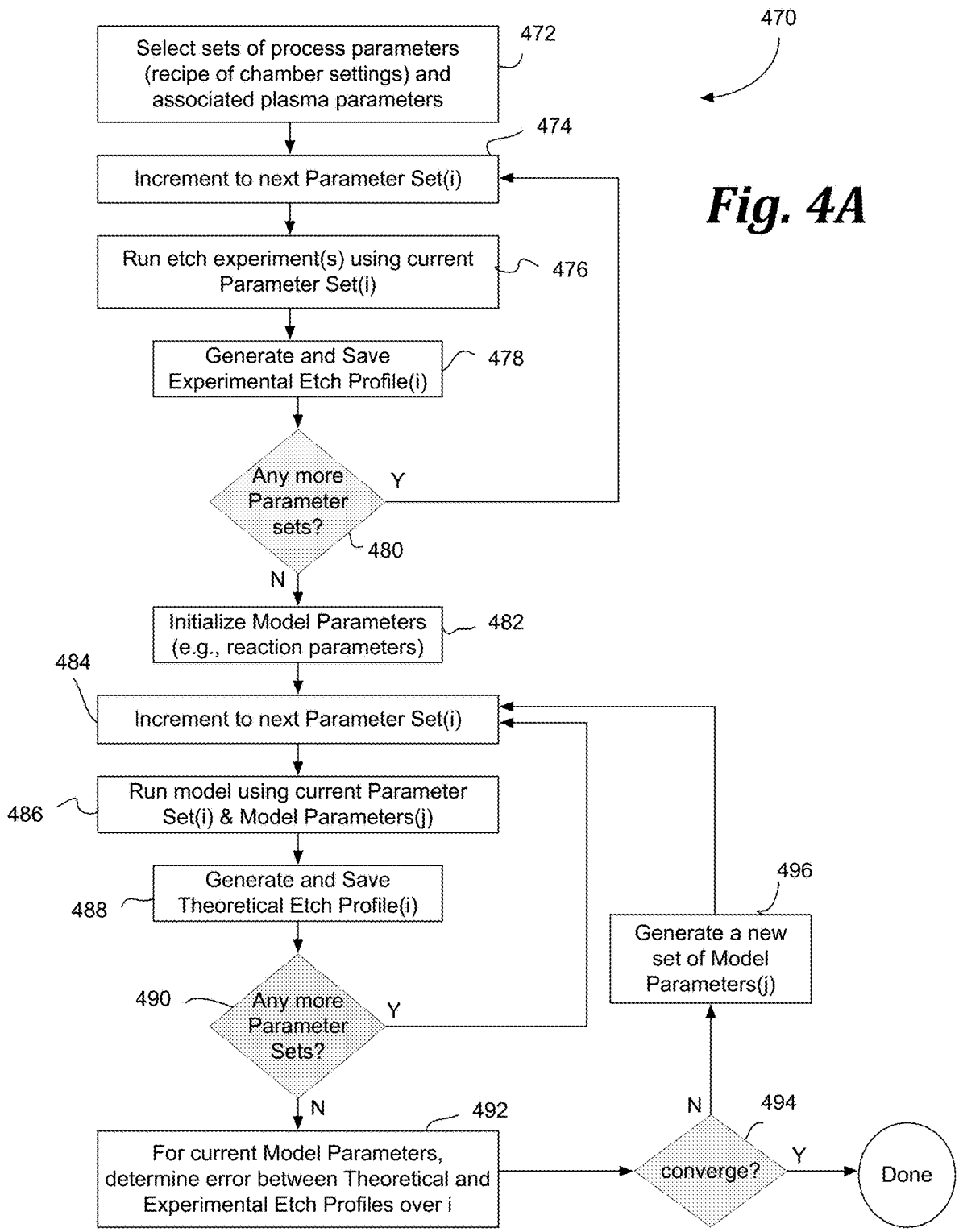
FIG. 4A is a process flow chart representing procedures for optimizing etch profile models, and particularly certain model parameters used in such models.

FIG. 4A presents a flowchart of a method 470 for refining model parameters in an etch profile model. As depicted, method 470 begins by collecting experimental etch profiles generated for a controlled series of etch chamber parameter sets. At a later stage, the method compares these experimentally generated etch profiles to theoretically generated etch profiles produced using the etch profile model. By comparing the experimentally and theoretically generated etch profiles, a set of model parameters used by the etch profile model can be refined to improve the model's ability to predict etch profiles.

In the depicted method, the process begins with an operation 472 where sets of process parameters are selected for use in both the computational and experimental stages. These process parameters define a range of conditions over which the comparison is conducted. Each set of process parameters represents a collection of settings for operating the etch chamber. As mentioned, examples of process parameters include chamber pressure, pedestal temperature, and other parameters that can be selected and/or measured within the etch chamber. Alternatively, or in addition, each set of process parameters represents a condition of work piece being etched (e.g., line width and line pitch formed through etching).

After selecting the sets of process parameters for the experimental runs (note that a set of independent input parameters for the EPM optimization will correspond to (and/or be computed from) each set of process parameters), the experiments begin. This is depicted by a loop over multiple parameter sets and includes operations 474, 476, 478, and 480. Operation 474 simply represents incrementing to the next process parameter set (Parameter Set(i)) for running a new experiment. Once the parameter set is updated, the method runs a new etch experiment (block 476) using the parameters of the current parameter set. Next, the method generates and saves an experimental etch profile (block 478) measured on the work piece after the etch experiment runs with the current parameter set. The "generate and save etch profile" operation provides the etch profile in a reduced dimensional space, as explained above, such as a principal components representation of the etch profile.

Each time a new process parameter set is used in an experiment, the method determines whether there are any more parameter sets to consider, as illustrated at decision block 480. If there are additional parameter sets, the next parameter set is initiated as illustrated at block 474. Ultimately, after all the initially defined process parameter sets are considered, decision block 480 determines that there are no more to consider. At this point, the process is handed off to the model optimization portion of the process flow.

Initially in the model optimization portion of the flow, a set of model parameters (Model Parameters(j)) is initiated as illustrated at block 482. As explained, these model parameters are parameters that the model uses to predict etch profiles. In the context of this process flow, these model parameters are modified to improve the predictive ability of the EPM. In some embodiments, the model parameters are reaction parameters representing one or more reactions to take place in the etch chamber. In one example, the model parameters are reaction rate constants or the probabilities that a particular reactions will take place. Also, as explained elsewhere herein, the etch profile model may employ other parameters that remain fixed during the optimization routine. Examples of such parameters include physical parameters such as plasma conditions.

After the model parameters are initialized at operation 482, the method enters an optimization loop where it generates theoretical etch profiles corresponding to each of the process parameter sets used to generate the experimental etch profiles in the experimental loop. In other words, the method uses the EPM to predict etch profiles which correspond to each of the process parameter sets (i.e., for all the different Parameter Set(i)'s). Note, however, that for each of these process parameter sets, what is actually input into the EPM (to run it) is a set of independent input parameters which correspond to the given process parameters. For some parameters, an independent input parameter may be the same as a process parameter; but for some parameters, the independent input parameter (actually fed into the EPM) may be derived/calculated from the physical process parameter; thus they correspond to one another, but they may not be the same. It should therefore be understood that in the context of this optimization loop in FIG. 4A (operations 482-496), the EPM is—to be very precise about it—run with respect to a set of independent input parameters corresponding to "Parameter Set(i)", whereas in the experimental loop (operations 472-480) the experiments are run with process parameters corresponding to "Parameter Set(i)."

In any event, initially in this loop, the method increments to a next one of the parameter sets that were initially set in operation 472. See block 484. With this selected parameter set, the method runs the etch profile model using the current set of model parameters. See block 486. Thereafter, the method generates and saves the theoretical etch profile for the current combination of a parameter set and model parameters (Parameter Set(i) and Model Parameter(j)). See block 488. The "generate and save etch profile" operation provides the etch profile in a reduced dimensional space such as a principal components representation of the etch profile.

Ultimately all the parameter sets are considered in this loop. Before that point, a decision block 490 determines that additional parameter sets remain and returns control to block 484 where the parameter set is incremented to the next parameter set. The process of running the model and generating a saving theoretical etch profiles repeats for each of the parameter sets (Parameter Set(i)).

When there are no remaining parameter sets to consider for the model parameters currently under consideration (Model Parameters(j)), the process exits this loop and calculates an error between the theoretical etch profile and the experimental etch profiles. See block 492. In certain embodiments, the error is determined across all the Parameter Sets(i) for the process parameters, not just one of them.

The method uses the error determined in block 492 to decide whether the optimization routine for the model parameters has converged. See block 494. As described below, various convergence criteria can be used. Assuming that the optimization routine has not converged, process control is directed to a block 496 where the method generates a new set of model parameters (Model Parameter(j)) which could improve the model's predictive ability. With the new set of model parameters, process control returns to the loop defined by blocks 484, 486, 488, and 490. While in this loop, the Parameter Set(i) is incremented repeatedly and each time the model runs to generate a new theoretical etch profile. After all parameter sets are considered, the error between the theoretical and experimental etch profiles is again determined at block 492 and the convergence criteria and is again applied at block 494. Assuming that the convergence criterion is not yet met, the method generates yet another set of model parameters for testing in the manner just described. Ultimately, a set of model parameters is chosen that meets the convergence criterion. The process is then completed. In other words, the method depicted in FIG. 4 has produced a set of model parameters that improve the predictive ability of the etch profile model.

Figure 4B:
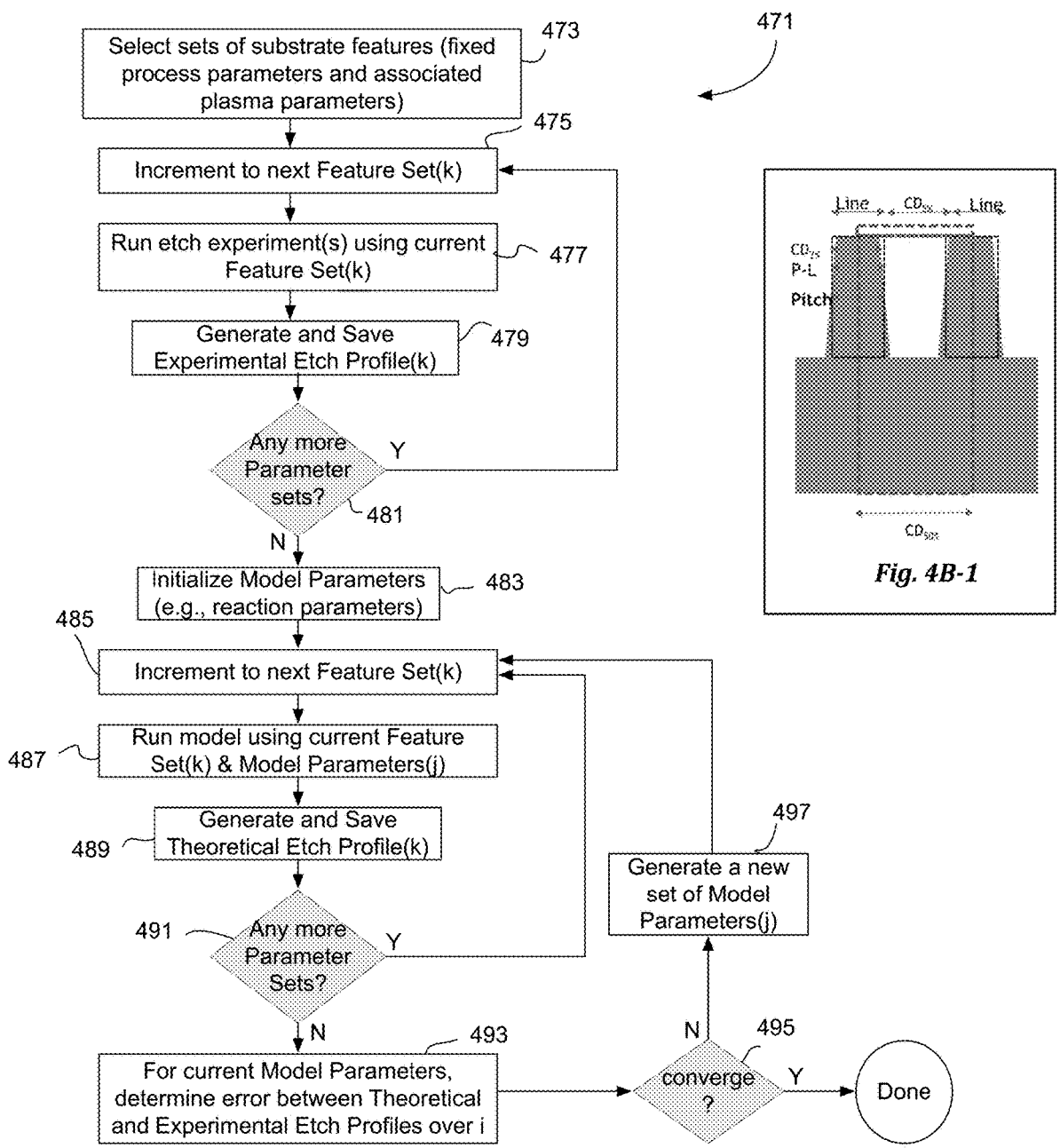
FIG. 4B is a process flow chart representing procedures for optimizing etch profile models, and particularly certain model parameters used in such models.

A related procedure is depicted in FIG. 4B. As shown there, the experimental and theoretical etch profiles are generated for different substrate feature structures, rather than different process conditions. Otherwise the basic process flow is the same. In some implementations, both feature structures and process conditions are varied for the experimental and theoretical operations.

The different features may include different "line" and "pitch" geometries. See FIG. 4B-1. Pitch refers to smallest unit cell width that covers the feature being etched that will be repeated many times. Line refers to the total thickness between two adjacent sidewalls, assuming symmetry. As an example, the method may run repeating geometries of L50P100, L100P200, L100P300, L75P150 etc. where numbers represent the line width and pitch in nanometers.

In the depicted embodiment, a process 471 begins by selecting fixed and varying parameters (model parameters) of the etch profile model. These may be physical and chemical reaction parameters in some embodiments. Additionally, the substrate features are selected. See operation 473.

For each feature geometry (incremented Feature Set(k) as illustrated in operations 475 and 481), the method runs the etch process for using the current feature geometry, generates the experimental etch profile (Experimental Etch Profile (k)), and saves the etch profile. See operations 477 and 479. As before, each experimental etch profile is saved in a reduced dimensional representation.

Thereafter, the method initializes the model parameters (Model Parameters(j)) for tuning. See operation 483. For each feature geometry (incremented as Feature Set(k) in operations 485 and 491), the method runs the etch profile model generates a theoretical etch profile (Theoretical Etch Profile(k)), and saves the etch profile. See operations 487 and 489. As before, each theoretical etch profile is saved in a reduced dimensional representation.

For each set of Model Parameters(j) considered in the loop containing operations 487 and 489, the method compares the theoretical and experimental etch profiles to determine the error between the etch profiles over all the substrate features sets. See operation 493. If the process has converged, as determined at operation 495, the process is complete and the current model parameters are selected. If the process has not converged, the method generates a new set of Model Parameters(j) and returns again to the loop defined by operations 485, 487, 489, and 491.

In some embodiments, a separate model parameter set is selected for each feature set. In such cases, the method may plot or otherwise determine a relationship between line/pitch ratio (or another characteristics of the features) and the final converged model parameters. If the converged model parameter values are reasonably constant, possibly with some noise, the method use the average model parameter values for the improved edge profile model. If the converged model parameter values exhibit a trend, the method may use polynomial fit do develop a function that may be used to select model parameter values for each feature set (e.g., line and pitch geometry).

As should be apparent, feature sets, process parameter sets, or other variables are used to conduct multiple experiments and therefore produce multiple experimentally-determined etch profiles. In some implementations, half or some other fraction of these etch profiles (and associated parameter sets) are used for training, as illustrated in the above flow charts, and the remaining etch profiles are used for validation. The training etch profiles generate tuned model parameters, which are used in the etch profile model and validated by applying the tuned model to predict etch profiles for the validation set. If the error between experimental and theoretical etch profiles for the validation set is statistically higher than the error found at convergence using the training set, a different training set is used to tune the model as before.

Details Regarding Iterative Non-Linear Optimization Procedures

The model parameter optimization procedure just described in the context of FIG. 3 is generally an iterative non-linear optimization procedure—e.g., it optimizes an error metric which is, in general, a non-linear function of the input parameters—and, as such, various techniques known in the art for non-linear optimization may be employed. See, for example: Biggs, M. C., "Constrained Minimization Using Recursive Quadratic Programming," Towards Global Optimization (L. C. W. Dixon and G. P. Szergo, eds.), North-Holland, pp 341-349, (1975); Conn, N. R., N. I. M. Gould, and Ph. L. Toint, "Trust-Region Methods," MPS/SIAM Series on Optimization, SIAM and MPS (2000); More, J. J. and D. C. Sorensen, "Computing a Trust Region Step," SIAM Journal on Scientific and Statistical Computing, Vol. 3, pp 553-572, (1983); Byrd, R. H., R. B. Schnabel, and G. A. Shultz, "Approximate Solution of the Trust Region Problem by Minimization over Two-Dimensional Subspaces," Mathematical Programming, Vol. 40, pp 247-263 (1988); Dennis, J. E., Jr., "Nonlinear least-squares," State of the Art in Numerical Analysis ed. D. Jacobs, Academic Press, pp 269-312 (1977); More, J. J., "The Levenberg-Marquardt Algorithm: Implementation and Theory," Numerical Analysis, ed. G. A. Watson, Lecture Notes in Mathematics 630, Springer Verlag, pp 105-116 (1977); Powell, M. J. D., "A Fast Algorithm for Nonlinearly Constrained Optimization Calculations," Numerical Analysis, G. A. Watson ed., Lecture Notes in Mathematics, Springer Verlag, Vol. 630 (1978); each of which is hereby incorporated by reference in its entirety for all purposes. In some embodiments, these techniques optimize an objective function (here the error function/metric) subject to certain constraints which may be placed on the input parameters and/or the error metric. In certain such embodiments, the constraint functions themselves may be non-linear. For example, in embodiments where the computed etch profile is represented with a set of stacked trapezoids which are output by the EPM, the error metric may be defined as the difference between the area represented by the boundaries of these stacked trapezoids and the area of the measured experimental etch profile. In this case, the error metric is a non-linear function of the response variables output by the EPM, and thus a constrained optimization technique is selected from those just described (and/or from the incorporated references) which allows for the specification of non-linear constraints. Note that in the context of the flowchart presented in FIG. 3, these various procedures correspond to how the one or more model parameters are modified in operation 360, and also how one or more potential local minima in error are detected and treated in operation 350.

In some embodiments, an iterative non-linear optimization procedure which is used to determine improved/tuned model parameters as shown in FIG. 3 may be divided into multiple phases, and in certain such embodiments, the different optimization phases may correspond to different layers of material on the surface of the semiconductor substrate being etched. This approach may also reduce the computational burden by reducing the number of input parameters being varied and simplifies the error metric being calculated. For instance, if the substrate to be etched includes a multilayer stack of different sequentially deposited materials, because the different layers, in general, have different material compositions, in general, different chemistries characterize the local etch process occurring in each layer—e.g., a different etch reaction (or reactions), different side reactions, different reactions between by-products, or even if the same (or similar) chemical reactions are occurring, they may generally be occurring at different rates, in different stoichiometric ratios, etc. Thus, in order to setup an etch profile model (EPM) corresponding to the etching of the whole multilayer stack, input parameters fed into the model generally include different sets of parameters corresponding to the different stacked layers. As described above, these sets may include parameters indicating which chemical reactions are to be included in the modeling of the etch processes, as well as parameters characterizing the reactions themselves reaction probabilities, sticking coefficients, and the like.

However, it is recognized that an optimization protocol does not necessarily need to optimize every parameter simultaneously, e.g. some may remain fixed in operation 360 of FIG. 3 while others are allowed to "float" and be modified in one or more particular cycles/rounds of optimization as schematically illustrated in the figure. Therefore, based on the observation that the chemical processes occurring in each layer are to a certain extent local to that layer, in some embodiments, optimization may be accelerated by tuning the model parameters associated with one layer, individually, while holding the parameters associated with the other layers fixed, and thereafter selecting another layer, allowing its parameters to "float," while holding those for the others fixed, and so forth, until all layers have been individually tuned. The layer-by-layer tuning process may then repeated multiple times, each time cycling through all the layers, until a certain degree of optimization is attained, and at this point, a full optimization over all layers may be performed—i.e., allowing the model parameters for all the layers to be varied/"floated"—based on the recognition that the full optimization will converge more efficiently (and possibly to a better local minimum in the error metric) with the parameters associated with each layer having been individually optimized. Going one step further, the entire layer-by-layer procedure may be repeated to improve results further—i.e., performing layer-specific optimization by cycling through the layers one or more times, and then performing a global optimization, which allows the model parameters of all layers to float. Note that, in the context of FIG. 3, the selection of certain model parameters and allowing them to "float" (and thus be individually optimized for a specific layer) while others are held fixed, would be done as part of the parameter modification operation 360 of FIG. 3 (in these and similar classes of embodiments).

As a specific example illustrating the foregoing individual layer-by-layer optimization procedure, consider the case of modeling the etching of a layer underneath an etch mask, where both the etch mask layer and the layer beneath it are etched to some extent. This thus constitutes a 2-layer etch model where the parameters for each of the two layers may be individually optimized prior to full simultaneous optimization of the model parameters corresponding to both layers.

Therefore, one begins by specifying values for all the model parameters, running the model to generate computed etch profiles over all the sets of values of the input parameters—representing different experimental etch conditions—and calculating an error metric indicative of the difference between the experimental and computed etch profiles over all the profiles corresponding to the multiple sets of values for the independent input parameters. One may then proceed by selecting the layer beneath the etch mask—say a layer of dielectric—for individual layer-specific optimization, modifying one or more model parameters associated with this (dielectric) layer for optimization, re-running the model over all sets of values of the independent input parameters, calculating a new error metric, again modifying one or more model parameters associated with the dielectric layer, re-running the model, recalculating the error, and so forth, until a local minimum in error is obtained with respect to the dielectric layer.

The model parameters for the dielectric layer are then held fixed at these values, the model parameters of the etch mask layer are selected for individual optimization, one or more of their values (of the model parameters of the etch mask layer) modified, the model re-run, the error recalculated, and so forth until a local minimum in error is achieved with respect to the etch mask layer. At this point, a full optimization over the model parameters of both layers may be performed, or in some embodiments, before doing that, one or more additional cycles of individual dielectric layer and mask layer optimization may be performed so that the full optimization is more effective (e.g., converges faster, or converges to a better resulting local minimum in the total error metric).

It should also be understood, that in some cases, the foregoing layer-by-layer optimization procedure doesn't necessarily have to be restricted to the tuning of only a single individual layer at one time. For instance, if one were modeling the etching of a 6-layer stack, one variation of the foregoing layer-by-layer optimization procedure would be to select pairs of layers for simultaneous tuning—i.e., floating the model parameters corresponding to pairs of adjacent layers simultaneously—and do this sequentially for the 3 pairs, possibly repeat the 3-step cycle multiple times, before then performing the full simultaneous optimization over model parameters for all the layers; as before, optionally, repeating the entire layer-by-layer procedure (or, in this case, pairwise layer-by-layer procedure) until a local minimum in error over the entire stack is identified.

It is also possible that the numerical optimization procedure (whether performed on a layer-by-layer basis before full optimization, or performed directly as a full optimization over all layers) may result in multiple local minima in the etch profile metric depending on the starting point of the optimization (i.e., depending on the initial values chosen for the model parameters), as well as other factors, and thus there may be many local minimum which the optimization procedure could potentially identify as representing the improved (and/or optimal model). In the case of many local minima in error, many potential sets of model parameters may be eliminated from consideration by defining physically realistic upper and lower boundaries for these model parameters. In some embodiments, the foregoing numerical optimizations may be performed for a plurality of choices for starting points (initial values for the model parameters) in order to potentially identify a plurality of local minima, and thus a plurality of candidate sets of model parameters, from which the most preferred may be chosen (possibly, in some embodiments, because it has the lowest computed error metric of all the candidates which satisfy the foregoing mentioned physically realistic upper and lower bounds).

Dimensionality Reduction and Principle Component Analysis

In some embodiments, an etch profile model outputs values at a large number grid/mesh points (cells) at each time step during the calculated etch profile evolution. These values corresponding to each cell or grid point map out the shape of the calculated etch profile. Such an example of a grid/mesh of points representing a computed etch profile are illustrated in FIG. 1, where each grid/mesh point has a value indicating whether or not that region of space is occupied by the feature at that time during the etch process. In some embodiments, the vertical dimension of the mesh representing an etch profile is at least about 5, or at least about 10, or at least about 20. Depending on the embodiment, a minimum value for the vertical distance between vertically adjacent mesh points may be chosen to be 1 Å and can be as large as a few angstroms, such as 5 Å, or 10 Å, or even 20 Å.

In practice, one would like to choose the distance between adjacent mesh/grid points to be small enough to provide a reasonably accurately representation of the shape of the feature as it evolves in time (which likely depends on the intricacy of the profile), but not much (or any) smaller than necessary to achieve this reasonable representation (because more grid points entail more compute time). The horizontal separation (in the plane of the wafer) between adjacent mesh/grid points would be chosen based on the same considerations, but in general horizontal and vertical separation would be chosen to be the same (i.e., a uniform grid) or roughly comparable. This does not mean the vertical and horizontal grid dimensions are necessarily the same, however, because the width of the feature being modeled is not necessarily the same as the height of the feature which is being modeled. Thus, the horizontal dimension (number of horizontal points spanning a given direction, x-dimension in 2D, x- and y-dimensions in 3D), may depend on whether just a sidewall of a feature is being modeled, whether the entire feature is being modeled (it's span from one profile edge to another), whether multiple adjacent features are being modeled, etc.

As stated, the mesh of values which are output by the etch profile model provide an estimation of where, in physical space, the edge of the feature profile is located at different vertical elevations. From this information (from these values at the mesh points) one can compute a feature width at different elevations, or in another view, a horizontal coordinate of the edge (relative to some baseline) for each elevation. This is illustrated in FIG. 2. This set of coordinates may then be viewed as a point in multi-dimensional space representing the particular feature profile. This vector space may be an orthogonal space, or it may be a non-orthogonal space, however a linear transformation may be made of this representation to an orthogonal space. If so, then the transformed point's coordinates are distances in relation to a set of orthogonal axes in that space. In any event, when "profile coordinates" are referred to in this document, this refers generally to any appropriate (approximate) mathematical representation of the profile shape.

In any event, because the etch profile model may output a large number of "profile coordinates" (hereinafter inclusive of a grid/mesh of points as just described) and the goal is to have these accurately match the measured experimental etch profiles, reducing the error in the etch profile model—iteratively reducing the error combined over the different experimental process conditions as described with respect to FIG. 3 above—may be a computationally demanding task. For example, if a set of m measured experimental etch profiles are to be matched point-by-point to calculated etch profiles consisting of n profile coordinates, then this amounts to optimizing a model to fit a dataset m×n data points.

Figure 5:
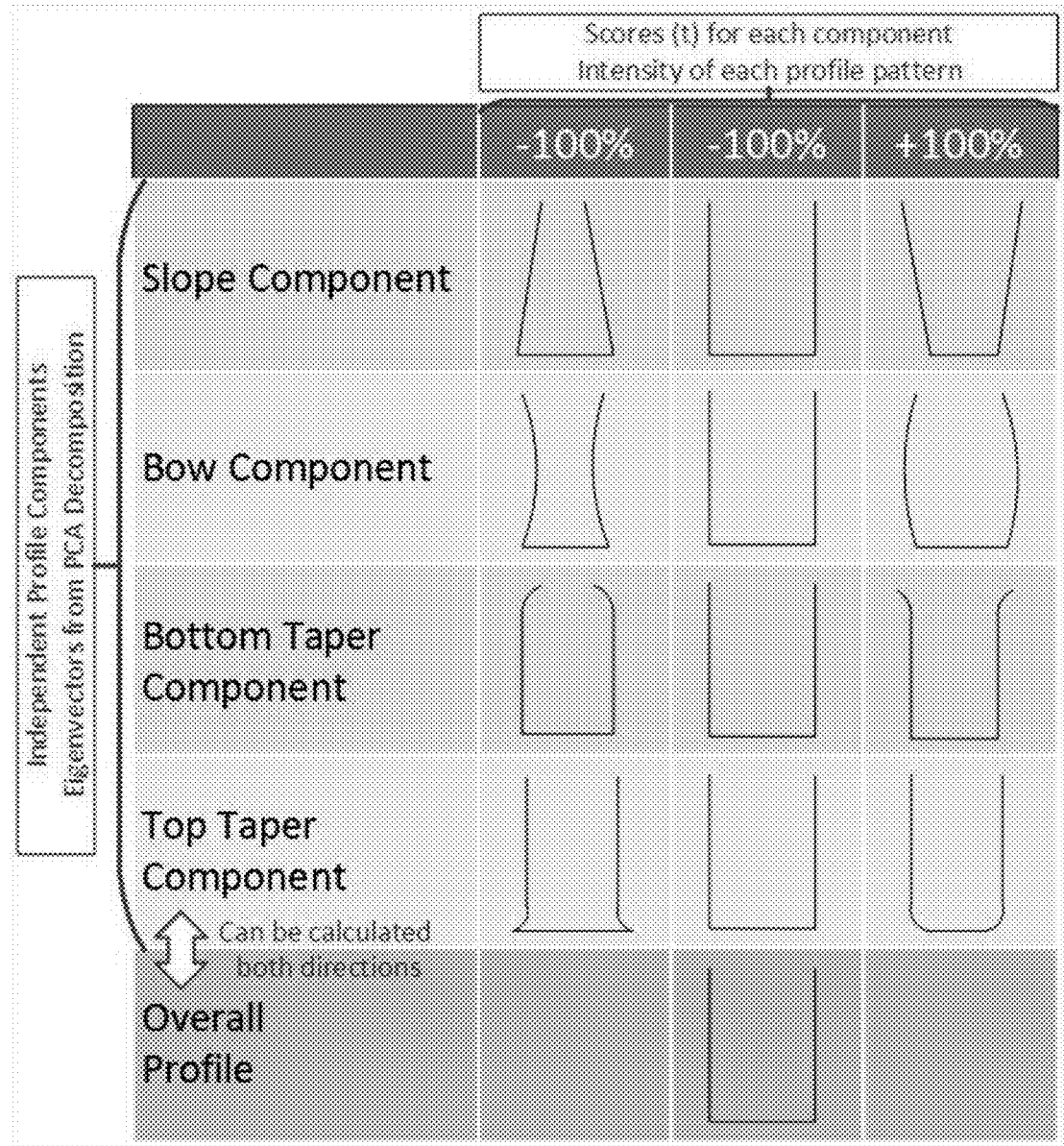
FIG. 5 depicts an example set of canonical etch profiles that may be identified using models optimized in accordance with this disclosure.

It turns out, however, that there are latent statistical correlations in the etch profiles (whether measured or calculated) and that one may take advantage of these correlations to recast the optimization problem in a form which is far more numerically tractable. For instance, while a fine grid of profile coordinates may consist of many data points, from a statistical viewpoint, the values of certain combinations of these coordinates are correlated with one another. To give a trivial but illustrative example, vertically adjacent coordinates will tend to be correlated with one another—simply because the width of an etched feature is not going to change too drastically over the short length scale associated with adjacent grid points as one moves up or down the profile. More complicated examples of correlations between profile coordinates relate to the types of profile shapes which may generally be achieved by varying certain combinations of process coordinates. Several examples are shown in FIG. 5. For instance, certain process parameters, alone or in combination with one another, may be adjusted to cause an etched profile to be bowed either inward or outward, as shown in FIG. 5, and the profile coordinates (or grid points) which map out this bowing of the profile are thus statistically correlated with one another. Likewise, as also shown in FIG. 5, etch profiles obtained through adjustment of various process parameters, individually or in combination, may exhibit a downward or upward taper, and thus profile coordinates may be correlated to the extent that varying one or more process parameters tends to cause this tapering effect. Two other examples of underlying profile correlation structures are top taper and bottom taper, as also illustrated in FIG. 5. Again, these underlying profile structures are manifestations of the fact that variations in process parameters tend to cause changes in the overall shape of the profile rather than having a local effect at certain spots on the profile without affecting other spots. This is, of course, a consequence of the underlying physics and chemistry associate with the etch process.

As mentioned, because of these underlying statistical correlations, the optimization problem presented above (described with respect to the flowchart in FIG. 3) can be recast in a form which is more amenable to iterative optimization techniques. One way of doing this is to identify several types of canonical profiles shapes, and express the measured and/or computed etch profile in terms of these canonical shapes—such as by writing the total profile (at each profile coordinate) as a weighted average of the set of canonical profile shapes (at each profile coordinate). I.e., a set of vectors represents the canonical profile shapes and the total profile may be approximately expressed as a linear combination of these vectors. In this manner, one can take advantage of the underlying statistical correlations and model changes in the coefficients/weights of the linear combination representing the profile, rather than model the changes in all the individual profile coordinates. For example, if one were to choose bow and taper (see FIG. 5) as the canonical shapes, then the problem of modeling say m=100 profile coordinates is reduced to modeling changes in the 2 coefficients for bow and taper in the linear combination—i.e., constituting a dimensionality reduction from 100 to 2. Which canonical shapes are useful may depend on the process/layer type. The depicted methods provide a numerical way of extracting those shapes from either experimental data or from performing simulations with EPMs.

For this strategy to be effective the canonical shapes must provide a good, albeit not exact, representation of the different profile shapes involved in the analysis. The more independent canonical shapes included in the representation, the more accurate the representation will be (in the vector space of the canonical shapes). Thus, the question becomes what canonical shapes to use, and how many to include, recognizing that including more canonical shapes makes the analysis more accurate, but it also makes it more computationally expensive, and in the context of iterative optimization, it may affect the ability of the optimization to converge, or to converge as desirable a local minimum.

One way of doing this is to have process engineers identify a few types of canonical profiles shapes which they observe, based on their past experience, to frequently occur in their etch experiments. The advantage of this approach is that it is simple. A potential disadvantage is that it is ad hoc (being simply based on the experience and intuition of the process engineer) and that it does not provide any way of determining when a sufficient number of profile shapes have been included in the analysis. In practice, any canonical profile shape that a process engineer identifies will get included, but this may, of course, be insufficient to provide an accurate representation. More importantly, this type of methodology will not identify new correlations in the profile data which have not previously been identified, either because in previous work the shape was not as pronounced, or because it is a result of a new etch process with different underlying physical and chemical processes taking place.

Another approach is to base the dimensionality reduction procedure on a statistical methodology which can automatically identify the important canonical profile shapes as well as to provide an estimate of how many shapes need to be included in order to provide a sufficiently accurate representation. One data analysis technique for achieving this is principle component analysis (PCA), which makes use of the singular value decomposition (SVD), a matrix decomposition technique from numerical linear algebra. A description of the PCA technique and various applications may be found (for example) in: Jackson, J. E., "A User's Guide to Principal Components," John Wiley and Sons, p. 592. [2] (1991); Jolliffe, I. T., "Principal Component Analysis," 2nd edition, Springer (2002); Krzanowski, W. J., "Principles of Multivariate Analysis: A User's Perspective," New York: Oxford University Press (1988); each of which is hereby incorporated by reference in its entirety for all purposes.

As described in the foregoing references, PCA takes as its input a set of vectors—in this case each vector being a series of n etch profile coordinates representing a single profile—and returns a new set of n orthogonal vectors known as the principal components (PC) which may be sorted so that PCs 1-i (where i≤n) constitute the "best" ith dimensional subspace for representing the input profile vectors; "best" means statistically optimal in the least squares sense—i.e. that the ith-dimensional subspace of PCs determined from the PCA minimizes the combined RMS error between each input vector and its linear representation in the subspace of the selected PCs. Of course, the more PCs which are included, the larger the dimension of the subspace and the better the representation of the input profile data; however, because a subspace constructed via PCA is optimal, the expectation is that not many PCs are required—and the amount of statistical variation in the underlying data which is captured by adding an additional PC may be assessed through the singular values of the underlying SVD. Thus, by using PCA to identify the canonical profile shapes which underlie a dataset of etch profiles, once can construct a reduced-dimensional linear model for representing the etch profiles, and do so in a fashion which is automatic (does not rely on the expertise of the process engineer) and has the ability to identify new correlations in the profile data, and in a manner which provides a statistical estimate of how many shapes/dimensions are required to provide a good representation.

The result of the foregoing methodology is that a significant dimensionality reduction may be achieved without significantly compromising statistical error and that the number of data points required for fitting in the numerical optimization procedure described above may be substantially reduced. It is also noted that there are different viable strategies for implementing the dimensionality reducing PCA procedure within the optimization procedure presented in FIG. 3. For instance, in the context of the manner in which the error metric is calculated in operation 340 of FIG. 3, one way to employ a dimensionality reduction procedure is to project the computed and corresponding experimental etch profiles, individually, onto a reduced-dimensional subspace (which may be constructed via PCA), and then to calculate the difference between the profiles as projected onto the subspace. Another way is to take the differences between the computed and corresponding experimental etch profiles, project the differences onto a reduced dimensional subspace representative of the potential differences between experimental and calculated etch profiles, and view the total error metric as the combined lengths of these vectors in the difference-sub space.

It is additionally noted that PCA may also be used to dimensionally reduce the number of independent variables in the space of independent input parameters, providing a similar benefit to that just described. In some embodiments, the dimensionality reduction procedure may be applied to both the profile coordinate space and the input parameter space, simultaneously, such as, for example, by performing a PCA on the concatenated vectors of input parameters and corresponding measured etch profiles.

Applications of the Optimized Computerized Etch Model

The optimized computerized etch models disclosed herein may be useful in semiconductor processing workflows wherever a detailed assessment and characterization of an etch process is desirable. For instance, if a new etch process is being developed, the model may be used to determine etch profile characteristics for many combinations of process parameters without having to go into the lab and perform each experiment individually. In this way, the optimized etch profile models may enable quicker process development cycles, and in some embodiments may significantly reduce the amount of work required to fine tune a target profile.

Lithographic operations and mask development may also benefit greatly from accurate etch profile modeling because estimating edge placement error (EPE) is typically quite important in lithographic work, and an accurate calculation of profile shape provides that information. In some embodiments, through rigorous physics-based EPE estimation, an optimized EPM may be used to generate a pattern proximity-corrected (PPC) design layout for photoresist in a much shorter timeframe than typically attends the semi-empirical trial and error process for pattern proximity-correction (PPC) now in widespread use. Details are provided below.

The optimized models disclosed herein may also be useful for solving the reciprocal problem: where one desires a specific target etch profile and wants to discover one or more specific combinations of process parameters (or EPM input parameters) for achieving it. Again, this could be done by experimental trial and error, but an accurate modeling of the etch profile that results from a given set of process parameters (or EPM input parameters) and conditions can replace the need for experimentation, or at least do so in the initial phases of exploring the process/input parameter space, until good candidates may be identified for full experimental study. In some embodiments, it may be possible to, in effect, numerically invert the model—i.e., iteratively locate a set of parameters which generate a given etch profile—in a fully automated fashion. Once again, dimensionality reduction of the etch profile coordinate space (via PCA), and projection of the desired etch profile onto this space, may make this numerical inversion more feasible.

In certain embodiments, an optimized EPM may be integrated with an etcher apparatus or into the infrastructure of a semiconductor fabrication facility which deploys one or more etcher apparatuses. The optimized EPM may be used to determine appropriate adjustments to process parameters to provide a desired etch profile or to understand the effect of a change in process parameters on the etch profile. Thus, for instance, a system for processing semiconductor substrates within a fabrication facility may include an etcher apparatus for etching semiconductor substrates whose operation is adjusted by a set of independent input parameters which are controlled by a controller which implements an optimized EPM. As describe below, a suitable controller for controlling the operation of the etcher apparatus typically includes a processor and a memory, the memory storing the optimized EPM, and the processor using the stored EPM to compute etched feature profiles for a given set of values of a set of input process parameters. After computing a profile, in some embodiments, the controller may (in response to the shape of the computed profile) adjust the operation of the etcher apparatus by varying one or more values of the set of independent input parameters.

Generally, an etcher apparatus which may be used with the disclosed optimized EPMs may be any sort of semiconductor processing apparatus suitable for etching semiconductor substrates by removing material from their surface. In some embodiments, the etcher apparatus may constitute an inductively-coupled plasma (ICP) reactor; in some embodiments, it may constitute a capacitively-coupled plasma (CCP) reactor. Thus, an etcher apparatus for use with these disclosed optimized EPMs may have a processing chamber, a substrate holder for holding a substrate within the processing chamber, and a plasma generator for generating a plasma within the processing chamber. The apparatus may further include one or more valve-controlled process gas inlets for flowing one or more process gases into the processing chamber, one or more gas outlets fluidically connected to one or more vacuum pumps for evacuating gases from the processing chamber, etc. Further details concerning etcher apparatuses (also generally referred to as etch reactors, or plasma etch reactors, etc.) are provided below.

Etch Profile Models and Reflectance Spectra Matching Techniques

The etch profile (EP) model (EPM) techniques disclosed herein may also be performed in the reflectance spectral space, or a reduced dimensional subspace (RDS) derived from the space of spectral reflectances. In other words, the EPM optimization is done by matching calculated reflectance spectra (generated with the EPM) to experimentally measured reflectance spectra, each spectra representing the intensity of electromagnetic radiation reflected from an etched feature on the substrate surface at a series of wavelengths. The set of reflectance spectra used for the optimization (both the spectra generated via EPM and measured experimentally) may also correspond to a sequence of etch time steps (i.e., representing different time snapshots of an etch process or processes). As discussed in detail above, EPMs generally compute a theoretical etch profile as it evolves in time during an etch process, and so by including reflectance spectra from different etch time step in the optimization, the optimized model is statistically valid over the sequence of etch times used in the optimization.

The spectral matching (SM) optimization procedure follows the general EPM optimization framework described above, e.g., in reference to FIG. 3, the difference being that the SM optimization operates in terms of spectral reflectances instead of etch profile coordinates. To do this—because the typical output of an EPM is a computed etch profile represented by a series of etch profile coordinates—one generates computed reflectance spectra by simulating the reflection of electromagnetic radiation (EM) off of said computed etch profile. What is known in the art as "rigorous coupled wave analysis" (RCWA) constitutes one computational process which may be used for this purpose, but any suitable procedure for simulating the interaction of EM radiation with the substrate feature under consideration may be employed.

In any event, with the ability to generate reflectance spectra from an EPM, a general procedure may be implemented for optimizing said EPM in terms of spectral reflectances. This is now described with respect to FIG. 6 which presents a flowchart illustrating a set of operations 301 for tuning and/or optimizing an etch profile model.

As above, and in some embodiments, such a tuned and/or optimized model reduces—and in some cases substantially minimizes—a metric which is related to (indicative of, quantifies, etc.) the combined differences between the etch profiles which are measured as a result of performing the etch experiments, and the corresponding computed etch profiles as generated from the model. In other words, an improved model may reduce the combined error over the different experimental process conditions (as designated by the different sets of specified values of the selected process parameters—which are used to compute independent input parameters to the EPM).

Figure 6:
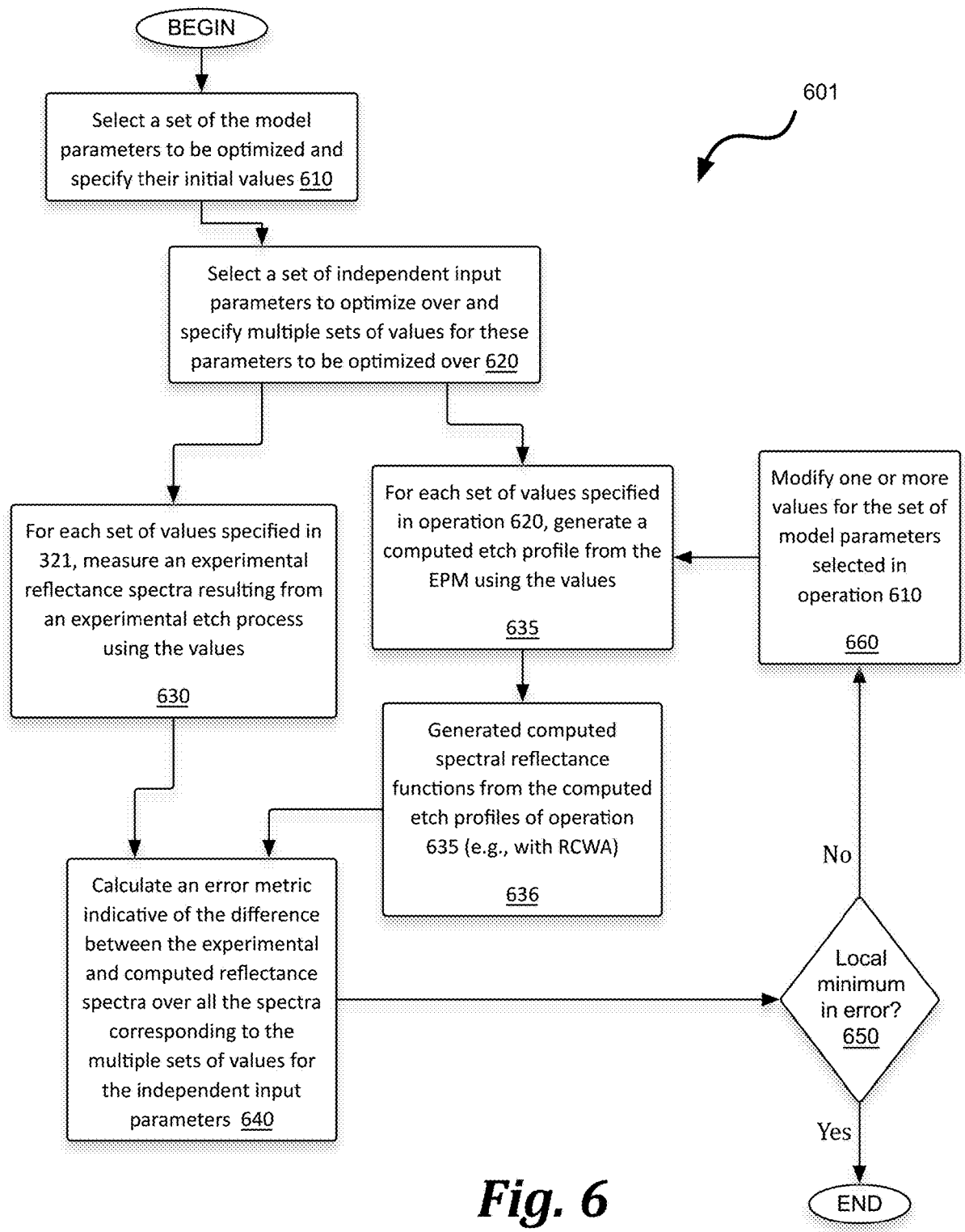
FIG. 6 is a process flow chart representing procedures for optimizing etch profile models with respect to a reflectance spectral space.

As shown in FIG. 6, the reflectance spectra-based optimization procedure 601 begins at operation 610 with the selection of a set of model parameters to be optimized and the specification of their initial values—again, these model parameters may be chosen to be parameters which characterize the underlying chemical and physical processes (reaction probabilities, sticking coefficients, etc.), some or all of these will be adjusted based on the experimental data to improve the model. The initial values may be those found in the literature, they may be calculated based on other simulations, determined from experiment, or known from previous optimization procedures, etc.

The model parameters chosen and initialized in operation 610 are then optimized over a set of independent input parameters, which are selected and given multiple sets of values in operation 620. Such independent input parameters may include, for example, parameters which characterize the plasma in the reaction chamber: temperature, etchant flux, plasma density, etc. For each combination of values of independent input parameters, in operation 630 an etch experiment is performed in order to measure an experimental etch reflectance spectra. (In some embodiments, multiple etch experiments are performed for the same combination of values for the input parameters and the resulting reflectance spectra measurements are averaged together (possibly after discarding outliers, noisy spectra, etc.), for example.) This set of benchmarks is then used for tuning and optimizing the model as follows: In operation 635 a set of computed reflectance spectra are generated—which correspond to the measured spectra from operation 630 and thus are generated for each combination of values of the input parameters—by running the EP model to yield an etch profile, and then converting the computed etch profiles to spectral reflectances as described above (e.g., by using RCWA). At this point, there are corresponding experimental and computed reflectance spectra generated from each set of chosen values for the independent input parameters, and thus suitable for comparison. The comparison is done in operation 640, where an error metric is calculated which is indicative of (related to, quantifies, etc.) the difference between the experimental and computed reflectance spectra over all the different sets of values for the input parameters.

Analogously to what was described above with respect to FIG. 6, this set of computed etch profiles (from which the error metric is calculated) corresponds to a set of previously chosen model parameters as specified in operation 610. A goal of the optimization procedure is to determine more effective choices for these model parameters. Thus, in operation 650 it is determined whether the currently specified model parameters are such that the error metric calculated in operation 640 is locally minimized (in terms of the space of model parameters), and if not, one or more values of the set of model parameters are modified in operation 660, and then used to generate a new set of reflectance spectra—repeating operation 635 as schematically indicated in FIG. 6's flowchart—and thereafter a new error metric is calculated in a repeating of operation 640. The process then proceeds again to operation 650 where it is determined whether this new combination of model parameters represents a local minimum over all the sets of input parameters as assessed by the error metric. If so, the optimization procedure concludes, as indicated in the figure. If not, the model parameters are again modified in operation 660 and the cycle repeats.

If it is desired that the EPM be optimized (in the foregoing manner) for etch processes of different time durations, or be optimized for computing reflectance spectra at sequences of times over the course of an etch process, a consideration is the extent to which the experimental reflectance spectra used to optimize the EPM may be determined accurately from optical measurements over the course of an etch process. A related issues is the rate at which these measurements may be performed over the course of the etch process.

Broadly, measurements of spectral reflectance may be performed in situ or ex situ. Ex situ measurements are generally more accurate due to employment of an external dedicated metrology tool (external to the etch chamber), but such measurements require that the wafer be removed from the etch chamber and thus that the etch process be stopped in order to utilize the tool. Since stopping and re-starting an etch process would lead to all sorts of systematic errors relative to an etch process of continuous duration, accumulating reflectance spectra for a sequence of different etch times ex situ generally involves etching a sequence of different wafers each for a different desired duration and then measuring reflectance form each individually. On the other hand, in situ spectral reflectance measurements may be made continuously (or substantially continuously, or at least quite rapidly) without interrupting the ongoing etch process, and thus a single wafer can be used to generate reflectance spectra corresponding to a sequence of etch times (which also eliminates (or at least reduces) the possibility of wafer-to-wafer variation being interpreted as representing the etch time-dependence of the reflectance spectra). However, wafer-to-wafer variation aside, for a variety of reasons, in situ spectral reflectance measurements tend to be less accurate than when a dedicated external metrology tool is used.

Although a spectral space EPM optimization may be done with respect to ex situ or in situ measured spectral data, for instance, as alternative embodiments, also disclosed herein are techniques for attaining (at least to a certain extent) the advantages of both ex situ and in situ spectral reflectance measurements without their respective drawbacks. In particular, the strategy is to use experimental reflectance spectra for optimizing the EPM which have been generated from rapid in situ spectral reflectance (optical) measurements taken during ongoing etch processes (at the sequence of etch times desired to optimize the EPM) that are calibrated using ex situ measurements taken with a dedicated metrology tool.

This may be done as follows. One or more wafers are etched for a duration covering the desired sequence of etch times, and throughout the ongoing etch processes spectral reflectance optical measurements are taken in situ. The measurement rate may be quite rapid, for example with a frequency of 1 Hz, 2 Hz, 5 Hz, 10, Hz, 15 Hz, 20 Hz, 50 Hz, or even 100 Hz. In some embodiments, optical measurements taken at consecutive etch times over at least a portion of the sequence of etch times are separated by 0.01-1 second (i.e., with a frequency of 100 Hz to 1 Hz), or are separated by 0.05-0.5 second (i.e., with a frequency of 20 Hz to 2 Hz). Separately, a set of wafers are etched for different specified etch durations, and after each etch process is concluded, and the wafers removed from the processing chambers in which they were etched, reflectance spectra are optically measured ex situ with a dedicated external metrology tool. The in situ measurements at the different etch times are then calibrated by comparing them to the ex situ measurements of corresponding duration, and adjusting the in situ reflectance spectra intensities accordingly. These reflectance spectra, generated from in situ optical measurements calibrated with ex situ optical measurements, may then be used in the EPM optimization described with respect to FIG. 3R.

The optimization procedure may also be performed with respect to a reduced-dimensional subspace (RDS)—similar to what was done with respect to the etch profile space, but in this case, a dimensionality reduction of the spectral space—which involves using the RDS to calculate the error metric which is minimized (usually locally, or approximately so) in the optimization. One way of constructing the RDS is by way of PCA whereby, instead of doing the PCA in the space of etch profile coordinates as was described above, the PCA may be done on the full space of spectral reflectances. In so doing, a significant dimensionality reduction of the spectral space may be achieved without significantly compromising the statistical error in the numerical optimization. Here, the PCA may identify important canonical spectral shapes, and it also (as described above) provides an estimate of how many shapes should be included to achieve some level of desired statistical accuracy. In this manner, as when done in the etch profile coordinate space, the number of data points required for fitting in the numerical optimization procedure may be significantly reduced, and convergence of the numerical optimization achieved more rapidly.

Likewise, and similarly to the case of optimization in the etch profile coordinate space, it is also noted that there are different viable strategies for implementing the use of a RDS, e.g., within the optimization procedure presented in FIG. 6, whether the RDS is constructed via PCA, or PLS (as described below), or otherwise. Thus, for instance, in the context of the manner in which the error metric is calculated in operation 640 of FIG. 6, one way to employ a dimensionality reduction procedure is to project the computed and corresponding experimental spectral reflectances, individually, onto the RDS, and then to calculate the difference between the reflectance spectra as projected onto the subspace. Another way is to take the differences between the computed and corresponding experimental reflectance spectra, and then project the differences onto a reduced dimensional subspace representative of the potential differences between experimental and calculated reflectance spectra; the total error metric is then viewed as the combined lengths of these vectors in the difference-subspace (of reflectance spectra).

Rather than perform a PCA, another way to construct the RDS is simply to select a particular set of spectral wavelengths and to consider these (selected wavelengths) as the basis set for the RDS. Doing this, projecting two reflectance spectra onto the RDS and calculating their difference (in the RDS) amounts to calculating the difference in intensity of the reflectance spectra at those particular wavelengths and, for example, summing the differences, which would then make the error metric a number proportional to the root mean square (RMS) error (over those wavelengths). Generalizing this, the error metric may be given as a weighted sum of quantities monotonically related to the magnitude of the differences between corresponding experimental and calculated reflectance spectra at the particular selected wavelengths.

Moreover, if the experimental and computed reflectance spectra to be compared in the optimization procedure correspond to a sequence of different etch times, then an additional criteria defining the RDS may be the selection of these particular etch times. Thus, in such embodiments, the RDS is determined based on a selection of particular spectral wavelengths and the identification of particular etch times at which the wavelengths are considered. Moreover, in certain such embodiments, the different wavelengths and etch times may be weighted differently in the calculation of the error metric. Thus, for example, if the spectral data at certain etch times is more probative than the data at other etch times, then (some of) the former may be weighted more heavily (i.e., particular wavelengths at particular etch times may be set to be larger than (some of) the weights corresponding to the same wavelengths at other etch times). Additionally (or alternatively), different wavelengths of the reflectance spectra may be weighted differently in the analysis, even at the same etch times.

Figure 7A:
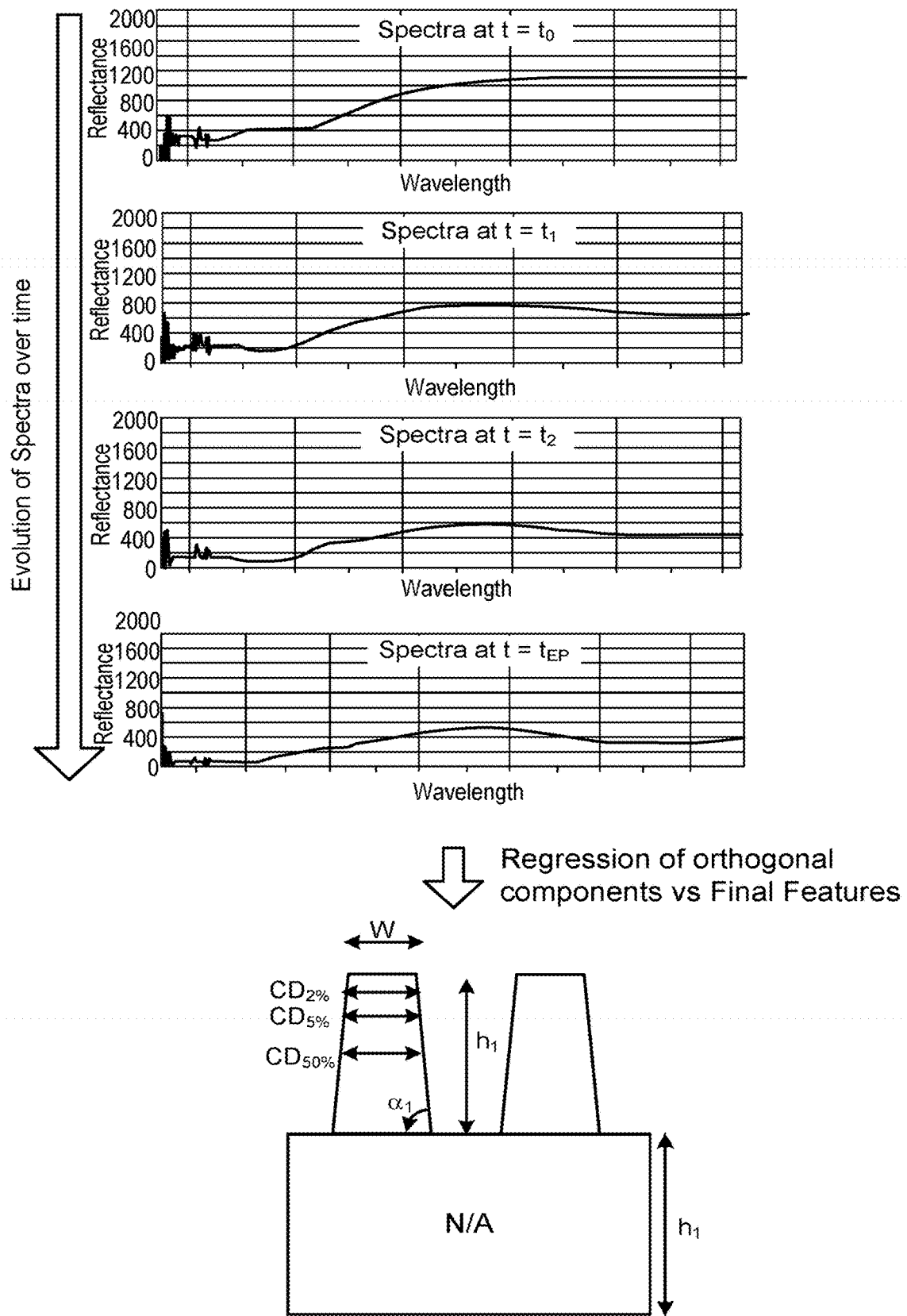
FIG. 7A is an illustration of the reflectance spectral history of an etch profile as it evolves during an etch process.

Another alternative for constructing the RDS is to perform a partial least squares (PLS) analysis. The PLS analysis takes advantage of the principle that the (reflectance) spectral history of an etch profile as it evolves during an etch process is predictive of the etch profile later in the etch process and/or at the conclusion of the etch process. An illustration is provided in FIG. 7A which shows 4 reflectance spectra corresponding to 4 sequential times during at etch process ($t_0$, $t_1$, $t_2$, and $t_{EP}$ ('EP' indicates feature's final etch profile)) as related to a feature (shown at the right in the figure) as the feature is etched downwards. From the figure, it is apparent that the reflectance spectra changes as the feature's profile changes over the course of the etch, and thus a statistical model may be generated via a PLS analysis which relates the geometric coordinates of a feature etch profile at the conclusion of an etch process with various reflectance values of particular wavelengths at particular times earlier in the etch process. The PLS analysis may identify which spectral wavelengths and at which times earlier in the etch processes are most predictive of the final etch profile, and the model may also assess the sensitivity of the final etch profile to these wavelengths and/or times. These spectral wavelengths at the particular times can then be designated as the basis set for the RDS with respect to which the EPM is optimized. Moreover, the PLS analysis's determination of the relative statistical significance of these designated wavelengths at particular times provides a basis for weighting them more heavily in the numerical optimization of the EPM, e.g., by defining the statistical weights in the error metric.

Stating it another way, a PLS analysis of geometric etch profile coordinates versus reflectance spectra from earlier in the etch process may be used to identify the sensitive spectral regions over the course of the etch process from which an effective RDS may be constructed, and the relative statistical weights given to these identified wavelengths at the identified prior etch process times may be used in the calculation of an error metric with respect to which the EPM parameter optimization is performed. It is noted that the use of such an RDS for the EPM optimization will presumably be efficient because it is targeted at statistically significant regions of the spectral space (as a function of etch time).

Figure 7B:
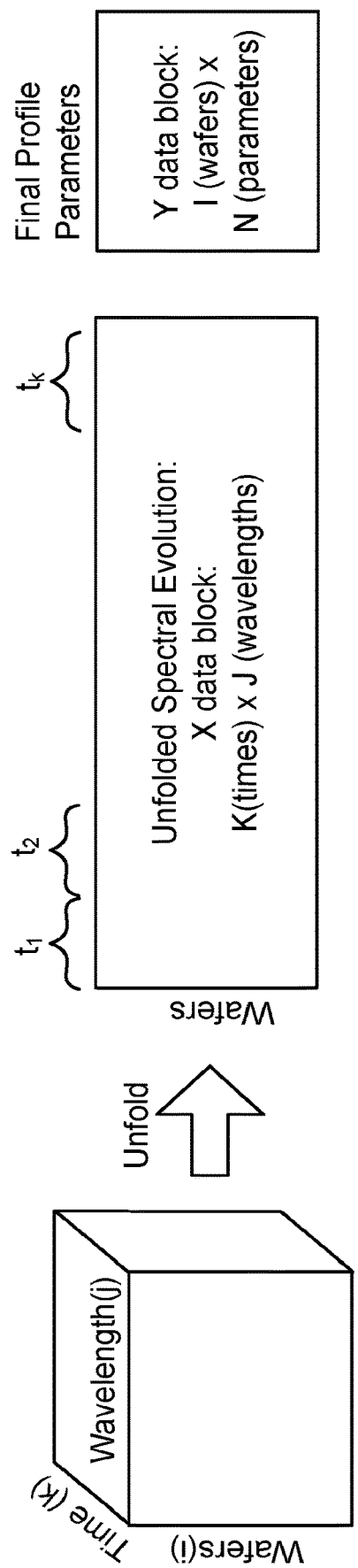
FIG. 7B schematically presents a set of spectral reflectance data collected over many wafers in the form of a 3-D data block (the 3 indices of the data block correspond to wafer number (i), spectral wavelength (j), and etch process time (k)); as well as the 3-D data block's unfolding into a 2-D data block which may serve as the independent data for the PLS spectral history analysis, the dependent data being the etch profile coordinates also indicated in the figure.

The foregoing PLS analysis and resulting PLS model (which provides a strategy for differentially weighting particular spectral wavelengths, etch times, etc.) will be more statistically robust if it is constructed from etch process data (sets of reflectance spectra and corresponding etch profile coordinates for different etch times) which are collected over many different wafers subject to a range of etch process conditions (which may roughly correspond to the range of process conditions over which the model parameters of the EPM are to be optimized (using the RDS)). FIG. 7B schematically presents such a set of reflectance spectral data collected over many wafers in the form of a 3-D data block where the 3 indices of the data block correspond to wafer number (i), spectral wavelength (j), and etch process time (k). This 3-D data block may be "unfolded," as indicated in the figure, into a 2-D "X" data block of size K times J, with K being the number of time points and J being the number of wavelengths. (The stride of the concatenated data vector is the number of wavelengths J.) These are the independent variables which go into the PLS analysis. The dependent variables for the PLS analysis are in the 2-D "Y" data block, as shown in the figure, which contains the final N geometric etch profile coordinates for each of the 1 number of wafers, as indicated in the figure. From this over-complete set of training data, the PLS analysis builds a regression model to predict the dependency of the final etch profile coordinates on the reflectance spectra data at intermediate times during the etch process.

Note that while such etch profile and spectral reflectance data (to be used as a training set for the PLS model) may be measured experimentally by performing etch processes on a series different wafers (and measuring reflectance), such experimentation may be costly and time consuming. However, if one already possesses an EPM of sufficient accuracy—such as one optimized by the procedure described above—a more efficient procedure may be to generate etch data sets using said EPM and to use them for constructing/training the PLS model. In principle, a combination of both experimental and computer generated etch profile and spectral reflectance data could also be used.

In any event, the use of computer generated reflectance spectra for building a PLS model suggests an iterative procedure whereby one uses a (potentially) un-optimized EPM to generate a training set of reflectance spectra for the PLS analysis, and the resulting PLS model may then be used to identify a RDS (with statistical weights) for returning to the initial EPM and optimizing it. The new optimized EPM may then, in turn, be used to generate new sets of etch data to construct a new (and better) PLS model, which identifies a new RDS for use in further optimizing the EPM, and so forth. The procedure may be continued in this manner (back and forth between EPM optimization and PLS optimization) for some predetermined number of iterations, or until significant improvement in the PLS and/or EP models is no longer found with subsequent iterations. A variation is to begin with an EPM optimized by any of the optimization techniques described above (e.g., not involving the PLS procedure) and go from there. Another variation is to use a few experimentally measured etch process data sets to construct the initial PLS model independent of the EPM, and then proceed to identify the RDS for optimizing the initial EPM. Other variations on these general themes, and combinations thereof, will be apparent to those of skill in the art in view of the foregoing discussion.

Figure 8:
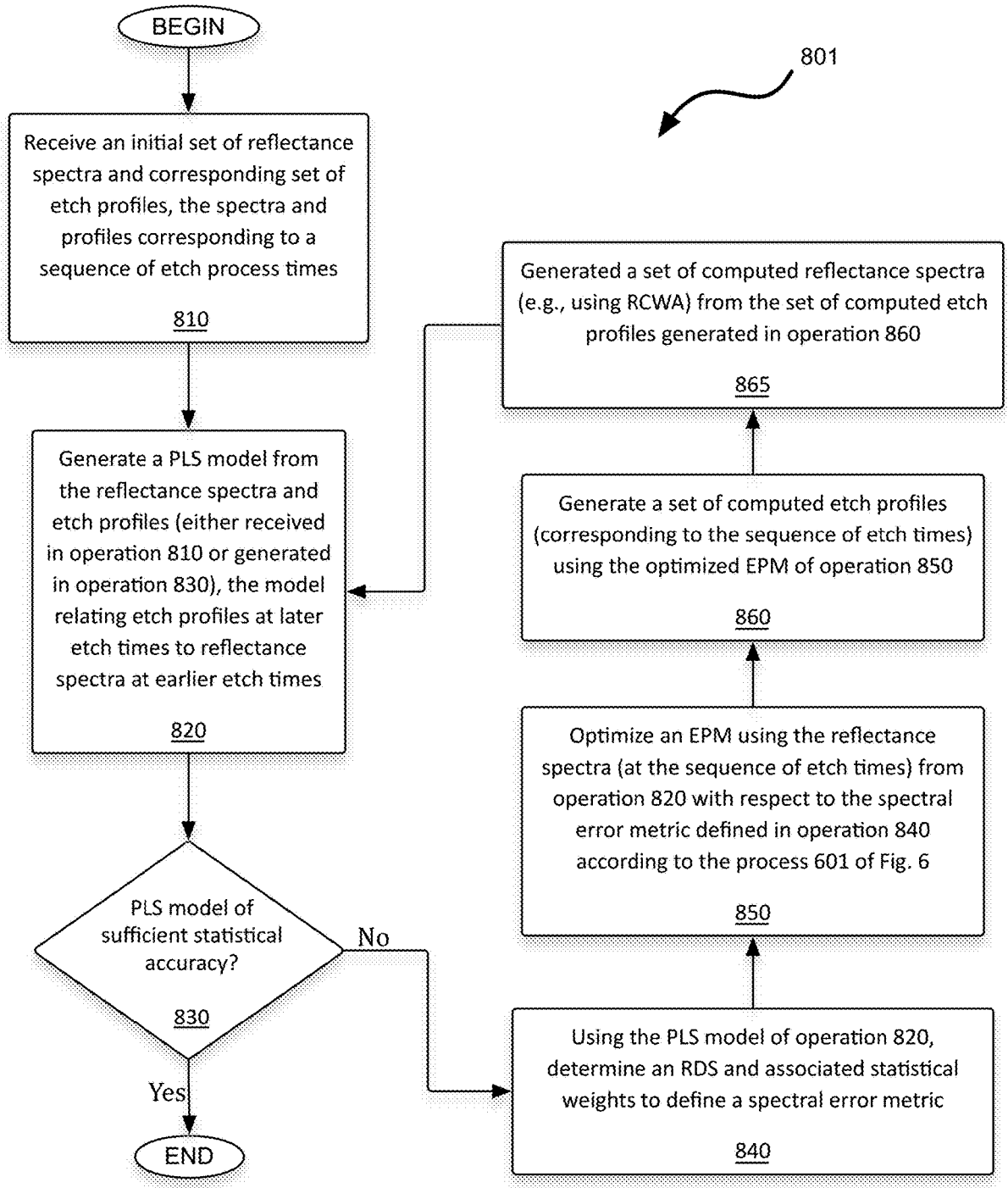
FIG. 8 is a process flow chart illustrating an iterative procedure for optimizing a PLS model relating etch spectral reflectance history to etch profiles over the course of an etch process while concurrently optimizing a EPM, which is used in the generation of computed reflectance spectra to be employed in the optimization of the PLS model.

This foregoing iterative approach is schematically illustrated in FIG. 8. As shown in FIG. 8, a process 801 of generating an optimized PLS model begins with an operation 810 of receiving an initial set of reflectance spectra and corresponding set of etch profiles, both of which correspond to a sequence of etch process time durations. The sequence of etch times could represent different times over the course of an etch process, or the sequence of etch times could represent etch processes of different total etch time durations (in other words, etch processes performed to completion but for different total etch times on different substrates). In any event, this initial training set of reflectance spectra (corresponding to the sequence of etch times) could have been measured experimentally, generated with an un-optimized EPM, or generated using an EPM optimized by another procedure such as those described above (e.g., one not involving PLS). After receiving the training set, a PLS analysis is performed in operation 820 to generate an initial PLS model. The PLS model relates the coordinates of the etch profiles (received in operation 810) to the reflectance spectra (also received in operation 810). In particular embodiments, the PLS analysis generates a regression model which expresses the dependency of the etch profile coordinates at later etch times or even at the conclusion of the etch process on certain wavelengths of the reflectance spectra at particular times earlier in the etch process, as described above, as well as the statistical sensitivity of this dependence.

This initial PLS model may be accurate enough for some purposes, and if this is determined to be the case in operation 830, the optimization process concludes. However, if in operation 830 the PLS model is deemed to not be of sufficient accuracy, the process 801 continues to operation 840 where the current PLS model (as constructed in operation 820) is used to determine a (statistically significant) reduced dimensional subspace (RDS) along with statistical weights for defining an effective error metric (as described above). The new statistically-weighted spectral error metric is then used in operation 850 to optimize an EPM model according (for example) to the EPM optimization procedure described with respect to FIG. 6. Such a statistically-weighted error metric may be used (in the optimization, e.g., of FIG. 6) to act as an effectively gauge of the difference between EPM computed and corresponding measured reflectance spectra in a spectral subspace (of the full spectral space) deemed to be statistically significant by the PLS procedure.

This EPM optimization procedure may use the same spectral data as used in operation 820, or it may use different spectral data (but, again, it is optimized utilizing the new spectral error metric defined in operation 840). In any event, once the EPM is optimized (in operation 850) it may be used to generate a new (and perhaps very extensive) set of computed reflectance spectra. This is done by generating a set of computed etch profiles in in operation 860 and then in operation 865 using these computed etch profiles to generate a set of computed reflectance spectra (for example, by using RCWA as described above and indicated in the figure). These spectra may then be fed—as the spectral training set—back into operation 820 where a new PLS model is generated based on this new (perhaps quite extensive) training set. The statistical accuracy of the new PLS model is assessed in operation 830; and the cycle of operations (840, 850, 860, 865, 820, and 830) may be continued in repetition until, in one of the repetitions of operation 830, the PLS model is deemed to be of sufficient statistical accuracy.

It is noted that while this kind of PLS model is useful for optimizing an EPM model (via the identification of a "good" RDS) it is also independently useful for etch endpoint detection procedures, such as those described in a co-pending U.S. patent application Ser. No. 15/059,073, (hereby incorporated by reference in its entirety for all purposes). For instance, as described above, the PLS model may be viewed as a statistical determination of which spectral regions over the course of an etch process are more/most predictive of the final etch profile resulting from the etch process. As such, the construction of the PLS model is effectively a sensitivity analysis which identifies which spectral regions may be monitored over the course of an etch process to determine when the feature profile has been etched sufficiently (i.e., for endpoint detection). It is therefore also noted that the optimization of the EPM model through the statistical weighting of the optimization in favor of those spectral regions (as a function of etch time) which are important in the PLS model, in addition to potentially leading to a more efficient EPM optimization, has the benefit of enhancing the statistical accuracy of the PLS sensitivity analysis because the PLS model is thereby being constructed from etch profile data sets produced by an EPM model whose optimization was statistically weighted in favor of the same regions of the spectral space (over the etch process) which are deemed in important by the PLS analysis.

System Embodiment Examples

Capacitively Coupled Plasma (CCP) Reactors for Use in Etch Operations

Capacitively coupled plasma (CCP) reactors are described in U.S. Pat. No. 8,552,334, filed Feb. 9, 2009 as U.S. patent application Ser. No. 12/367,754, and titled "ADJUSTABLE GAP CAPACITIVELY COUPLED RF PLASMA REACTOR INCLUDING LATERAL BELLOWS AND NON-CONTACT PARTICLE SEAL," and in U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," each of which is hereby incorporated by reference in its entirety for all purposes.

Figure 9A:
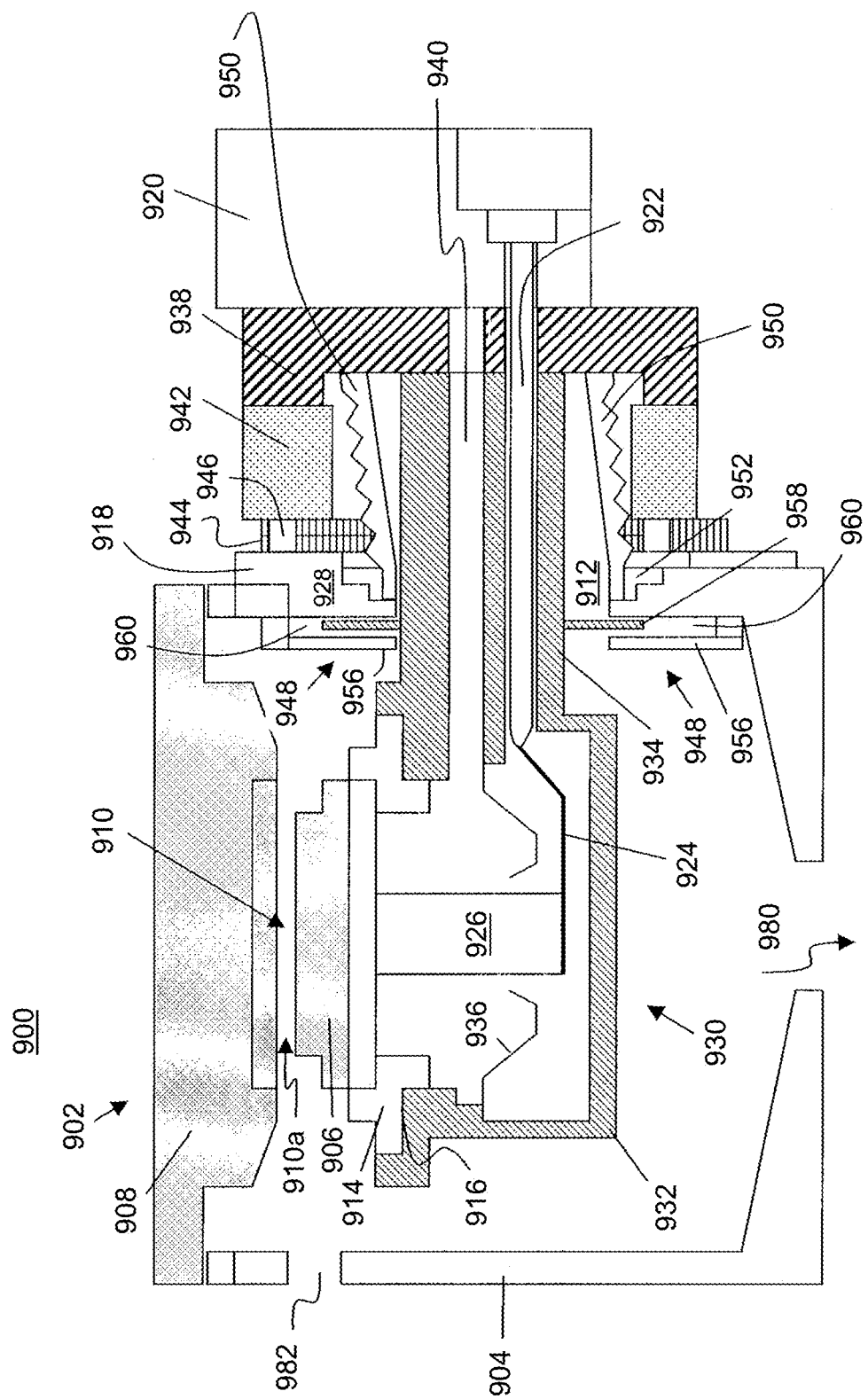
FIGS. 9A-9C illustrate an embodiment of an adjustable-gap capacitively-coupled (CCP) plasma reactor.
Figure 9B:
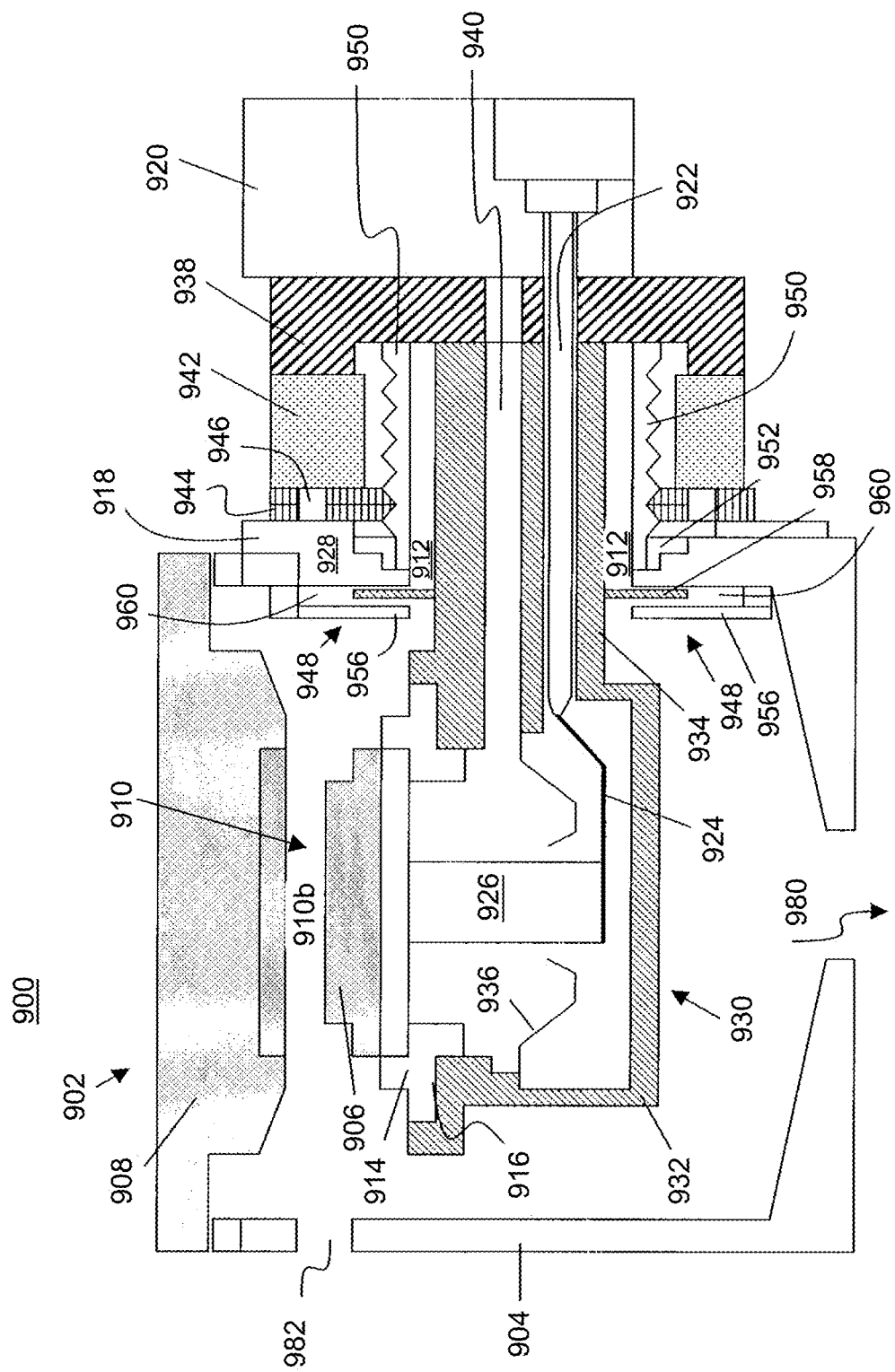
Figure 9C:
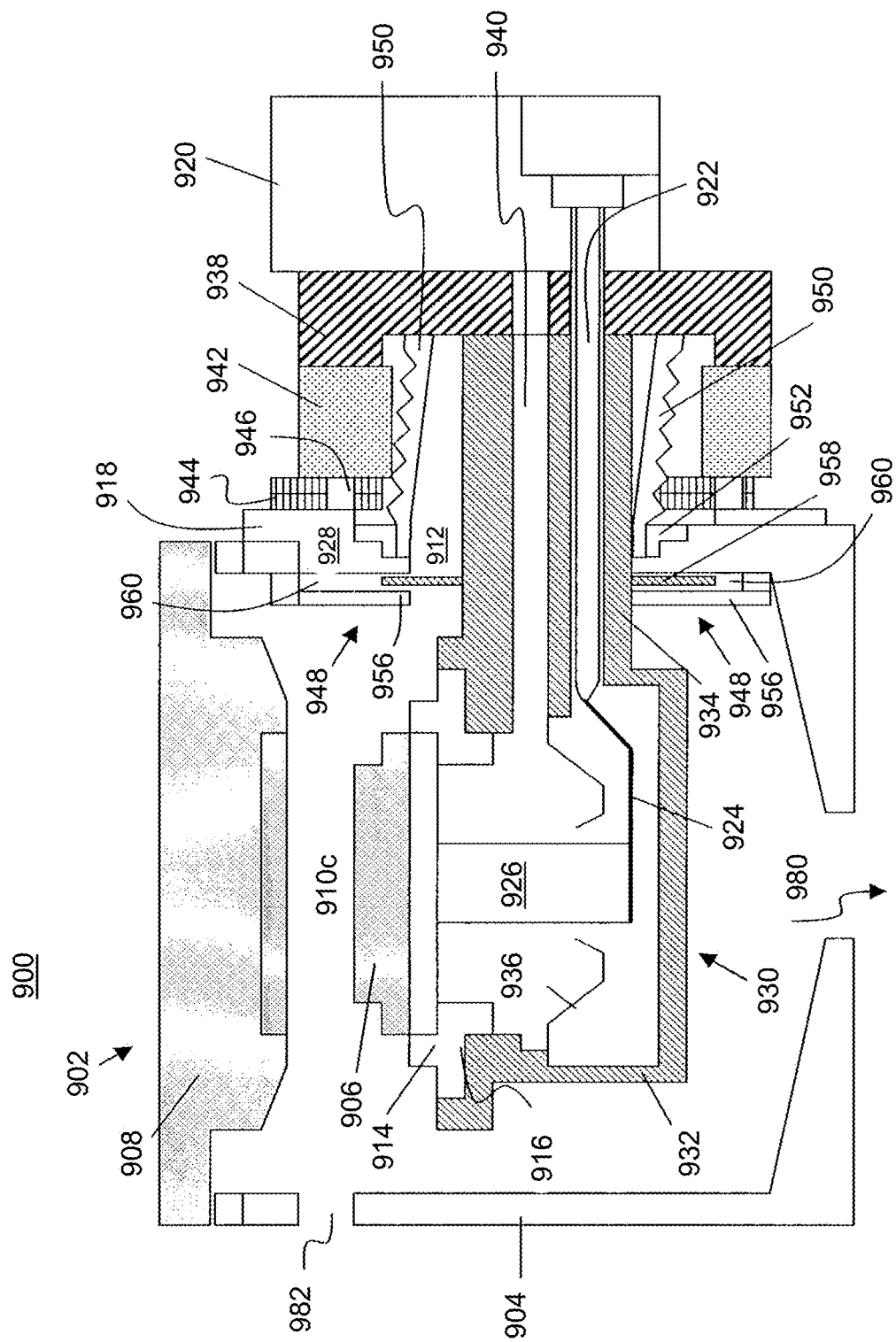

For instance, FIGS. 9A-9C illustrate an embodiment of an adjustable gap capacitively coupled confined RF plasma reactor 900. As depicted, a vacuum processing chamber 902 includes a chamber housing 904, surrounding an interior space housing a lower electrode 906. In an upper portion of the chamber 902 an upper electrode 908 is vertically spaced apart from the lower electrode 906. Planar surfaces of the upper and lower electrodes 908, 906 (configured to be used for plasma generation) are substantially parallel and orthogonal to the vertical direction between the electrodes. Preferably the upper and lower electrodes 908, 906 are circular and coaxial with respect to a vertical axis. A lower surface of the upper electrode 908 faces an upper surface of the lower electrode 906. The spaced apart facing electrode surfaces define an adjustable gap 910 there between. During plasma generation, the lower electrode 906 is supplied RF power by an RF power supply (match) 920. RF power is supplied to the lower electrode 906 though an RF supply conduit 922, an RF strap 924 and an RF power member 926. A grounding shield 936 may surround the RF power member 926 to provide a more uniform RF field to the lower electrode 906. As described in U.S. Pat. Pub. No. 2008/0171444 (which is hereby incorporated by reference in its entirety for all purposes), a wafer is inserted through wafer port 982 and supported in the gap 910 on the lower electrode 906 for processing, a process gas is supplied to the gap 910 and excited into plasma state by the RF power. The upper electrode 908 can be powered or grounded.

In the embodiment shown in FIGS. 9A-9C, the lower electrode 906 is supported on a lower electrode support plate 916. An insulator ring 914 interposed between the lower electrode 906 and the lower electrode support plate 916 insulates the lower electrode 906 from the support plate 916. An RF bias housing 930 supports the lower electrode 906 on an RF bias housing bowl 932. The bowl 932 is connected through an opening in a chamber wall plate 918 to a conduit support plate 938 by an arm 934 of the RF bias housing 930. In a preferred embodiment, the RF bias housing bowl 932 and RF bias housing arm 934 are integrally formed as one component, however, the arm 934 and bowl 932 can also be two separate components bolted or joined together.

The RF bias housing arm 934 includes one or more hollow passages for passing RF power and facilities, such as gas coolant, liquid coolant, RF energy, cables for lift pin control, electrical monitoring and actuating signals from outside the vacuum chamber 902 to inside the vacuum chamber 902 at a space on the backside of the lower electrode 906. The RF supply conduit 922 is insulated from the RF bias housing arm 934, the RF bias housing arm 934 providing a return path for RF power to the RF power supply 920. A facilities conduit 940 provides a passageway for facility components. Further details of the facility components are described in U.S. Pat. No. 5,948,704 and U.S. Pat. Pub. No. 2008/0171444 (both of which are hereby incorporated by reference in their entirety for all purposes) and are not shown here for simplicity of description. The gap 910 is preferably surrounded by a confinement ring assembly (not shown), details of which can be found in U.S. Pat. Pub. No. 2007/0284045 (which is hereby incorporated by reference in its entirety for all purposes).

The conduit support plate 938 is attached to an actuation mechanism 942. Details of an actuation mechanism are described in U.S. Pat. Pub. No. 2008/0171444 (which is hereby incorporated by reference in its entirety for all purposes). The actuation mechanism 942, such as a servo mechanical motor, stepper motor or the like is attached to a vertical linear bearing 944, for example, by a screw gear 946 such as a ball screw and motor for rotating the ball screw. During operation to adjust the size of the gap 910, the actuation mechanism 942 travels along the vertical linear bearing 944. FIG. 9A illustrates the arrangement when the actuation mechanism 942 is at a high position on the linear bearing 944 resulting in a small gap 910a. FIG. 9B illustrates the arrangement when the actuation mechanism 942 is at a mid-position on the linear bearing 944. As shown, the lower electrode 906, the RF bias housing 930, the conduit support plate 938, the RF power supply 920 have all moved lower with respect to the chamber housing 904 and the upper electrode 908, resulting in a medium size gap 910b.

FIG. 9C illustrates a large gap 910c when the actuation mechanism 942 is at a low position on the linear bearing. Preferably, the upper and lower electrodes 908, 906 remain co-axial during the gap adjustment and the facing surfaces of the upper and lower electrodes across the gap remain parallel.

This embodiment allows the gap 910 between the lower and upper electrodes 906, 908 in the CCP chamber 902 during multi-step etch processes to be adjusted, for example, in order to maintain uniform etch across a large diameter substrate such as 300 mm wafers or flat panel displays. In particular, this embodiment pertains to a mechanical arrangement to facilitate the linear motion necessary to provide the adjustable gap between lower and upper electrodes 906, 908.

FIG. 9A illustrates laterally deflected bellows 950 sealed at a proximate end to the conduit support plate 938 and at a distal end to a stepped flange 928 of chamber wall plate 918. The inner diameter of the stepped flange defines an opening 912 in the chamber wall plate 918 through which the RF bias housing arm 934 passes. The laterally deflected bellows 950 provides a vacuum seal while allowing vertical movement of the RF bias housing 930, conduit support plate 938 and actuation mechanism 942. The RF bias housing 930, conduit support plate 938 and actuation mechanism 942 can be referred to as a cantilever assembly. Preferably, the RF power supply 920 moves with the cantilever assembly and can be attached to the conduit support plate 938. FIG. 9B shows the bellows 950 in a neutral position when the cantilever assembly is at a mid-position. FIG. 9C shows the bellows 950 laterally deflected when the cantilever assembly is at a low position.

A labyrinth seal 948 provides a particle barrier between the bellows 950 and the interior of the plasma processing chamber housing 904. A fixed shield 956 is immovably attached to the inside inner wall of the chamber housing 904 at the chamber wall plate 918 so as to provide a labyrinth groove 960 (slot) in which a movable shield plate 958 moves vertically to accommodate vertical movement of the cantilever assembly. The outer portion of the movable shield plate 958 remains in the slot at all vertical positions of the lower electrode 906.

In the embodiment shown, the labyrinth seal 948 includes a fixed shield 956 attached to an inner surface of the chamber wall plate 918 at a periphery of the opening 912 in the chamber wall plate 918 defining a labyrinth groove 960. The movable shield plate 958 is attached and extends radially from the RF bias housing arm 934 where the arm 934 passes through the opening 912 in the chamber wall plate 918. The movable shield plate 958 extends into the labyrinth groove 960 while spaced apart from the fixed shield 956 by a first gap and spaced apart from the interior surface of the chamber wall plate 918 by a second gap allowing the cantilevered assembly to move vertically. The labyrinth seal 948 blocks migration of particles spalled from the bellows 950 from entering the vacuum chamber interior and blocks radicals from process gas plasma from migrating to the bellows 950 where the radicals can form deposits which are subsequently spalled.

FIG. 9A shows the movable shield plate 958 at a higher position in the labyrinth groove 960 above the RF bias housing arm 934 when the cantilevered assembly is in a high position (small gap 910a). FIG. 9C shows the movable shield plate 958 at a lower position in the labyrinth groove 960 above the RF bias housing arm 934 when the cantilevered assembly is in a low position (large gap 910c). FIG. 9B shows the movable shield plate 958 in a neutral or mid position within the labyrinth groove 960 when the cantilevered assembly is in a mid position (medium gap 910*b*). While the labyrinth seal 948 is shown as symmetrical about the RF bias housing arm 934, in other embodiments the labyrinth seal 948 may be asymmetrical about the RF bias arm 934.

Inductively Coupled Plasma Reactors for Use in Etch Operations

Inductively coupled plasma (ICP) reactors are described in US Pat. Pub. No. 2014/0170853, filed Dec. 10, 2013, and titled "IMAGE REVERSAL WITH AHM GAP FILL FOR MULTIPLE PATTERNING," and in U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," each of which is hereby incorporated by reference in its entirety for all purposes.

Figure 10:
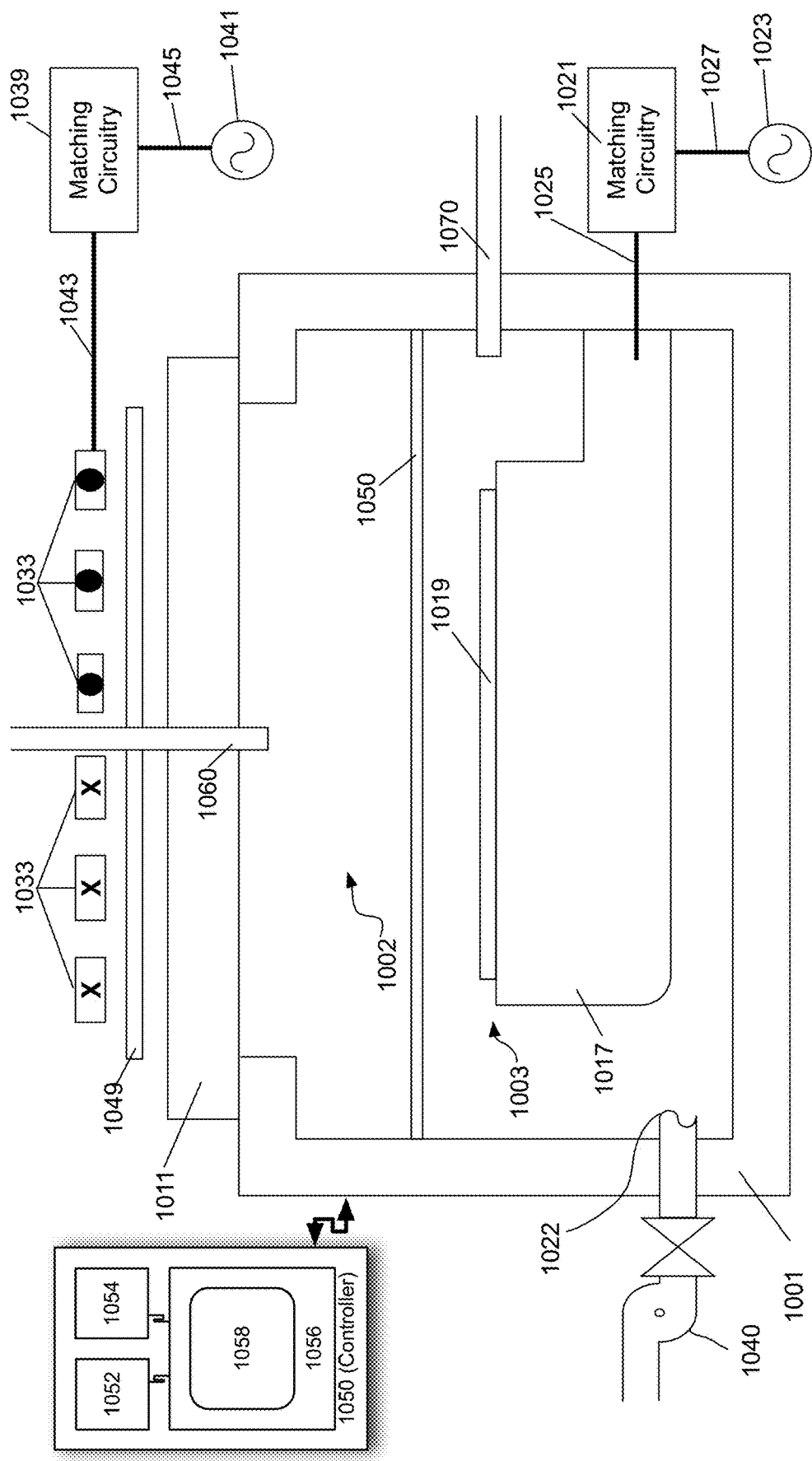
FIG. 10 illustrates an embodiment of an inductively-coupled plasma (ICP) reactor.

For instance, FIG. 10 schematically shows a cross-sectional view of an inductively coupled plasma etching apparatus 1000 appropriate for implementing certain embodiments herein, an example of which is a Kiyo TM reactor, produced by Lam Research Corp. of Fremont, Calif. The inductively coupled plasma etching apparatus 1000 includes an overall etching chamber structurally defined by chamber walls 1001 and a window 1011. The chamber walls 1001 may be fabricated from stainless steel or aluminum. The window 1011 may be fabricated from quartz or other dielectric material. An optional internal plasma grid 1050 divides the overall etching chamber into an upper sub-chamber 1002 and a lower sub-chamber 1003. In most embodiments, plasma grid 1050 may be removed, thereby utilizing a chamber space made of sub-chambers 1002 and 1003. A chuck 1017 is positioned within the lower sub-chamber 1003 near the bottom inner surface. The chuck 1017 is configured to receive and hold a semiconductor wafer 1019 upon which the etching process is performed. The chuck 1017 can be an electrostatic chuck for supporting the wafer 1019 when present. In some embodiments, an edge ring (not shown) surrounds chuck 1017, and has an upper surface that is approximately planar with a top surface of a wafer 1019, when present over chuck 1017. The chuck 1017 also includes electrostatic electrodes for chucking and dechucking the wafer. A filter and DC clamp power supply (not shown) may be provided for this purpose. Other control systems for lifting the wafer 1019 off the chuck 1017 can also be provided. The chuck 1017 can be electrically charged using an RF power supply 1023. The RF power supply 1023 is connected to matching circuitry 1021 through a connection 1027. The matching circuitry 1021 is connected to the chuck 1017 through a connection 1025. In this manner, the RF power supply 1023 is connected to the chuck 1017.

Elements for plasma generation include a coil 1033 is positioned above window 1011. The coil 1033 is fabricated from an electrically conductive material and includes at least one complete turn. The example of a coil 1033 shown in FIG. 10 includes three turns. The cross-sections of coil 1033 are shown with symbols, and coils having an "X" extend rotationally into the page, while coils having a "•" extend rotationally out of the page. Elements for plasma generation also include an RF power supply 1041 configured to supply RF power to the coil 1033. In general, the RF power supply 1041 is connected to matching circuitry 1039 through a connection 1045. The matching circuitry 1039 is connected to the coil 1033 through a connection 1043. In this manner, the RF power supply 1041 is connected to the coil 1033. An optional Faraday shield 1049 is positioned between the coil 1033 and the window 1011. The Faraday shield 1049 is maintained in a spaced apart relationship relative to the coil 1033. The Faraday shield 1049 is disposed immediately above the window 1011. The coil 1033, the Faraday shield 1049, and the window 1011 are each configured to be substantially parallel to one another. The Faraday shield may prevent metal or other species from depositing on the dielectric window of the plasma chamber.

Process gases (e.g. helium, neon, etchant, etc.) may be flowed into the processing chamber through one or more main gas flow inlets 1060 positioned in the upper chamber and/or through one or more side gas flow inlets 1070. Likewise, though not explicitly shown, similar gas flow inlets may be used to supply process gases to the capacitively coupled plasma processing chamber shown in FIGS. 6A-6C. A vacuum pump, e.g., a one or two stage mechanical dry pump and/or turbomolecular pump 1040, may be used to draw process gases out of the process chamber 1024 and to maintain a pressure within the process chamber 1000. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber in FIGS. 6A-6C may also be employed.

During operation of the apparatus, one or more process gases may be supplied through the gas flow inlets 1060 and/or 1070. In certain embodiments, process gas may be supplied only through the main gas flow inlet 1060, or only through the side gas flow inlet 1070. In some cases, the gas flow inlets shown in the figure may be replaced more complex gas flow inlets, one or more showerheads, for example. The Faraday shield 1049 and/or optional grid 1050 may include internal channels and holes that allow delivery of process gases to the chamber. Either or both of Faraday shield 1049 and optional grid 1050 may serve as a showerhead for delivery of process gases.

Radio frequency power is supplied from the RF power supply 1041 to the coil 1033 to cause an RF current to flow through the coil 1033. The RF current flowing through the coil 1033 generates an electromagnetic field about the coil 1033. The electromagnetic field generates an inductive current within the upper sub-chamber 1002. The physical and chemical interactions of various generated ions and radicals with the wafer 1019 selectively etch features of the wafer.

If the plasma grid is used such that there is both an upper sub-chamber 1002 and a lower sub-chamber 1003, the inductive current acts on the gas present in the upper sub-chamber 1002 to generate an electron-ion plasma in the upper sub-chamber 1002. The optional internal plasma grid 1050 limits the amount of hot electrons in the lower sub-chamber 1003. In some embodiments, the apparatus is designed and operated such that the plasma present in the lower sub-chamber 1003 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 1003 through port 1022.

The chuck 1017 disclosed herein may operate at elevated temperatures ranging between about 10° C. and about 250° C. The temperature will depend on the etching process operation and specific recipe. In some embodiments, the chamber 1001 may also operate at pressures in the range of between about 1 mTorr and about 95 mTorr. In certain embodiments, the pressure may be higher as disclosed above.

Chamber 1001 may be coupled to facilities (not shown) when installed in a clean room or a fabrication facility. Facilities include plumbing that provide processing gases, vacuum, temperature control, and environmental particle control. These facilities are coupled to chamber 1001, when installed in the target fabrication facility. Additionally, chamber 1001 may be coupled to a transfer chamber that allows robotics to transfer semiconductor wafers into and out of chamber 1001 using typical automation.

Also shown in FIG. 10 is system controller 1050. As described further below, such a system controller 1050 may control some or all of the operations of an etcher apparatus, including adjustment of the etcher's operation in response to the generation of a computed etch profile using an optimized EMP as described herein.

Predictive Pattern Proximity-Correction of Mask Design Layouts

Figure 11A:
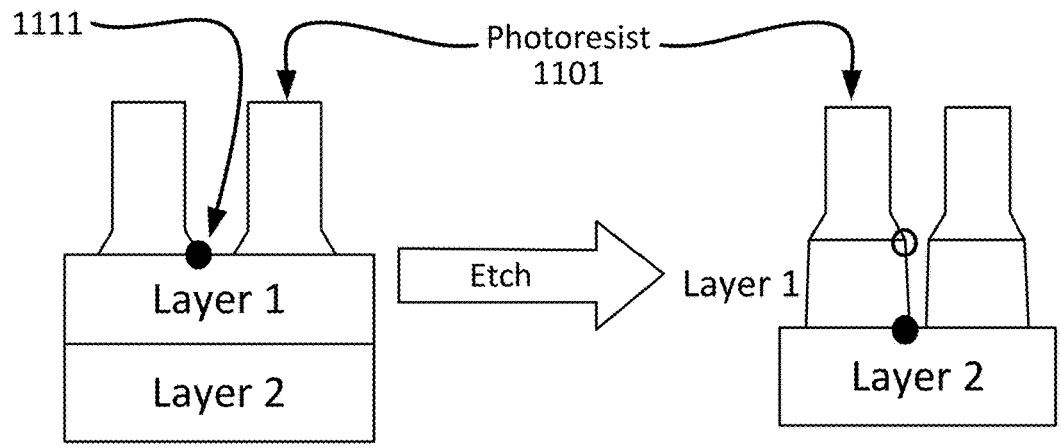
FIG. 11A shows a cross-sectional view of a 2-layer stack of material on a semiconductor substrate before and after a feature is etched into it, as defined by a layer of photoresist.
Figure 11B:
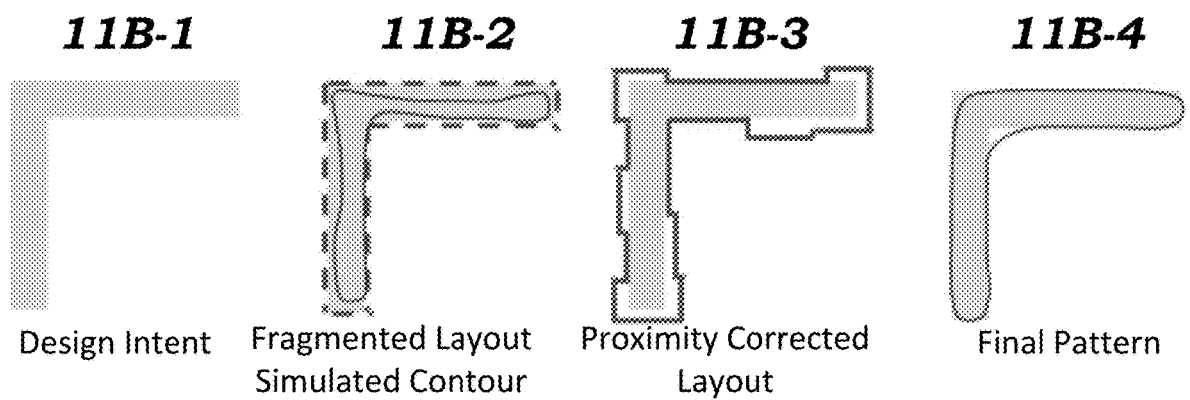
FIG. 11B shows a top-view of a trench feature having a 90 degree turn.

Extension of photolithography to the 20 nm node and beyond drives advanced resolution enhancement techniques that continue to impose even tighter tolerance requirements on photolithography and etch as well as mask design and manufacturing. Presence of residual errors in photomasks and the limitations involved in capturing those in process models have helped drive correction of mask manufacturing effects. However, in the plasma-based etch process itself—after transfer of patterned photoresist through photolithography—long-range non-uniformities, such as pattern loading of plasma flux, and short-range defects such as "proximity defects" in the etching of the pattern defined by the photoresist, contribute to the observed defect signatures in the overall patterned etch process. A simple example is illustrated in FIG. 11A which shows a cross-sectional view of a 2-layer stack of material on a semiconductor substrate before and after a feature is etched into it, as defined by a layer of photoresist 1101 (atop the 2-layer stack). The figure illustrates that even in a relatively idealized etch process a "foot" 1111 at the base of the transferred pattern of photoresist 1101 (as projected by the mask (not shown)) may affect the width of the etched feature, and even aside from this, the figure shows that the sidewalls of the feature after being etched may have a slight taper to them, rather than being perfectly vertical. FIG. 11B shows a top-view of a prototypical feature—a trench having a 90 degree turn in it—and illustrates that the intended design of such a feature (FIG. 11B-1) may be altered due to such proximity effects as shown in the fragmented layout (FIG. 11B-2). Such short-range proximity defects in the patterned etch process may act to increase intra-die critical dimension (CD) variability and contribute to degradation of integrated circuit (IC) performance and yield.

In the current state-of-the-art method for generating a photomask for a patterned etch process, remediation of pattern proximity defects (i.e., "pattern proximity correction") is addressed by either an empirical rules-based correction strategy or an empirical model-based correction strategy. The rules-based procedure typically employs a reference mask which—when transferred via photolithography to form a reference photoresist pattern layout on a test substrate and then etched—provides a standard set of offsets/corrections for a given pitch/CD associated with a standard set of line/space features in the reference layout. Such a rules-based approach has limited accuracy when it comes to handling generalized photoresist layouts.

The model-based approach utilizes what is commonly referred to as a variable etch bias model (VEB). Other similar heuristic models include what are known as compact litho-etch bias models (on the etch side) and compact resist models (on the lithography side). While the approach itself is termed "model-based," this refers only to a statistically-based least-squares fit "model" (as now briefly described); it does not refer to a physics-based (i.e. chemical surface kinetics based) computational model of the etch process (such as the optimized etch profile models (EPM) described above which calculate the approximate evolution of a feature's etch profile over time during the etch process).

In the standard empirical VEB approach, experimental CD information is collected from a host of pre-printed mask test calibration patterns for a given set of process conditions. Notably, to do this, these calibration masks must be built, the associated calibration patterns of photoresist transferred (via a photolithography process using the built mask) to actual wafer substrates, and then these (test) patterned wafers must actually be etched under the given process conditions.

Figure 12:
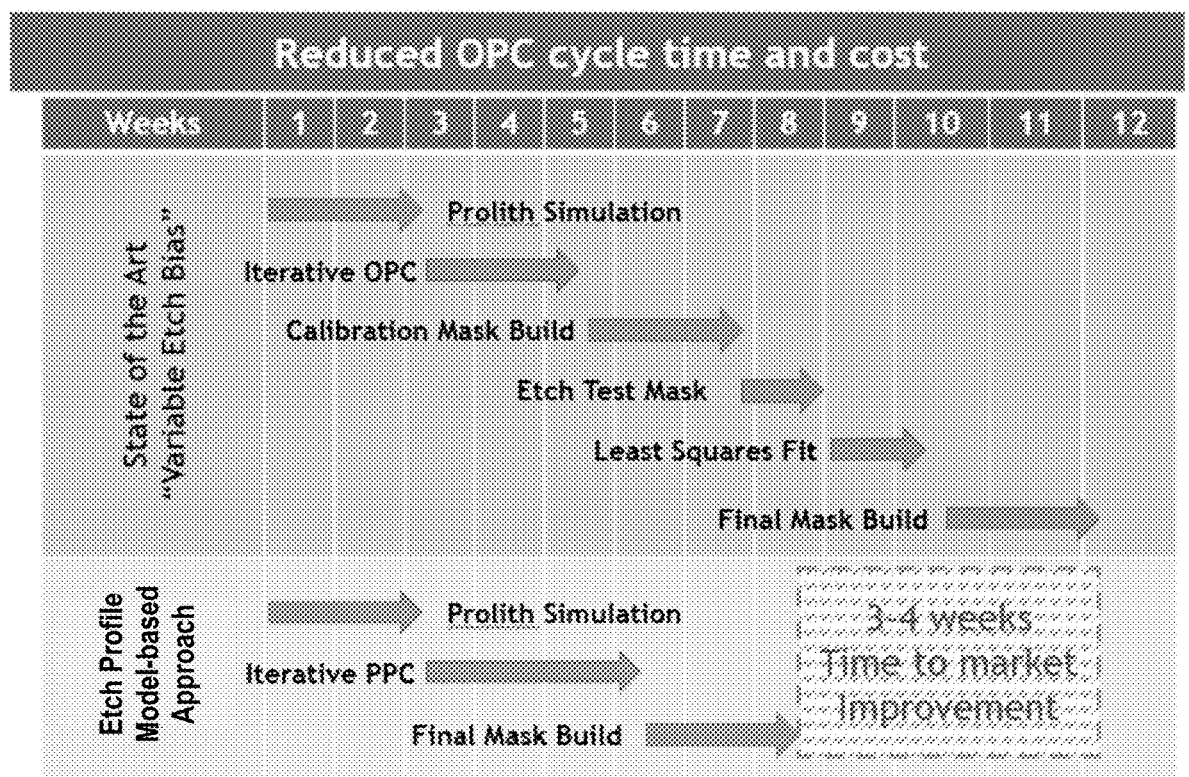
FIG. 12 shows the various phases of the standard empirical VEB approach to pattern proximity correction (PPC) and illustrates a timeline (in units of weeks) for completion of the various phases, as well as for completion of the entire VEB-based mask build process.

This, along with other steps, makes the entire VEB model-based approach quite time-consuming. The top portion of FIG. 12 shows the various phases of the standard empirical VEB approach and illustrates a timeline (in units of weeks) for completion of the various phases, as well as for completion of the entire VEB-based mask build process. As illustrated in the figure, the calibration mask build step of this process—i.e., the first of the steps just referred to—is typically preceded by a standard photolithography ("Prolith") simulation (Prolith is an industry-standard software package available from KLA-Tencor Corporation of Milpitas, Calif.); and followed by an iterative optical proximity correction (OPC) step. In essence, these first two steps constitute a procedure for determining the mask which corresponds to a given photoresist pattern layout (which would be generated from an exposure to optical radiation projected through the mask design). At this stage, the desired pattern of photoresist is a calibration pattern, and thus the "calibration mask" is determined through this procedure and then a "build" is performed (as the third step, as indicated in the figure).

Following the "Calibration Mask Build" (as indicated in the figure), a photoresist pattern is transferred to a test substrate according to the mask and the substrate is etched. CD information is then extracted from test structures and a least-squares fit of the data is performed (as indicated in the figure) which correlates CD bias with edge movements of the test structures. From this least-square fit model, edge corrections are applied to the test mask build to recalibrate it and the mask build procedure is repeated. This mask-build/etch/least-squares-fit cycle is repeated at least a few times prior to converging on printing the final set of mask designs. (FIG. 12 is optimistic in this regard with respect to the VEB model as it only shows one or few of such build/etch/fit cycles.) In total, as shown in the figure, this state-of-the-art so-called "model-based" VEB approach is estimated to take at least 12 weeks to complete; it can take, however, 16 weeks or more to complete (for example), if multiple build-etch-fit cycles are required. Moreover, since the procedure involves the experimental etching of real wafer substrates, and both pre-etch and/or post-etch metrology of these substrates, and moreover, over potentially many cycles, the entire process is (typically) also quite expensive from a materials- and resource-cost standpoint. Finally, limitations on this protocol's statistical accuracy should also be noted: A finite and limited number of patterned sites on the test wafer's surface are measured and used in the least-squares fitting procedure. Extrapolation outside of this regression window will necessarily be of limited statistical validity and, of course, the real/production layout will have features which are not reproduced or analogous to those found in the test calibration patterns.

In contrast to these almost totally empirical approaches, the methodology described herein uses a model-based approach employing a real physics and surface kinetics-based etch profile model (EPM)—i.e., a model of the underlying physical processes and chemical reaction mechanisms occurring on the substrate surface and accounting for the plasma etch of the substrate; as described above, the EPM model tracks the evolution of an etch profile on the semiconductor substrate as it evolves over the course of a plasma-based etch process. In the case of a patterned etch process, the time-evolution of the feature profile would proceed based on the patterning of some layer of photoresist (created from a given mask layout) overlaid on a given material stack on the surface of the semiconductor substrate.

Briefly, in the physics/chemistry model-based approach disclosed herein, for a given mask-open process, a target calibration pattern/layout (that would include, e.g., linear 2D line/pitch gratings, and might also include simple 3D patterns) is used to optimize a rigorous physics-based EPM (such as described above). Metrology is performed on experimental wafers with the targeted calibration pattern (after transfer via photolithography to a given material stack and etched), and the EPM is calibrated to this experimental metrology using any of the various optimization procedures such as those described above. In some embodiments, the optimization may be performed using a cloud-based or cluster-based implementation, and the computation may involve generating a large number of samples around a center point, followed by a search in that parameter space for improved calibration/optimization of the EPM with respect to the experimental data.

Once an optimized EPM is established (especially for a given etch process and substrate material stack), it may then be used in the implementation of a computational predictive pattern-proximity correction (PPC) scheme which, in some embodiments, requires no further physical experimentation. Thus, as shown in the lower portion of FIG. 12, in using such a physics-based model approach, the methodology may reduce the total mask build time by at least 3-4 weeks and will involve just one final physical mask build step.

A basic overview of the PPC prescription is schematically illustrated in FIG. 11B with respect generally to an isolated feature—which would be a small portion of an overall design layout. As shown in FIG. 11B-1, an initial (trial) etch design layout (to be embodied in a layer of photoresist generated via photolithography by projecting through an appropriately designed optical mask) corresponding to the intended etched design is received. In this case it is a simple L-shaped trench (it has a 90 degree bend). The edges of the received design layout (again, this is the intended design pattern) are then discretized—a set of points are selected in the horizontal plane of the etch design layout—see the "fragmented layout" in FIG. 11B-2—and an optimized/calibrated EPM model (such as that just described, optimized according to a calibration pattern) is run over the selected set of discretized edge points. The output from the EPM is the feature's cross-sectional profile (as shown in FIG. 1) as it evolves over time during simulated etch, computed with respect to the various discretized edge points. Run through to the final etch time, the EPM thus provides an estimate of the feature's edge placement error (EPE) around the contours of the feature—see the "simulated contour" in FIG. 11B-2—according to the fineness (or coarseness) of the discretization. The simulated contour shown in FIG. 11B-2 illustrates the proximity defects likely to be found if one were to actually do a real plasma-etch using the original photoresist pattern shown in FIG. 11B-1. Based on the EPM computation, however, the initial design layout may be modified, as shown in FIG. 11B-3, to provide a proximity-corrected design layout which compensates for the expected defects. Transferring a layer of photoresist to the substrate and patterning it so that it resembles this proximity-corrected (PPC) design layout, and then etching the substrate with this PPC will result in the "final pattern" shown in FIG. 11B-4, which illustrates the edges of the etched feature now more closely aligning with the original intended design layout.

Based on this general prescription, a variety of approaches may be envisioned. One might envision a brute-force approach where the entire patterned surface of a wafer substrate is discretized with a large number of edge points and the calibrated EPM is run for each of the edge points to determine the appropriate proximity corrections. This may work in principle. In practice, the number of EPM calculations required to cover such a large grid of points would be quite expensive from a computational perspective, and likely quite impractical.

Another approach, however, arises from the realization that there is likely to be a great deal of similarity between the actual physical and chemical processes occurring at different points on the wafer's surface, and within the different features being etched on the wafer's surface. Different feature geometries from the design layout coupled with variations in plasma flux within the etch chamber will, of course, lead to certain differences, but there are likely to be significant similarities across the wafer—the same chemistries are involved, the same plasma is involved, many features will have similar shapes, or fall into different general classes of shapes, etc. Thus, with this realization, what is sought is a concrete procedure for taking advantages of these similarities and avoiding the brute force EPM computation for every edge in a given design layout. Doing so provides an opportunity for enormous computational cost savings: there is no need to re-run an EPM for every feature in a large complicated photoresist design layout, because many points in the design are likely to yield the same result. The key is figuring out what points these are.

The approach described herein for accomplishing this takes advantage of the idea that the etch reaction rates inside a feature are likely to be very strongly correlated with the physical characteristics of the plasma within a feature as it is etched, or more generally, of any etchant or passivation species within the feature during the etch process. Particularly, this is so because the material composition of each feature (i.e., the material stack on the semiconductor substrate) is typically going to be the same. In other words, if it is known (via the optimized EPM) what is going to happen within one feature for a given etchant (e.g., plasma-based) flux within the feature—e.g., how an edge of the feature moves as it is etched—then in all likelihood the same result is going to occur in all features having the same in-feature plasma/etchant flux (IFPF) during the etch (or, at least, for features that are have some gross geometric similarity).

Figures 13A, 13B:
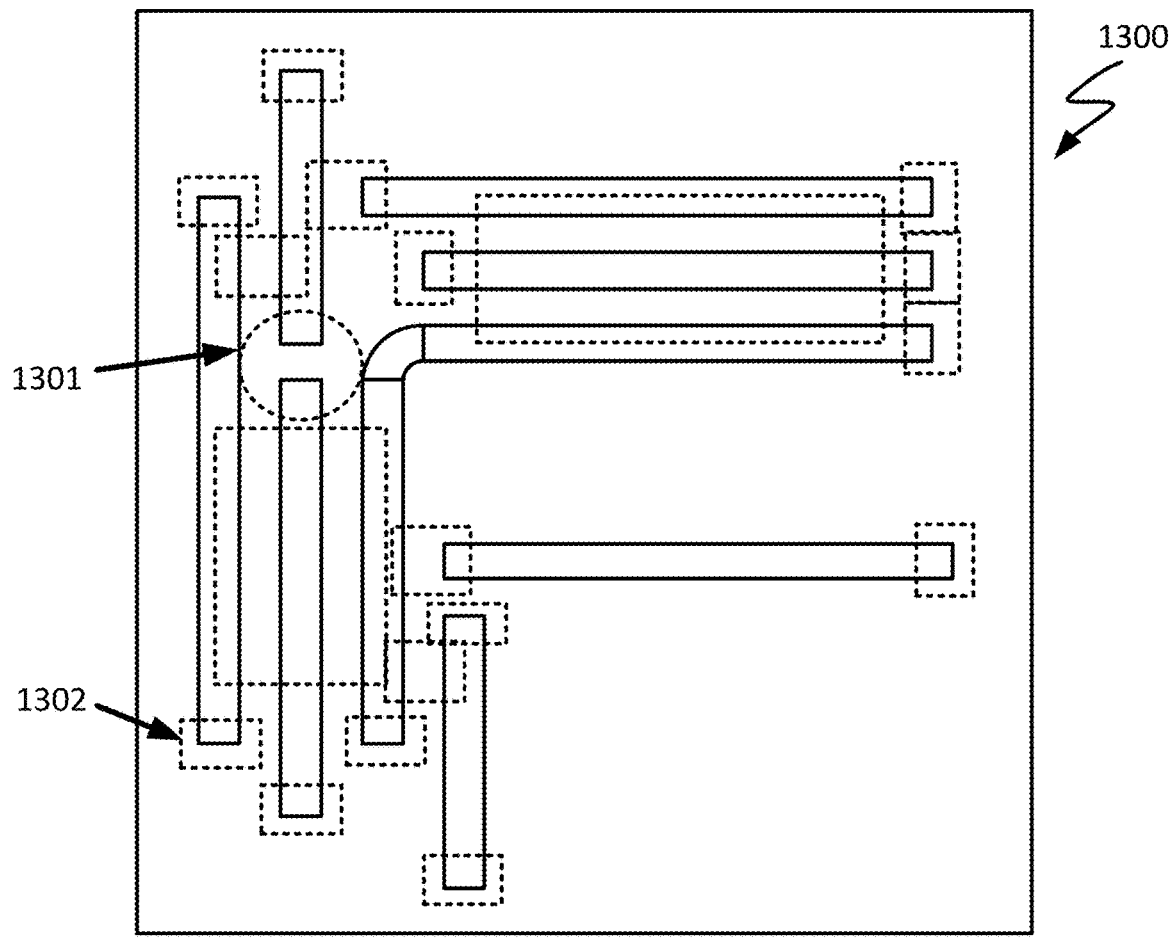
FIG. 13A provides an illustration of a simple calibration pattern with certain structures/features selected from it.
FIG. 13B provides an illustration of a reduced-order model (ROM) look-up table (LUT) as described herein.

To implement this idea—and to avoid the brute force EPM computation for every edge—a set of targeted calibration structures is assembled. FIG. 13A provides an illustration of a simple calibration pattern 1300 with certain structures/features 1301 and 1302 selected from it. For each targeted calibration structure/feature, one or more characteristics of an in-feature plasma flux (IFPF) is determined, and the optimized EPM model run for that calibration structure/feature to determine the time evolution of the feature during the etch, and more particularly the feature's edge placement error (EPE) as a result of the etch. If the targeted calibration structures/features exhibit a range of IFPF covering the range of IFPF likely to be seen in a real photoresist design layout, then this procedure of running the EPM over a limited number of calibration structures has nevertheless provided an approximate mapping between IFPF and EPE. The mapping is referred to herein as a reduced order model or ROM and, as described herein, the mapping may be conveniently represented in a look-up table (LUT) format, such as displayed in FIGS. 13B and 13C. Such a ROM LUT then constitutes a very fast computational tool around which a protocol may be developed for proximity correction. It should, however, be understood that other computationally-efficient implementations may also be used to represent the ROM relationship. For instance, as described in more detail below, a machine learning model may be trained with a dataset similar to that which may be used to construct a LUT (or perhaps the training dataset may be even more comprehensive—see below). Although a LUT represents one computationally efficient/feasible implementation of the ROM relationship between EPE and quantities characteristic of IFPF, other implementations may be even faster and/or provide better interpolation between points in the training set, and thus may be preferred, depending on the embodiment. As explained, the concept of a LUT may be generalized to include other relationships between IFPF related characteristics (e.g., IFPIF, IFPNF, IFPDF, etch time, etch depth, and edge shape) and EPE. Examples of such relationships include regression models, neural networks, classification trees (e.g., random forests models), and the like. The concept of a LUT may be viewed as including any of these.

In any event, referring again to the look-up table (LUT) embodiment of what is more generally a reduced order model (ROM) of the masked etch process: As shown in FIG. 13B, each entry in the look-up table typically has fields for one or more values of quantities which are characteristic of the IFPF—in this example, columns/fields for in-feature plasma ion and neutral fluxes, and passivant deposition flux ($\Gamma^*$)—and a field for the resulting EPE (in this example, labeled "$\Delta x_{EPE}$") (or a quantity characteristic/indicative of EPE) that is expected to be associated with said IFPF-related quantities (as previously determined by running an EPM over the calibration structures). As indicated in the table entry of FIG. 13B, the in-feature plasma ion flux (IFPIF), in-feature plasma neutral flux (IFPNF), and in-feature passivant deposition flux (IFPDF) represent outputs of a compact physical model (CPM) of the in-feature plasma etchant species and which are generally determined by calculations which take into account the effects of flux loading just above the substrate, as well as accounting for the "visibility" at various depths inside the feature. (As further indicated in the LUT example of FIG. 13B, flux "loading" is more important for determining neutral and passivant species flux, whereas "visibility" relates to ion species flux, plasma ion flux being directional due to electromagnetic fields within the processing chamber and hence very susceptible to shadowing effects from a feature's sidewalls.)

In addition, the different entries in the look-up table may correspond to a single total etch time or different entries may correspond to different etch times. In the table entry of FIG. 13B, a "Layer Depth" field ($z_1, z_2, \ldots z_N$) is used instead of an "Etch Time" field ($t_1, t_2, \ldots t_N$), for example, but the principle is the same: to tabulate values for different intermediate times during the etch. (The benefit of assembling EPE data for multiple intermediate times during the etch is described in greater detail below.)

Figure 14A:
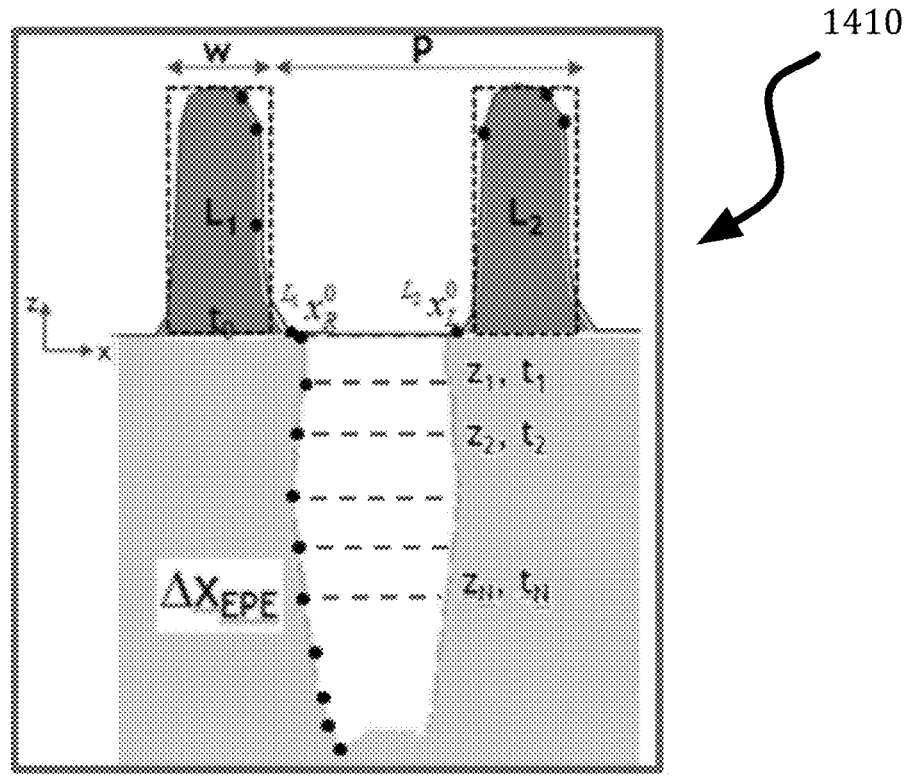
FIGS. 14A and 14B both display a feature/structure of a semiconductor substrate labeled with the quantities held in the fields of the ROM look-up table (LUT).
Figure 14B:
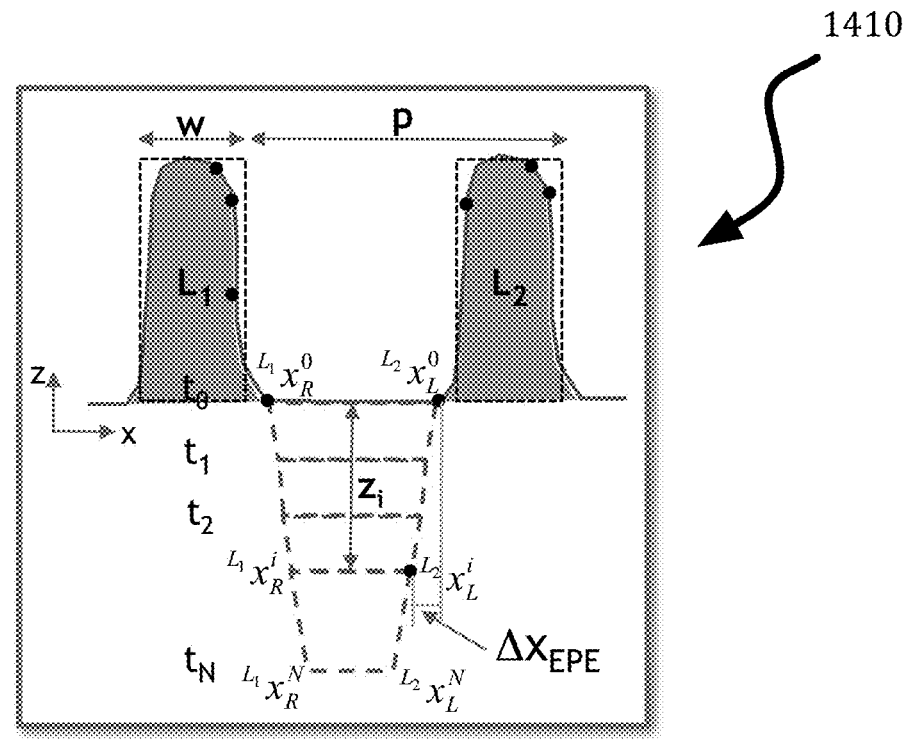

To make this more concrete, a simple illustration is provided in FIGS. 14A and 14B which display a feature/structure of a semiconductor substrate labeled with the quantities held in the fields of the look-up table. Both figures show cross-sectional profiles of two lines of photoresist from a photoresist layer, labeled $L_1$ and $L_2$, which define a structure/feature 1410 having width 'w' and pitch 'P' which is etched in an etch process. FIG. 14A shows schematically what may be viewed as the true profile of the feature at various etch times $t_i$ at which the feature will have a corresponding depth $z_i$—this then represents the discretization in time, or equivalently depth, as tabulated in the look-up table illustrated in FIG. 13B. (As mentioned above, there is correspondence between etch time and etch depth.) FIG. 14B shows a "digital"/discretized representation of the same feature at the different points during the etch, and how the EPE, $\Delta x_{EPE}$, is to be calculated, which is also tabulated in the look-up table of FIG. 13B.

To use the reduced order model (ROM) look-up table (LUT) to determine an EPE for a particular edge in a design layout, one thus uses a set of one or more estimated values of quantities which are characteristic of the IFPF corresponding to the feature with which the edge is associated, and looks up these quantities in the table. Thus, for instance, as shown in the ROM LUT of FIG. 13B, one may use in-feature plasma ion flux (IFPIF), in-feature plasma neutral flux (IFPNF) (which includes plasma free-radical species), and in-feature passivant deposition flux (IFPDF) as quantities characteristic of in-feature plasma flux (IFPF) for indexing into the LUT to obtain an estimate of the edge placement error (EPE) approximately corresponding to these quantities.

However these are not the only possible quantities which may represent the characteristics of the plasma within the feature as calculated by a "compact physical model" (CPM). In this respect, the phrase "quantity (or quantities) characteristic of IFPF" is intended (as used herein) to encompass the actual physical characteristics of the plasma/etchant within the feature (i.e., between its sidewalls) as determined from a computational model (although, in principle, they could also be determined experimentally). However, IFPF is also intended (as used herein) to encompass, more generally, other plasma/etchant parameters which although perhaps not representing the actual physical characteristics of the plasma/etchant within the feature per se, they are nevertheless strongly correlated with them.

An example is shown in the ROM LUT entry of FIG. 13C. In this ROM LUT, there are explicit fields for "Loaded Fluxes" (referring to the loaded fluxes above the feature) and a field for "Visibility" (representing the shadowing effects of a feature's sidewalls, obtained, for example, by hemi spherically averaging/integrating a feature's angularly-dependent "visibility kernel"-see additional details below). While these are not, strictly speaking, actual physical characteristics of the actual plasma species within the feature (i.e., down inside it, between its sidewalls), taken together, these parameters are strongly correlated with the actual physical characteristics of the plasma within the feature. For instance, if one knows the loaded fluxes above the substrate surface as well as a feature's approximate visibility (as those technical phrases are understood in the art) then one may calculate (e.g., via a CPM) the ion and neutral/radical plasma flux densities within the feature to good accuracy. Because of this, taken together, such a set of features may also be said to constitute the actual in-feature ion and neutral/radical plasma fluxes which will lead to the EPE listed in the table. Hence, fields in the LUT like those of FIG. 13C are also classified herein as "quantities characteristic of the IFPF."

It is also noted that the LUT entries shown in FIGS. 13B and 13C contain an "Edge" field. As a shortcut, instead of, for example, using loaded fluxes or visibility as keys into the look-up table, one may instead look up an edge in the look-up table directly. Typically, the edge field would contain some sort of edge shape indicator whereby edges of features present in the design layout having geometric similarity to edges of features present in the calibration pattern may be identified and found in the look-up table. Thus, in some embodiments, an edge shape indictor for the edge of a feature in the design layout may be determined by pattern matching the shape of said feature against the shapes of the features present in the calibration pattern (and then used as a key into the look-up table). Because feature shapes are likely to be strongly correlated with IFPF, doing this may make the edge shape indicator a quantity characteristic of IFPF for purposes of indexing into the LUT. In some embodiments, the look-up table may be searched first based on the feature's determined edge shape indicator. In certain such embodiments, such a search based on the edge shape indicator may be used initially to narrow down relevant entries in the look-up table before a detailed search (and/or interpolation) based on the other quantities listed in the table is performed (such as a subsequent search based on IFPIF and/or INPNF).

Conceptually, the look-up table thus provides a very fast mapping between IFPF-related quantities and the EPE (edge placement error) of a feature as it is etched—given the process conditions and particular material stack used to construct the look-up table. It is referred to herein as a reduced order model (ROM), not only because it is fast, but also because it serves to reduce what amounts to a very complex physical/chemical etch process down to a core causal relationship between characteristics of local plasma flux (IFPF) (or flux of non-plasma-based etchant if that is the relevant etch process) and edge placement error (EPE). Once again, this ROM relationship (embodied in the look-up table or similar construct) could be constructed using a physics-based EPM calibrated using any of the optimization methods described in detail above. However constructed, once this relationship is established, a prescription may be designed for doing pattern proximity correction (PPC) of an initial/trial design layout for photoresist based on the physics and chemistry of the etch process embodied in the ROM look-up table.

Figure 15:
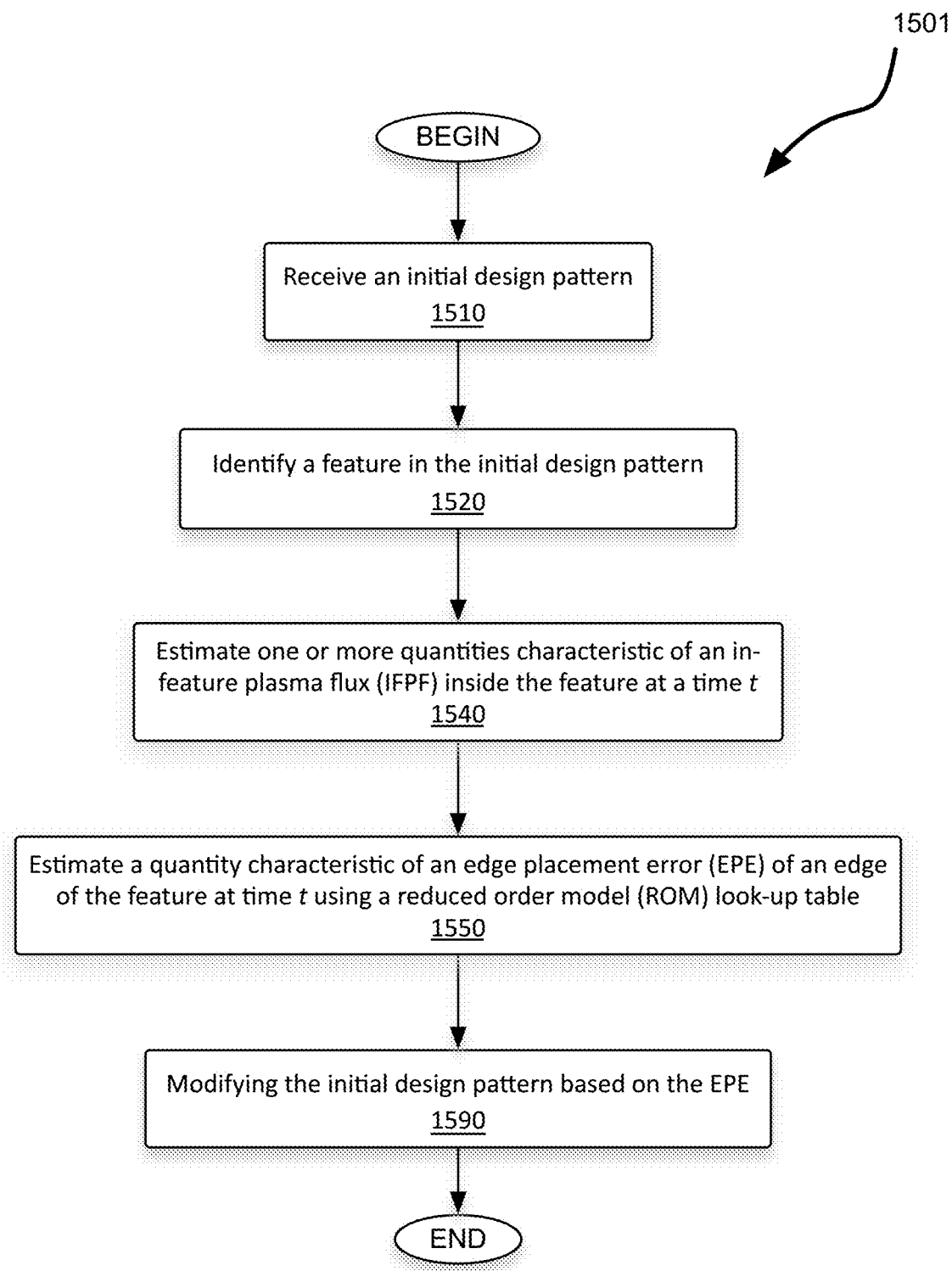
FIG. 15 shows a sequence of operations for generating a pattern proximity-corrected design layout for photoresist.

Such a set of operations are displayed in the flowchart of FIG. 15. As shown in the figure, a method for generating a proximity-corrected design layout for photoresist to be used in an etch operation begins with an operation 1500 of receiving an initial design layout, after which, in operation 1520, a feature is identified in the design layout for proximity correction. Of course, in many cases, one will want to choose a multitude of features in the design layout for proximity correction; more on this below. In any event, with regards to this identified feature, in operation 1540, the method proceeds by estimating one or more quantities characteristic of an in-feature plasma flux (IFPF) within the feature at a time t during the modeled plasma-based etch process, and then, in operation 1550, these one or more estimated IFPF-related quantities are used to estimate an edge placement error (EPE) of an edge of the feature at time t using a reduced order model (ROM) embodied in the look-up table. (The quantities characteristic of IFPF at time t serve as keys into the ROM look-up table.) Again, the ROM look-up table which associates values of EPE at time t with one or more quantities characteristic of the IFPF, and it was constructed by running a computerized etch profile model (EPM) under the set of process conditions at least to time t on a calibration pattern of photoresist overlaid on the material stack. With the estimated EPE associated with the feature determined, the method concludes with operation 1590 of modifying the initial design layout based on at the EPE.

The modified design layout may then serve as the final proximity-corrected design layout for photoresist from which an etch photomask design may be generated, for example, by using an industry-standard software package such as "Prolith" mentioned above. An actual photomask may then be physically formed, and a photolithography operation performed using it, in the usual fashion, to transfer a layer of photoresist to the substrate surface, which now will match the proximity-corrected design layout. Finally, the actual plasma-etch operation may be performed.

Figure 16:
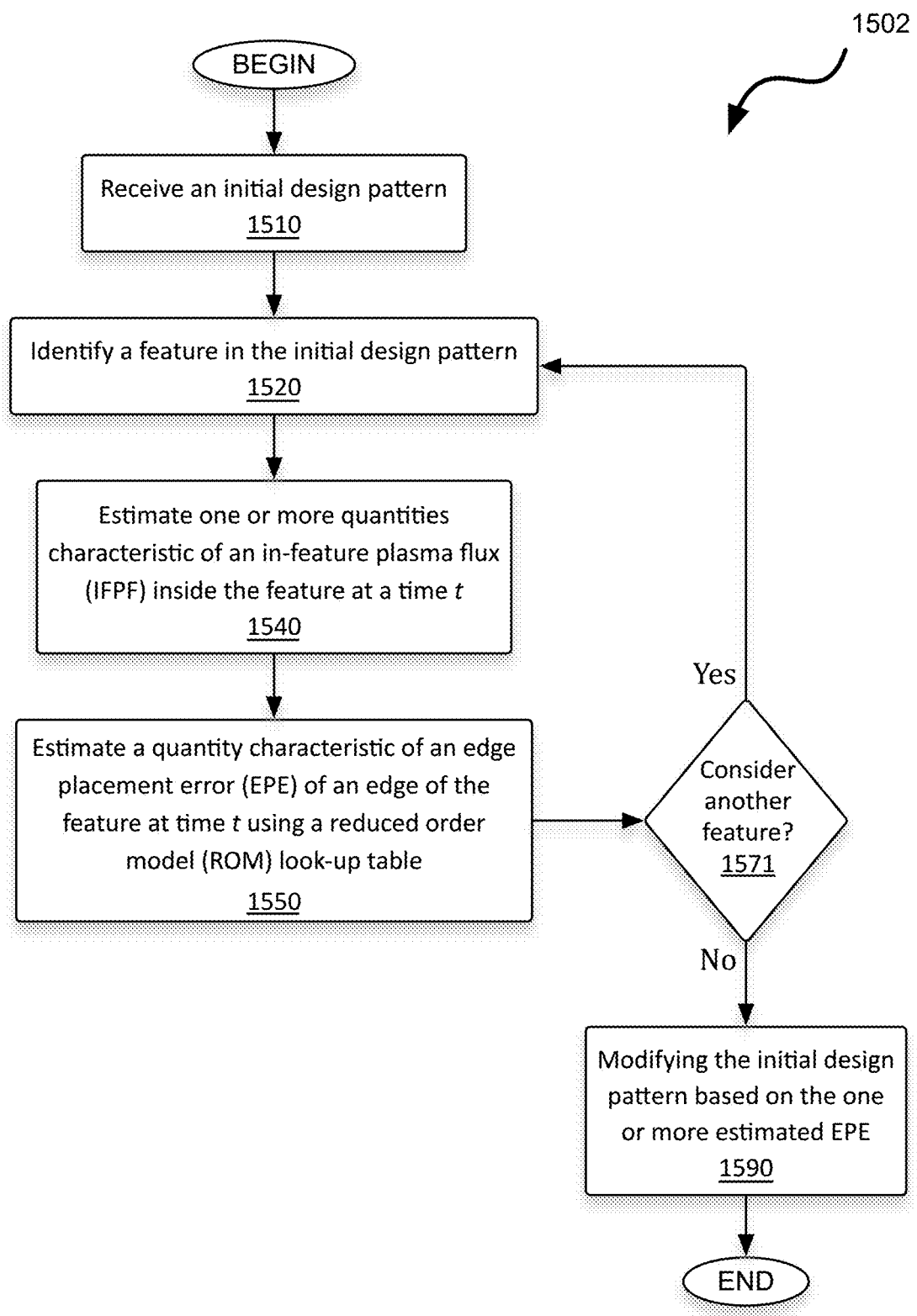
FIG. 16 shows a sequence of operations for generating a pattern proximity-corrected design layout for photoresist involving calculating an edge placement error (EPE) of multiple features in the initial design layout.

As stated, in most cases, it is desired that pattern proximity correction (PPC) be done for many features in the initial design layout. Accordingly, FIG. 16 presents a method 1502 which is analogous to that shown in FIG. 15, but involves pattern proximity correction with respect to multiple features (whose patterns are in the initial design layout). As shown in FIG. 16, method 1502 proceeds analogously to method 1501 from FIG. 15, but after an operation 1550 where an EPE is estimated for the first feature under consideration, it is determined in an operation 1571 whether another feature should be considered. If so, the method loops back to operation 1520 where another feature in the initial design layout is selected, and the method proceeds as before, but with respect to the newly additionally considered feature to arrive at an estimate of its EPE, again, in operation 1550. The method 1502 may then continue to loop according to the decision logic in operation 1571 until it is determined that no more features are to be considered, at which point the method proceeds to operation 1590 where the initial design is then modified based on the different EPEs estimated for all the different features which were considered.

As described above, various quantities relating to (characteristics of) the IFPF may be used as keys for indexing into the ROM LUT and thereby obtaining an estimate of the EPE. In the embodiment depicted in FIG. 13C, a representation of plasma flux (e.g., as calculated by a CPM) has been utilized in terms of above-wafer loaded plasma fluxes and in-feature visibility. In the embodiment depicted in FIG. 13B, the ROM LUT implements use of the CPM in terms of in-feature plasma ion flux (IFPIF), in-feature plasma neutral flux (IFPNF) (which includes plasma free-radical species), and in-feature passivant deposition flux (IFPDF) as detailed above.

In addition, while most of the examples explained herein concern the case of modeling a plasma-based etch process with a ROM LUT approach, in some embodiments, other etch processes may also be modeled effectively within the framework of a LUT. For example, if there is no plasma, then, more generally, one or more quantities characteristic of an in-feature etchant flux/concentration (IFEF) could be used as keys for indexing into a LUT which holds values of EPE corresponding to this non-plasma-based etch process.

Note that the process conditions set for the processing chamber, chamber geometry, etc. determine the "global plasma flux" (or more generally "global etchant flux") far from the surface of the substrate—i.e., the process conditions dictate what "global plasma flux" would generally exist in the processing chamber were there no substrate present. If there is a substrate present, then the substrate affects the plasma flux directly above it, in its vicinity—i.e., the loaded plasma flux is related to, and may be estimated based on, the global plasma flux as determined from the process conditions, but the they are not in, in general, the same. In particular, the loaded plasma flux has a horizontal radial dependence due to the presence of the substrate in the chamber; moreover, the radial dependence may be affected by the pattern density of photoresist on the wafer surface corresponding to a given design layout. Thus the loaded plasma fluxes—loaded plasma neutral flux (LPNF) and/or loaded passivant deposition flux (LPDF)—may be estimated based on the global plasma flux (as determined by the chamber conditions) in conjunction with the design layout planned for the etch process. Note that it is not as important that one calculate loadings for plasma ion fluxes (PIF) because flux density/densities for ionic species generally do not deviate significantly from their "global plasma flux" values. Thus, it will oftentimes be the case that the PIF values tabulated in the ROM LUT will be unloaded plasma fluxes (but also note that this does not necessarily have to be the case for all embodiments, and there may be some ionic species whose corrections for flux loading are significant enough to warrant taking into account).

The ROM look-up table entry in FIG. 13C also has a field for in-feature visibility. As indicated above, the visibility specifies the degree of shadowing effects a feature's sidewalls have on plasma density due to their blocking of directional ion flux. This is illustrated by the cross-sectional view of the feature shown in FIG. 17: lines-of-sight 1710 and 1720 converge to a spatial point 1730 within the feature—representing a particular depth at one of the edges—and delineate the angular limits of that point's visible exposure to directional ion flux; lines-of-sight 1710 and 1720 thus determine the fraction of directional ion flux that spatial point 1730 is subjected to during the etch. More precisely, the ion flux for a particular ion at a particular depth within a feature is given by angular integration (e.g., done numerically) of a visibility kernel corresponding to that specific depth within the feature (at a specific depth, the visibility kernel has an angular dependence, for example, see lines of sight 1710 and 1720 in FIG. 17) with the ion energy angular distribution function (IEADF) associated with that particular ion of interest. (The IEADF comes from the global plasma model.) Thus, the visibility is closely related to ion flux density and so may be said to be a characteristic of IFPF as stated above. For a given edge, the visibility kernel may be integrated so as to obtain an average/mean visibility value which may be tabulated for all the different edge depths (and/or etch times) present in the ROM look-up table as shown in FIG. 13C. One may then simply use the integrated visibility (associated with a feature of interest) to index into the ROM. In other embodiments, the product of the visibility kernel and the IEADF is integrated (over angle) to obtain the IFPIF which can then be used as an index into the LUT as shown in FIG. 13B.

As indicated, a CPM may estimate in-feature etch fluxes for a feature under consideration. To do so, the CPM may employ various considerations; for example, a CPM may be designed or configured to account for in-feature visibility and/or loading when calculating in-feature etch conditions (e.g., quantities representing IFPF). In some cases, a CPM and associated method are designed to predict a species flux (e.g. flux of radicals, passivants, and/or ions) inside a complex feature and include shading effects from surrounding environment (e.g., upper regions of the feature itself and/or nearby elevated features) of integrated circuit components on a semiconductor wafer.

The CPM may be configured to receive as an input global chamber plasma flux conditions outside the feature under consideration (e.g., determined for a plane or hemisphere over the semiconductor wafer and/or over a specific feature for which in-feature flux is to be calculated). In some cases, this input flux varies from point-to-point over the two-dimensional surface of a design layout. In some cases, the flux varies over a "mesoscale" that is larger the scale of the features being modeled but smaller than the scale of the design layout (e.g., smaller than a die). In the mesoscale, loading effects associated with pattern density variations come into play.

In addition to the above-feature plasma flux conditions, the CPM may receive as an input the current geometry of feature under consideration. Thus, the CPM may be configured to read a geometry description of a feature under consideration (and optionally its environment). To account for visibility and/or loading, the input geometry may include information about adjacent features as well as a feature under consideration. In one example, for a three-dimensional representation of the feature surface, the geometry is represented by a mesh such as a mesh of facets (triangles) and vertices. In another example, for a two-dimensional representation of the feature surface, the geometry is represented by lines and vertices. In some implementations, the CPM itself generates the feature geometry description.

In some embodiments, the CPM estimates IFPF quantities point-by-point (or differential element by differential element) over the feature geometry. Because the feature geometry evolves over the course of an etch process, the input may represent the feature geometry at a particular time and/or a particular feature etch depth.

The output of the CPM is a species flux at many points inside the complex structure. Thus, the output of the CPM may be in-feature plasma conditions (IFPF), which vary from point-to-point or element-to-element within a feature. For each point in a feature, the CPM may be separately executed for each of multiple species (or classes of species) present in the etch process under consideration. For example, if the process employs only ions and radicals, the CPM may evaluate IFPF twice, once for ions and once for radicals. If the process additionally includes passivants, the CPM may also evaluate IFPF once more, this time for the passivant species. The CPM treats ion distributions differently than non-ion species distributions. Ions approach and enter features in an anisotropic distribution (they may be treated as collimated), while neutrals such as radicals and passivants come to features from all directions (i.e., they have an isotropic distribution).

Figure 17:
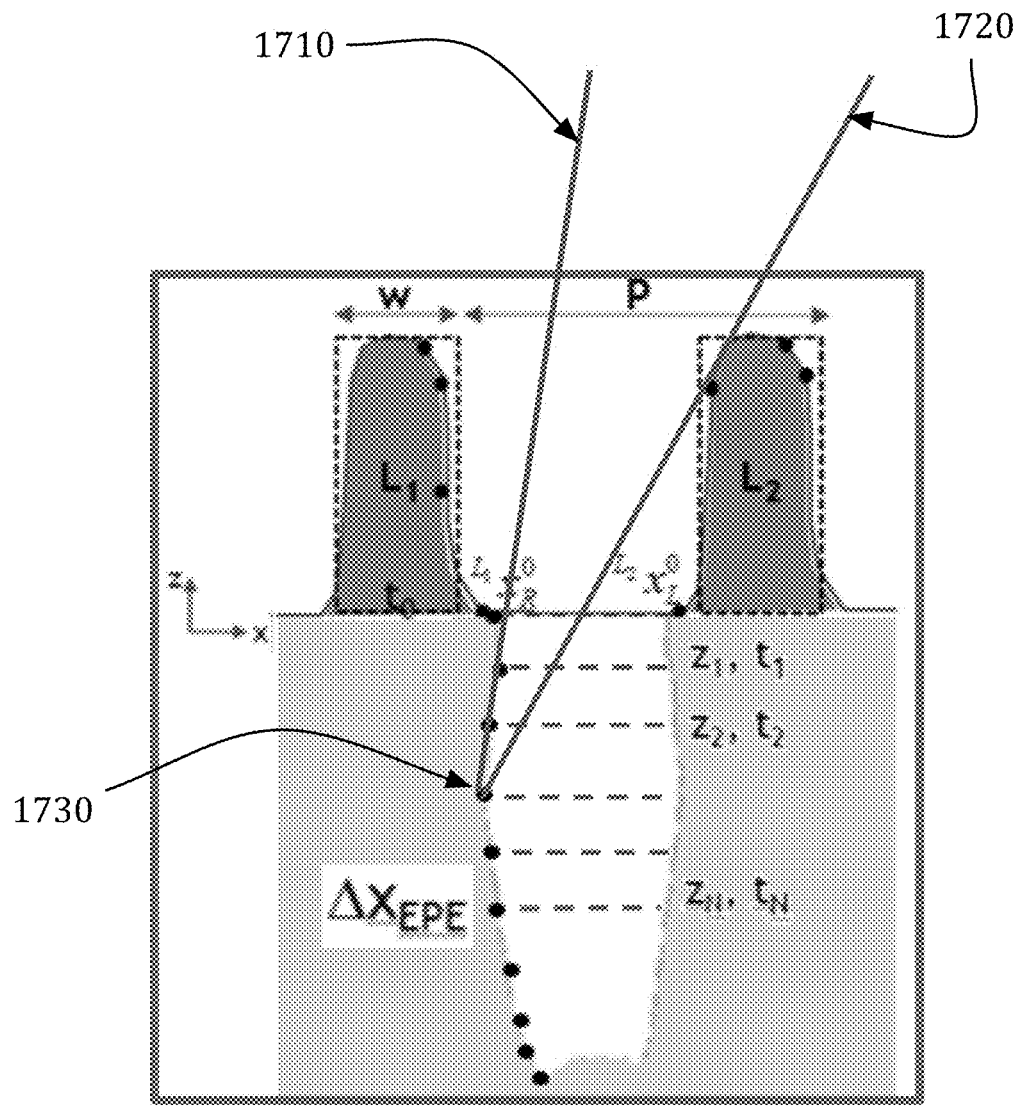
FIG. 17 shows a cross-sectional view of a feature with lines-of-sight drawn to illustrate the visibility of a point within the feature, for example, to directional ion flux.

As illustrated in FIG. 17, a feature's "visibility" is primarily determined by its shape. However, the shape of a feature evolves over the course of an etch process, and so there is a question as to what should be taken as the estimated shape of the feature during the etch process for purposes of determining a visibility corresponding to it which may then be used to index/key into the ROM LUT. A variety of approaches may be employed for this.

One approach is simply to assume that the estimated shape of the feature in question has an opening which corresponds to the given initial design layout of photoresist and that the feature has substantially vertical sidewalls extending downward from the edges of its opening. In other words, that the feature has zero EPE for purposes of using the visibility/flux-loading CPM picture as a way to index into the ROM LUT. In some embodiments, this approximation may be good enough.

Figure 18:
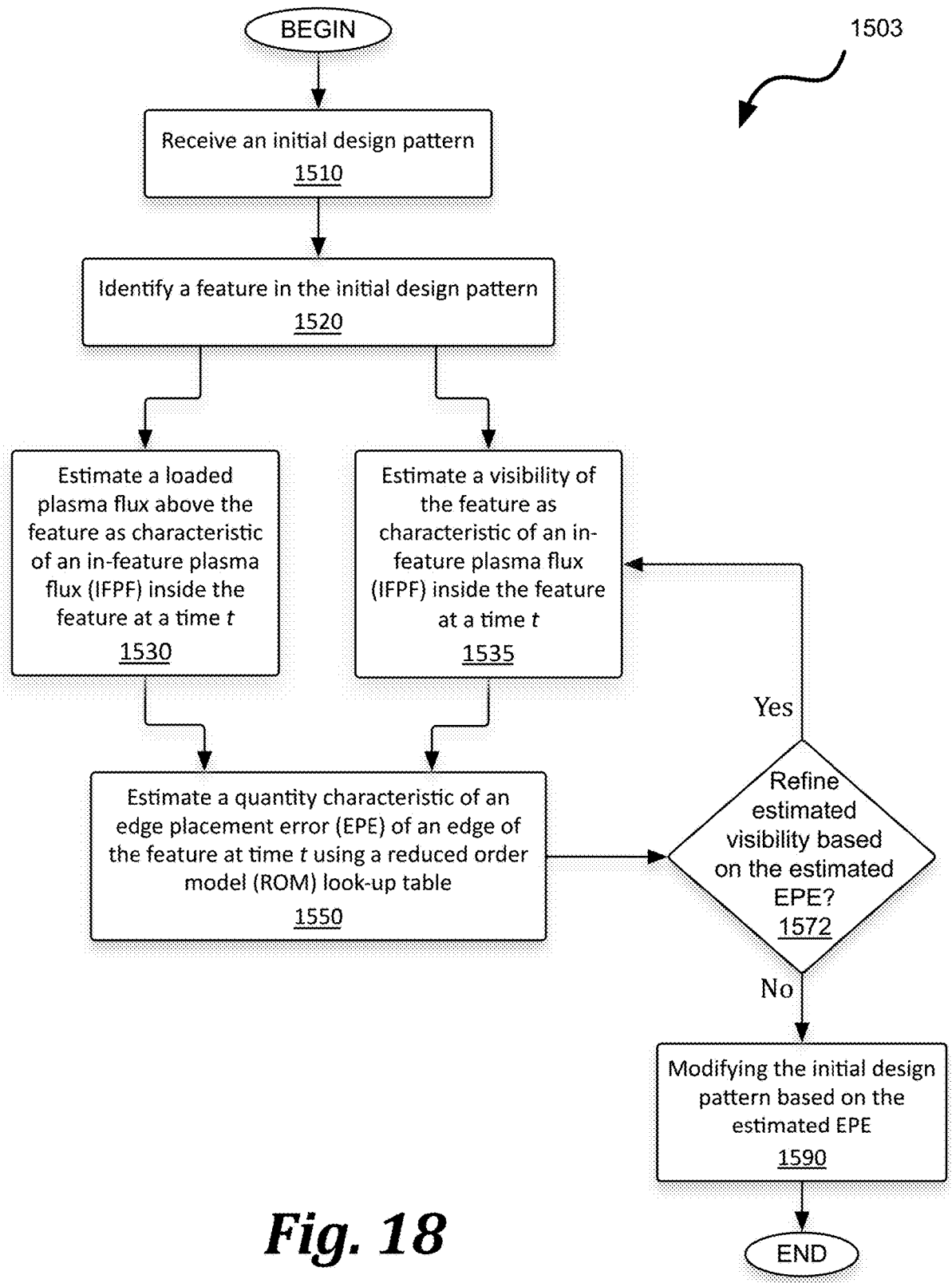
FIG. 18 shows a sequence of operations for generating a pattern proximity-corrected design layout for photoresist involving refining estimated feature visibility as part of calculating edge placement error (EPE).

A more sophisticated way of estimating feature shape and thus visibility for purposes of indexing into the LUT is illustrated by the flowchart in FIG. 18. FIG. 18 illustrates a pattern proximity-correction (PPC) method 1503 that begins similarly to method 1502 of FIG. 16, but after operation 1520 (feature selection), the method proceeds to estimate a loaded plasma flux above the feature in operation 1530, and in a parallel operation 1535, to estimate the visibility of the feature at time t during the etch. The latter may be done as just described (assuming vertical sidewalls matching the feature's design layout), or a more nuanced initial guess may be employed (such as assuming some default approximate taper from feature opening to base, using a shape found in a prior calculation, etc.). In any event, the shape is used to estimate a visibility which is then used in operation 1550, along with the loaded flux from operation 1535, to index into the ROM look-up table and determine an estimated EPE. The estimated EPE, however, is indicative of the shape of the feature. Accordingly, in FIG. 18, method 1503 proceeds to operation 1572 where a decision is made as to whether to update/refine the estimate of the feature's visibility (at time t during the etch). If so, the method loops back to operation 1535, re-estimates the visibility based on the current estimated EPE, and then proceeds again to operation 1550 where a more refined estimate of EPE is obtained by looking up the new re-estimated visibility in the ROM look-up table. The iteration (of re-estimating visibility, and from it, re-estimating EPE) may continue a fixed number of times, or until convergence is reached with respect to visibility and/or EPE, as dictated by the decisional logic in operation 1572, after which, in operation 1590, the initial design layout is modified based on the re-estimated EPE (analogously to methods 1501 and 1502 of the prior figures).

Of course, while loaded fluxes and visibility constitute an excellent compact physical model (CPM) for assessing in-feature plasma flux (IFPF), other quantities characteristic of IFPF may be good proxies as well, such as the direct physical characteristics of the in-feature plasma itself. For instance, it would be possible to implement a LUT directly in terms of actual ion and neutral plasma flux densities within the feature. See the discussion of FIG. 13B above.

As stated, the ROM look-up table (LUT) constitutes a very fast mechanism for computing edge placement error (EPE) from the foregoing quantities which characterize IFPF. However, in some cases, the ROM LUT may still be quite large, and hence various optimization procedures may be employed to improve its performance. For instance, the LUT may be stored sorted based on one or more fields of the entries. Which field is used as the primary sorting criteria, secondary sorting criteria, and so forth, may depend on the particular embodiment. In some embodiments, as mentioned above, the edge shape indicator field may be used as the primary sorting criteria. Having the ROM table sorted in a meaningful way increases the speed at which it may be searched to find the relevant entry or entries (by reducing the number of comparison operations required between the value of the quantity being searched for—e.g., edge shape indicator, plasma ion flux, plasma neutral flux, etc.—and the values held in the relevant fields of the table). In some cases, a LUT is pruned to remove entries that are redundant and/or unlikely to be needed because they represent a region of etch space unlikely to be encountered in a particular application.

Oftentimes, the exact values of the relevant quantities which are searched for are not present in the ROM LUT. When this is the case, one may identify nearest-neighbor entries (those closest to the exact searched-for values) and/or those which fit some criteria for being in a neighborhood around the exact sought value, and interpolate between these entries. In some embodiments, for example, a multivariate polynomial-based interpolation scheme may be employed.

In some embodiments, however, more sophisticated "interpolation" may be achieved with multivariate machine learning models. Depending on the embodiment, such machine learning models (MLM) may be unsupervised or partially supervised, and such approaches may include those known in the machine learning and/or statistical science arts such as "Gradient Boosting Machine," "Deep Learning," and "Distributed Random Forest."

Regarding the "Random Forest" technique, see, for example: Breiman, Leo, "Random forests," *Machine learning* 45.1 (2001): 5-32; Verikas, Antanas, Adas Gelzinis, and Marija Bacauskiene, "Mining data with random forests: A survey and results of new tests," *Pattern Recognition* 44.2 (2011): 330-349; and Segal, Mark R., "Machine learning benchmarks and random forest regression," *Center for Bioinformatics & Molecular Biostatistics* (2004); each of which is hereby incorporated by reference in its entirety for all purposes.

Likewise, regarding the techniques generally referred to in these arts as "Gradient Boosting Machines," see, for example: Friedman, Jerome H., "Greedy function approximation: a gradient boosting machine," Annals of statistics (2001): 1189-1232; Friedman, Jerome H., "Stochastic gradient boosting," Computational Statistics & Data Analysis 38.4 (2002): 367-378; and Schapire, Robert E., "The boosting approach to machine learning: An overview," Nonlinear estimation and classification, Springer New York, 2003, 149-171; each of which is hereby incorporated by reference in its entirety for all purposes.

Finally, regarding the techniques generally referred to in these arts as "Deep Learning," see, for example: Krizhevsky, Alex, Ilya Sutskever, and Geoffrey E. Hinton, "Imagenet classification with deep convolutional neural networks," Advances in neural information processing systems, 2012; LeCun, Yann, et al. "Backpropagation applied to handwritten zip code recognition," Neural computation 1.4 (1989): 541-551; and Schmidhuber, Jürgen, "Deep learning in neural networks: An overview," Neural Networks 61 (2015): 85-117; each of which is hereby incorporated by reference in its entirety for all purposes.

These techniques can be used (again, depending on the embodiment) to determine a sufficiently statistically accurate correlative relationship between EPE and the quantities which would be used as described above to index into the LUT (such as the plasma ion and neutral fluxes).

In general, a data-set similar to that used for constructing the ROM LUT would also be used as a training set to develop (i.e., teach) the chosen machine learning model (MLM). However, in training the MLM, it is feasible to use a much larger version of this dataset than what would be efficiently searchable in the ROM LUT. I.e., the machine learning model is trained offline with the full dataset to create an efficient-to-evaluate multivariate model of it, whereas it may not be efficient to search the full (training) dataset every time a new feature's EPE was desired in the PPC procedure. Of course, once the MLM is trained based on a dataset—a portion of which could be selected to construct an efficiently searchable LUT—the MLM embodies a relationship between EPE and plasma ion and/or neutral fluxes (for example) as does a plain LUT, and thus, on some level, the MLM does still make comparisons between one or more quantities indicative of IFPF and a quantity characteristic of EPE in the evaluation of it's multivariate model, though the exact quantities and comparisons made would occur in the context of operation of the MLM as trained on the original dataset. In any event, once the MLM is trained and validated against the original dataset, it establishes a predictive mathematical relationship which may be used to efficiently in a PPC procedure.

Yet another way of improving the accuracy of these PPC techniques is to employ an etch time-based (or etch depth-based) iteration scheme. FIGS. 19A and 19B provide a useful contrasting illustration. FIG. 19A schematically illustrates the "one-time-step" approach and shows that one goes from the top to the base of the feature in a single time step to estimate EPE. Thus, the estimating of the various quantities characteristic of IFPF is done just at the single etch time t (or single etch depth), as well as the looking up of these quantities in the ROM look-up table to arrive at the estimated EPE. This was illustrated, for example, by the set of operations in FIGS. 15, 16, and 18. However, a "multi-time-step" approach may also be employed for calculating EPE. This is illustrated in FIG. 19B which shows multiple values of $\Delta x_{EPE}$ calculated at multiple etch times $(t_1, t_2, \ldots t_N)$ which correspond to multiple etch depths $(z_1, z_2, \ldots z_N)$ down to the base of the feature where finally a "final" value of $\Delta x_{EPE}$ is calculated.

In the simplest multi-step version, there would be just two time steps. Thus, one would perform the estimation of quantities characteristic of IFPF (e.g., loaded fluxes and visibility) at a first etch time $t=t_1$, use these to estimate an EPE at time $t_1$ by comparing them to values in the ROM look-up table corresponding to time $t_1$, and then repeat the procedure for a second etch time $t=t_2$. However, the second time around, one may take advantage of the information gained during the first iteration, and so forth in subsequent iterations. Thus, for example, because the feature has changed at time $t_2$ versus what it was at time $t_1$, the loaded fluxes and visibility kernel may be adjusted accordingly based on this information, and these updated values then used to compare with entries in the ROM look-up table which correspond to time $t_2$.

Figure 20:
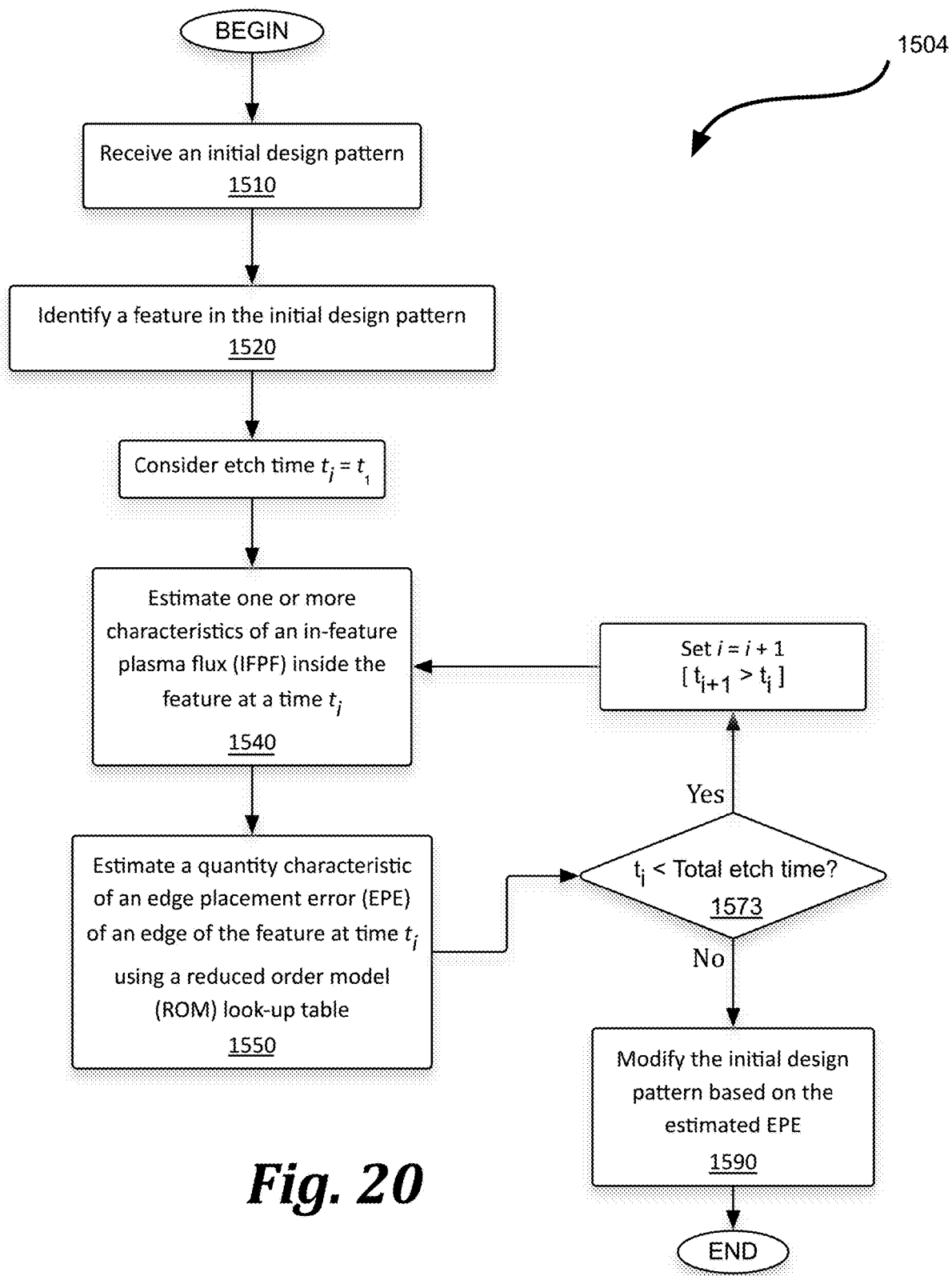
FIG. 20 shows a multi-time step sequence of operations for generating a pattern proximity-corrected design layout for photoresist.

One may proceed analogously to break the calculation up into as many time steps as desired. Such a multi-time-step methodology is illustrated in FIG. 20. Method 1504 in FIG. 20 proceeds analogously to methods 1501 and 1502 shown in FIGS. 16 and 18 except that operations 1540 and 1550 are performed first at a considered etch time of $t_i=t_1$ to estimate a first EPE (in operation 1550). Method 1504 then proceeds to operation 1573, where it is determined whether the current etch time $t_1$ is less than the final total etch time. If it is, then the method increments the time index "i" ($t_{i+1}>t_i$), and loops back to operation 1540 where quantities characteristic of the IFPF are re-estimated, and then proceeds to operation 1550 again to re-estimate EPE at the updated time. The iteration continues until in operation 1573 it is determined that the current time $t_i$ is equal to or greater than the final/total etch time, whereby the method proceeds to operation 1590 where the initial design layout is modified based on the final estimated EPE and/or the intermediate EPE calculated at the intermediate times, whereby the method concludes. Additionally, one notes that it is possible to combine the iteration scheme shown in FIG. 18—for arriving at better and better visibility estimates—with the iteration scheme in FIG. 20—which involves iterative time/depth-slicing as just described.

Edge Placement Error—Search and Estimation Example Embodiments

During an etch process, the edge inside of the feature (e.g., bottom CD of the etched feature) may move to produce a CD bias. As mentioned, this quantity is referred to as the Edge Placement Error. Accurately predicting how much each edge moves during the etch process would allow a correction to be introduced during the mask design or application process.

In the field of optical lithography, optical proximity correction is used to adjust mask edges with a goal of correcting or mitigating mask printing errors. OPC or a related process using various physics-based and empirical models may be employed to correct for etch CD-bias. These techniques do not try to match profiles. Rather they try to match one or a few limited characteristics of the profile (e.g., a feature's top CD, bottom CD, side wall angle, etc.), but they do not match the profile. Alternatively or in addition, current process optimization to match a target feature profile and account for or reduce etch CD bias may be manually performed by process engineers. This is done by adjusting process conditions based on the process engineers' understanding and intuition. The etch process is particularly challenging. Until now, an automated approach that can perform such task was not available.

When using physics-based models (e.g., a surface kinetic model) to predict the etch CD-bias, a research team could build and run simulations for varying geometries, surrounding layouts and plasma conditions in different parts of the wafer. However, to do this for every feature in the wafer is computationally difficult or unfeasible. One can also run a representative sample of features to capture the etch CD-bias across different geometries and summarize the information in a lookup table so that etch CD-bias patterns can be captured and used for prediction of other geometries without running the physics-based model every time. As explained above, in addition to the physics-based model simulations, a compact physical model may be used to calculate the local fluxes inside of a feature (e.g., on the side walls, etc.) which can be used as a proxy to summarize the etch conditions. While the following discussion describes embodiments employing surface kinetic models and compact physical models to predict edge placement errors, the disclosure is not limited to the SKM and/or CPM generated EPEs.

A model may be used to generate large number of simulated etch profiles. The profiles generated are used to generate a compact physical model that can calculate local fluxes for points of interest inside of the feature during etch evolution, optionally taking into account the visibility kernels and loading fluxes due to layouts of the die and the wafer. The fluxes and associated profiles are summarized in a large lookup table in the form of predictor variables (e.g., local fluxes at points of interest for multiple time steps and/or optical measurements and/or geometric variables) and predicted variables (EPE).

Certain embodiments in this section provide systems and methods to search such lookup tables. In general, the described approaches find one or more relevant entries in the lookup table using n-dimensional predictor variable space and generate EPE predictions using the relevant entry or entries. The searches may be based on an assumption that the predictor variables in the lookup table are uniquely correlated with EPEs.

Search methodologies include, for example, interpolation lookup approaches, iterative search methods, and/or even multivariate (e.g., PCA and/or PLS) models to reduce dimensionality of a large number of predictor variables.

Various approaches to obtaining EPEs from LUTs will be described in more detail below.

Figure 21:
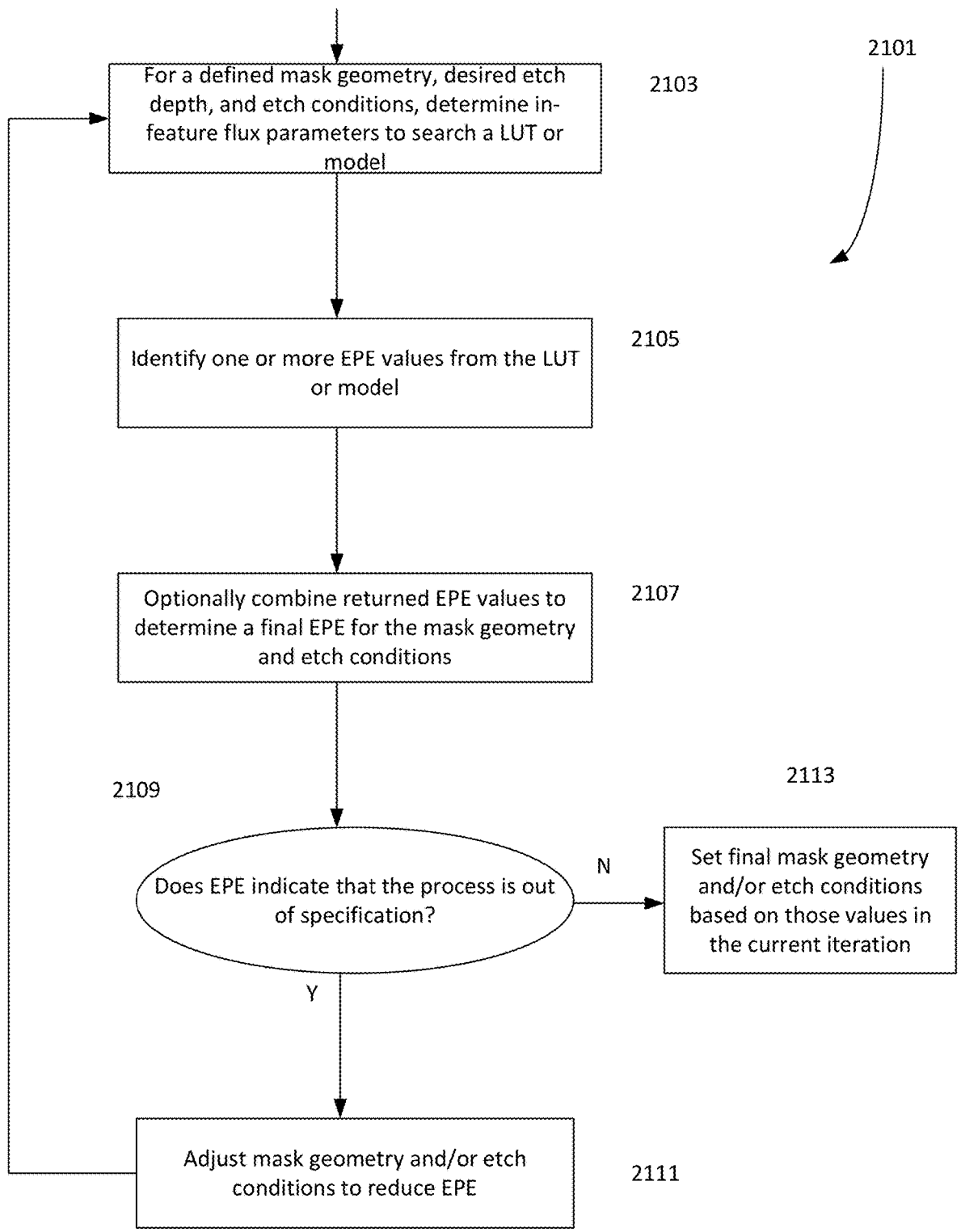

For context, FIG. 21 provides a flow chart 2101 illustrating how searching a lookup table may be used to improve an etch process. The depicted process begins with an operation 2103 where one or more in-feature flux parameters are calculated or otherwise determined for a feature to be etched. These parameters will serve as search variables for identifying relevant entries in a lookup table or for generating outputs from a comparable model. As explained above, these flux parameters may be generated by specifying the feature geometry and/or mask geometry (e.g., line width, feature depth, etc.) as well as the etch conditions. The geometry and etch conditions may be provided to a compact physical model or other source that generates the in-feature flux values or other search parameters. In some embodiments, these search parameters are applied to the lookup table or model, which returns one or more values of EPE. See block 2105. When the table or model returns multiple EPE values, the process or system optionally combines them to determine a final predicted EPE. See block 2107. The magnitude of the final predicted EPE allows the system to determine whether the defined etch process and associated mask geometry will provide a feature that is within specification for the fabrication method under consideration. With this in mind, a decision block 2109 determines whether the predicted EPE indicates that process is out of specification. Assuming that the answer is yes, process control is directed to an operation 21011 that adjusts the mask geometry and/or the etch conditions in an attempt to reduce the EPE to a value that is within specification for the fabrication process. This adjustment may be performed automatically using a gradient algorithm or similar approach. Mask adjustment involves changing the position of one or more mask boundaries defining the substrate region exposed to etchant. In some embodiments, EPE predictions are reported to an OPC module, which corrects the mask design for a next iteration of a mask design (or printing) process. In some embodiments, the EPE predictions are used to modify one or more etch conditions such as reactor pressure, temperature, plasma conditions (power/area, density, etc.), etchant partial pressures, compositions, etc.

After an appropriate adjustment is made via operation 2111, process control returns to operation 2103, where the in-feature flux values or other search variables are re-generated for the new mask geometry and/or etch conditions. Thereafter, the process continues via operations 2105-2109 as described above. After one or more iterations, decision operation 2109 will determine that the predicted EPE brings the mask geometry and/or etch process within specification. At this point, the method fixes a final mask geometry and/or process conditions. See operation 2113.

LUT Description

A lookup table may be viewed as containing a summary of information about geometry, local fluxes, optical in-situ measurements, and/or any other predictor variables at the beginning of the etch, during etch evolution (at any time), and/or at the end of the etch.

Figure 22:
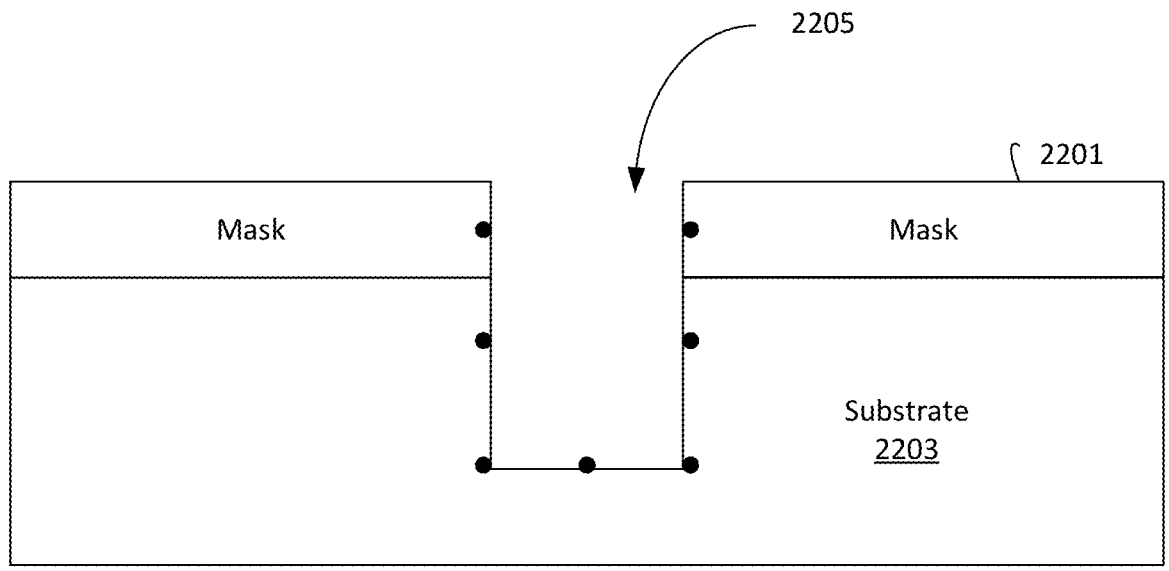

In certain embodiments, a lookup table includes values of the following predictor variables: one or more geometric characteristics of the etched feature (and/or the mask), and one or more in-feature etchant flux characteristics produced during the etch process. Examples of geometric characteristics include line width, line pitch for repeating structures, side wall angle, and feature depth. Examples of in-feature etchant flux characteristics include values of passivant flux, ion flux, and neutral flux, each at various locations in the feature or mask profile. FIG. 22 illustrates an etched feature 2205 in cross-section. Feature 2205 is etched in a substrate 2203 having an overlying mask 2201. Process variables such as in-feature flux values are provided at various locations on the feature and/or its associate mask. In the depicted example, seven locations are chosen, each identified by a black dot on the feature walls. In the depicted embodiment, two are located on the mask sidewalls. One is located on the bottom of the etched feature. In some embodiments, the locations are defined for the completed feature (after full etching). In other embodiments, the locations are defined for the mask only or for the mask and a partially etched feature. As explained above, a CPM may generate in-feature flux values at specific locations in the feature or its mask. The CPM accounts for global plasma conditions and optionally feature-specific conditions such as loadings, visibility kernels, and the like.

In one example, the lookup table includes the following fields or columns for predictor variables: one or more line geometry variable selected from line width, line pitch, and/or feature depth; and one or more in-feature etchant flux characteristics such as a passivant flux, an ion flux, and a radical flux. Examples of other predictor variables include etch rates, optical parameters generated by light interaction with etched features, etc. In addition to the geometric and etchant flux characteristics, the predictor variables may include a time snapshot for the etch process. The time snapshot represents which one of multiple possible time snapshots are presented as entries in the lookup table to represent a full etch process. In the simplest case, an etch process for a feature is represented by only a single time snapshot, in which case the single lookup table entry for that feature is given by the value "1." When an etch process is divided into multiple time snapshots for purposes of the lookup table, each table entry is given a sequential integer number for its associated time snapshot, with time snapshot "2" representing a portion of an etch process occurring immediately after the portion represented by time snapshot "1."

Figure 23:
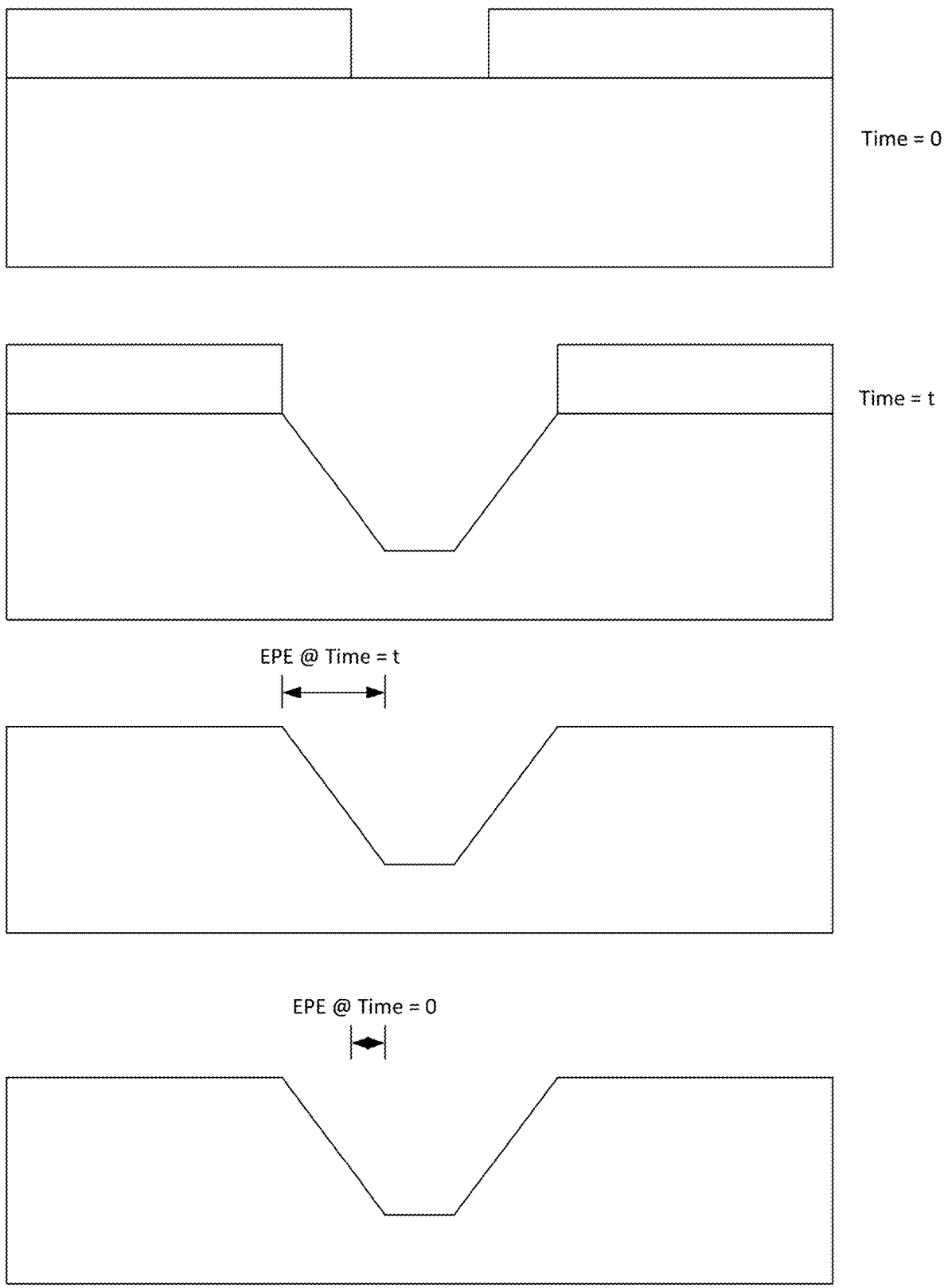

All lookup table entries have an associated value of EPE. In some cases, a lookup table entry contains two or more forms of the EPE. For example, in the example lookup table of FIG. 24, entries include one edge placement error for time equals zero (column 5) and another edge placement error for time equals a later time (column 6), which is the time "t" when the associated time snapshot completes. Both values of EPE represent the lateral position at the bottom of the feature at the end of the time step, but the time=0 value is determined with respect to the top of the etch feature at the time when the etch began, and the time=t value is determined with respect to the top edge of the etch feature at the later time, t. The fact that there are two different values of EPE at different times indicates that the model may account for some lateral etching of the mask at the top of the feature over the course of the time snapshot. FIG. 23 shows how the two different EPE values can be calculated.

In one example, the lookup table includes the following fields or columns:
1. time snapshot index
2. line width (nanometers)
3. pitch (nanometers)
4. depth (nanometers)
5. EPE with respect to time=0
6. EPE with respect to time=t
7-27. etchant fluxes at nine locations in the etch feature. The fluxes are separately provided for three different species, e.g., passivants, neutrals, and ions.

FIG. 24 provides an example of a format of such table. The predictor variables may be divided into two classes: lookup table entry labels, which are geometric parameters of the feature and/or its mask portion (conventionally used to model lithography transfer processes), and search variables, which are used in the present methods in searches of the lookup table for predicted EPE values. In the example above, entry labels are provided in fields 1-4 and the search variables are in fields 7-27. The predicted EPE values are provided in columns 5 and 6. Of course, many other forms of lookup table may be used.

The entry labels represent fixed features defined by the mask geometry and design layout. They are not typically used in the search algorithms described herein. Rather, they specify features that are met exactly by the geometry of the mask under consideration. The search variables are used for comparison against search variables for entering the table and identifying nearest neighbor entries from among all entries in the table; i.e., they are used in the search algorithms described in this section.

Three general approaches will be described herein. Variants of these will be readily identifiable by those of skill in the art and fall within the scope of this disclosure. The first approach uses a single set of in-feature flux values generated at a single time snapshot for the defined simple feature geometry (e.g., an initial feature profile). The second approach uses a single time snapshot but iterates over the etched feature geometry, where each new iteration uses an edge placement error from previous iteration to define a new feature geometry using, e.g., a linear trapezoidal approximation, and with it a new set of fluxes. The third approach iterates over time, and sometimes over geometry within one or more (or all) time increments. Basically, the third approach divides the entire etch process into profiles from multiple sequential time snapshots, with each slice determining an EPE value that is used as the input to the next time step.

Stated another way, the first two approaches use only the initial and end times to make EPE predictions. The third method uses the approach of either one of the first two, but for multiple time snapshots using the results of the previous time snapshot as the starting profile for the next time snapshot. The third approach may be appropriate for certain processes where the correlation of initial fluxes with the final EPE values is weak, such as with particularly deep etches.

First Approach

This approach involves only a single time step and a single spatial iteration. It may contain the following implicit assumptions: (i) the initial mask shape contains sufficient information to predict EPE at the target depth, and (ii) the search variables used in the search at time=0 contain sufficiently unique information to predict the EPE at the final etch depth.

In this approach, the system indexes into the lookup table and identifies one or more nearest neighbor entries based on the search variables, e.g., based on in-feature plasma flux values output by a CPM. The system then calculates an EPE using these one or more entries in the lookup table. The resulting EPE is evaluated to determine whether the mask geometry and/or etch conditions should be modified to bring the process within specification.

Figure 25:
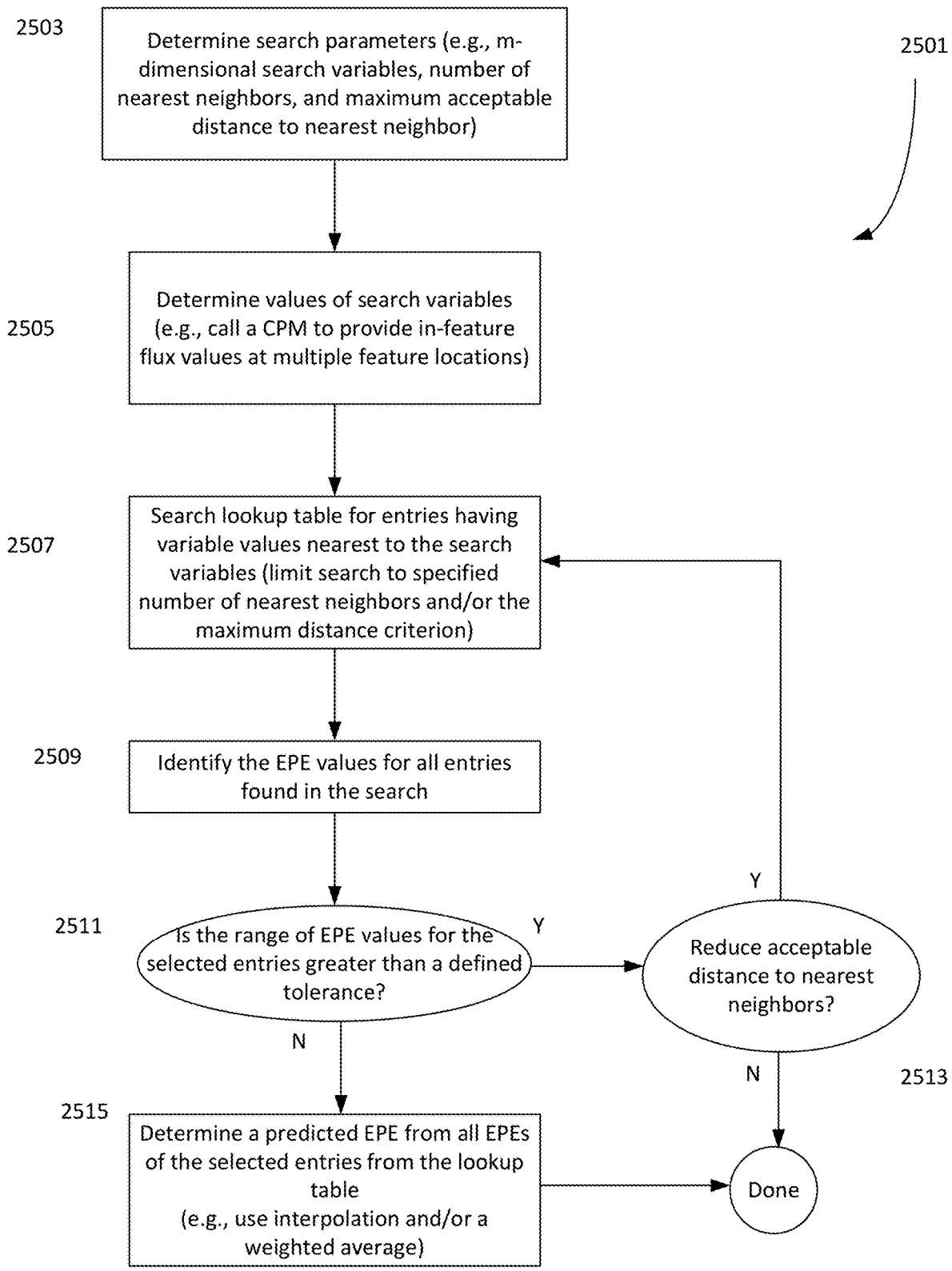

FIG. 25 presents a flow chart 2501 for an example of the first approach. Initially the system determines appropriate parameters for the search. Examples of such parameters include the search variables, the number of entries ("nearest neighbors") to be returned from a lookup table, and a maximum acceptable distance for selecting the nearest neighbor(s).

These parameters may be input by a user who is responsible for determining the mask layout or developing the etch process. Alternatively, these parameters may be set by default in the search routine, or determined automatically based upon particular information about the etch process, the mask, the lookup table (density, sensitivity, etc.), and the like. See block 2503.

Next, the system determines the values of the search variables to be used for identifying nearest neighbors within the lookup table. See block 2505. As mentioned, examples of such search variables include in-feature plasma flux values, which values may be provided at various locations in the etch profile, and for various plasma species such as ions, radicals, neutrals, and/or passivants. Each of the variables has a particular value which can be tested against corresponding values of the entries in the lookup table. An example, of the form of the search variables may be [Flux_ion_pt3_q, Flux_radical_pt3_q, Flux_ion_pt2_q, Flux_radical_pt2_q].

In certain embodiments, the search variables are calculated by another module provided in or for the system. As mentioned, a compact physical model can be used to provide in-feature plasma flux values for various types of plasma species. As explained, these values are dependent upon a position in the etched feature. For purposes of the embodiments of this approach, the etched feature is assumed to have a rectangular profile with a flat bottom and vertical sides. It basically follows the desired shape of the feature as specified by the mask in the design. The compact physical model accounts for the position and edge wall slope of various points within the feature as it calculates the local values of in-feature plasma flux. See FIG. 22.

Alternatives or additions to in-feature plasma flux values may be used as the search variables. Examples include optical parameters such as those that can be measured by a metrology tool and/or calculated by a rigorous optical model, geometric variables for characterizing, e.g., an etch profile, etc. Another type of search variable that may be used is the etch rate (or etch rates) derived from ion and radical fluxes at one or more locations within the feature. One example of a model for predicting etch rates employs ion-neutral synergy model which is used to capture ARDE (Aspect ratio dependent etch) where ER~a×Ji/(1+b Ji/Jn), where Ji and Jn are ion and radical fluxes and a and b are constants. See Bailey, Sanden and Gottscho, J. Vac. Sci. Technology B, Vol. 13, No. 1, 1994, pp. 96-99, which is incorporated herein by reference in its entirety.

With the search variables selected or calculated, they are applied against the lookup table to search for entries having values of corresponding variables nearest to the values of the search variables. See block 2507. Typically, the system conducts a nearest neighbor search. The search may be conducted and limited in various ways. In one example, it is limited by a specified number of nearest neighbors, i.e., "K" nearest neighbors. In other approach, the search is limited to all nearest neighbors within a certain radius of a point defining the collection of search variables in multidimensional search space. In certain embodiments, the distance between the point representing the search variables and the points representing the entries in the lookup table is determined using a Euclidean measure of distance. Other measures of distance may be used as well.

$$[\Sigma_0^m(\text{flux}_{lookup}-\text{flux}_{query})^2]^{0.5}$$

Not all nearest neighbors necessarily meet other criteria required for the etch process and/or feature geometry under consideration. For example, some entries that qualify as near neighbors may be associated with time snapshots or feature geometries that do not match those of the process under consideration. In some embodiments, entries returned from the search at process operation 2507 that do not meet the time and geometry requirements are nevertheless considered in the process of identifying a predicted EPE. This is because the underlying physics relating EPEs to flux values are assumed to apply regardless of feature geometry. In other embodiments, nearest neighbor entries that do not meet one or more criteria of the etch process or geometry under consideration are excluded.

Typically there are one or more entries from the lookup table that qualify as nearby neighbors after execution of operation 2507. For each entry returned in operation 2507, its corresponding value of EPE (typically with respect to the initial etch time if multiple values of EPE are used in the entry) is identified. See operation 2509. If there is only one nearest neighbor entry, its corresponding value of EPE may be used as the predicted value for the process and geometry under consideration. When there are multiple entries available, they may be treated in various ways.

In some embodiments, the search method first determines whether the returned values should be used at all. There can be cases where the returned EPE values are not trustworthy. In one example, the radius or distance used to select nearest neighbors (a parameter received or set in operation 2503) is too large and therefore it selected some entries whose flux parameters do not correlate well with those of the search variables. This may be the case in regions of parameter space where EPE values are highly sensitive to changes in flux or other search variables. In another example, the region of the lookup table where the search focused has problems, possibly because the data or SKM used to produce the entries did not perform well in this region. To address these situations, the depicted search method includes a check 2511 that determines whether the range of EPE values of the selected nearest neighbor entries is greater than a defined tolerance. In one example, the 2511 check determines whether EPE-max−EPEmin is greater than a defined tolerance. (Such tolerance may be set, along with other search parameters, in operation 2503.) Assuming that check operation 2511 determines that the range of returned EPE values is greater than the acceptable tolerance, it may simply end the search without returning a predicted EPE value. Alternatively, it may dynamically reduce the nearest neighbor search radius to thereby reduce the number of returned entries and possibly focus the EPE values on just those that are relevant to the conditions defined by the search variables or are otherwise reliable. Recognizing this option, the depicted method, includes a decision operation 2513 that determines whether to dynamically reduce the acceptable distance to nearest neighbors. If it decides not to do this, for whatever reason, the process is simply terminated without returning a predicted EPE.

If, however, it decides that the acceptable distance should be reduced, it resets the distance and directs the process back to operation 2507, where the search process again identifies a group of nearest neighbors, this time in a more restricted fashion.

Regardless of whether EPE values are identified in one pass or multiple passes, check operation 2511 may determine that the EPE values currently in hand are acceptable. In this case, the search process takes the selected EPE values and identifies a single predicted EPE value that it returns for the etch feature and process under consideration. See operation 2515. In the simplest case, operation 2515 merely identifies the nearest neighboring entry (to the search variables) and treats it as the predicted value of EPE. In another approach, the individual values of the edge placement errors are combined in some manner to produce the overall predicted edge placement error. The combination may be conducted in many ways. In some cases and interpolation is conducted using the search variable point (in multidimensional search variable space) as a point of reference for the interpolation. This may be accomplished by averaging the individual values of edge placement error, optionally by a weighted averaging process in which the individual values of edge placement error weighted according to how close they are to the point representing the search variables. The weighted method may be represented as $$\text{EPE\_predicted} = w1*\text{EPE\_1} + w2*\text{EPE\_2} + \ldots wn*\text{EPE\_}n$$

The predicted value of edge placement error from block 2515 is used to determine whether the mask boundaries and/or process conditions should be adjusted.

In summary, when an etch mask/feature geometry is searched, the search may be carried out among all the entries in the table (sometimes depicted as rows). The search may employ the etch in-feature flux values or other appropriate search variables. A K-nearest neighbors search in n-dimensional predictor flux variables space may be performed to identify entries in the table that have in-feature flux values similar to those of the etch values (i.e., the search variables). As there may be many search variables, identifying the nearest neighbors may require significant computation. Various approaches to determining distance in multi-dimensional space may be employed. Some embodiments employ a Euclidean distance.

The flux values used can be used in either the raw form or normalized. Ion and radical fluxes at different locations may have very different absolute magnitudes. Normalization may give individual search variables equal or relatively equal importance. As an example, one variable might vary only 1% within the LUT, but its importance to EPE prediction might be high, whereas another variable might vary significantly more within the LUT, but EPE prediction is relatively insensitive to it. One method of normalization is autoscaling. For each variable, a mean and standard deviation is calculated. Then, for each measurement normalization is performed by (Xi−mean)/std.

The nearest entries located in the search provide their corresponding post-etch EPE values at time=T (i.e., the time at the end of the etch process). The EPE values obtained from "k" nearest entries are used to make a prediction. The prediction can be based on, e.g., a simple averaging or a weighted average inversely proportional to the distance to the search location.

Certain variations will be appropriate in some situations. When a simple k-nearest neighbor search is used, the prediction performance may be poor for the sparsely populated areas of lookup table where the nearest neighbors are far apart. A maximum search radius parameter may be used so that no prediction is provided if there are no points inside that radius. This can also be used to trigger a signal to add more points to the lookup table at the search location. The maximum search radius parameter can be determined by a sensitivity analysis of one, or more, or each predictor flux to EPE values. In some embodiments, the search method logic permits a user to enter a value specifying a maximum tolerable variation in EPE values returned by the search. Any search that returns EPE values having a variation outside this tolerance is considered a failed search, in which case it does not return a predicted EPE value.

Note that this method does not account for variations in the flux values over the course of the etch process, which variations in flux values are a result of the changing shape of the feature over the course of the etch process. As a feature's shape changes, the geometric normals to various positions on the side walls of the feature also change, thereby changing the in-feature flux values seen at these positions. This approach also does not account for significant changes in flux at various locations over the depth of the profile due to feature geometry changes as the feature opens over the course of the etch process. This latter fact is most pronounced for a long time steps, over which the feature shape changes significantly, or shorter time steps but in which the feature to geometry changes dramatically.

Second Approach

In this approach, the feature geometry is considered to vary over multiple iterations. This approach may involve (i) initially assuming a hypothetical rectangular feature shape to begin the search, (ii) performing one or more iterations that move the bottom of the etched feature by an EPE prediction to produce a new trapezoid feature shape, and (iii) continue iterating until reaching convergence (e.g., the geometric difference such as AEPE no longer varies significantly). Stated another way, an initial guess of the final etch profile is assumed to be a rectangular profile with straight side walls producing EPE=0 nm. Then, at each iteration, the EPE prediction is obtained from the lookup table and this EPE value is used to create a trapezoidal etch profile, which provides the next guess for the final profile. Iterations are continued until EPE values/trapezoid edges do not change significantly to the next iteration. In some implementations, a shape other than a trapezoidal shape is produced; for example, a polygonal or bulb-shaped profile may be generated.

To illustrate this approach, FIG. 26 presents a series of feature cross-sections associated with each iteration. In the first iteration, the etch is assumed to produce a perfectly rectangular cut, in which there is no edge placement error. See the top panel of FIG. 26 in which a feature 2605 is etched in a substrate 2603 as defined by a mask 2601. Using the geometry of feature 2605, a CPM or other computational tool can calculate various flux values that are used to index into the table. The table produces an edge placement error using one or more nearest neighbors as described for the first approach, and that edge placement error is used to define a new shape of the feature, which is presumably trapezoidal, rather than rectangular. The trapezoidal shape accounts for the edge placement error predicted from the lookup table.

The second panel of FIG. 26 illustrates such feature (feature 2605') produced in the second iteration. Additional iterations can be performed, each using the EPE calculated using the geometry from the previous iteration. The third panel illustrates a feature 2605" produced during a third iteration. The feature includes undercut (i.e., a bulb-shaped profile). However, such structures would not provide additional information for methods in which the EPE calculation is limited to the bottom of the feature.

Figure 27:
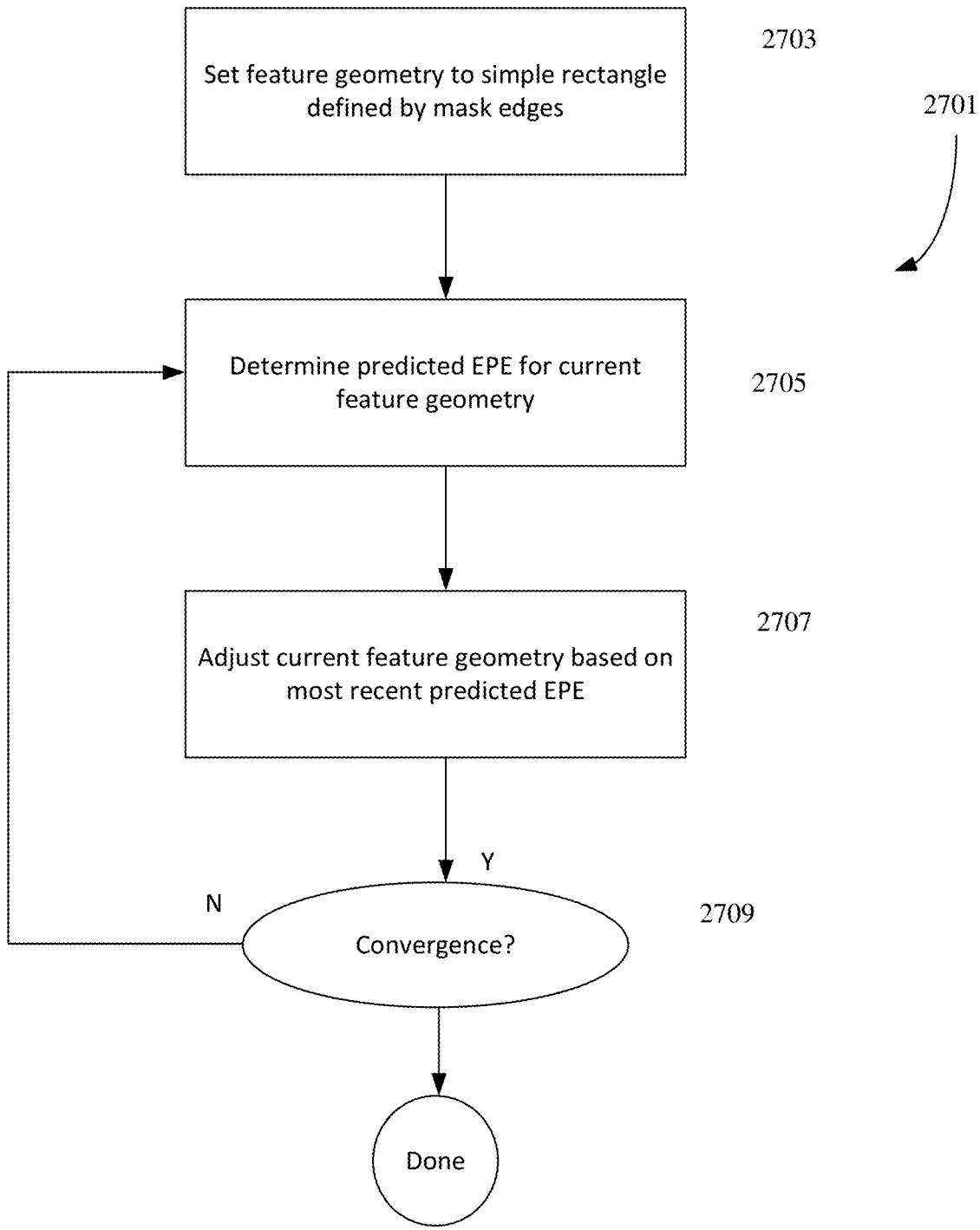

An example method is also illustrated in the flow chart 2701 of FIG. 27. As shown, the method begins with an operation 2703 where the first iteration of a feature shape is defined, which shape is a simple rectangle (e.g., feature 2605 in FIG. 26). Next, the method determines and EPE prediction for the feature shape. See block 2705. The EPE can be determined in many ways, with one notable example being the first approach described above and exemplified in FIG. 25. After the EPE prediction is determined, the method applies to the feature shape from the prior iteration to produce a new feature shape (e.g., feature 2605' in FIG. 26). See block 2707. In some embodiments, the EPE prediction is used to move the bottom edge of the initial rectangle or other trapezoid to form a new trapezoidal structure.

At some point in the process, the edge placement error producing the next polygonal feature shape is so small as to be effectively zero (or is below a defined threshold), in which case the process may be considered to have converged and no further iterations are necessary. See decision block 2709. Often, however, the edge placement error is significant, and the new polygonal shape is used for next iteration, in which case the CPM is used to again calculate a set of fluxes, using the new trapezoidal shape, and those newly calculated fluxes are used to index into the table, or provided as independent variables for a new search, and produce new value of edge placement error. This is represented by decision block 2709 directing process control back to block 2705.

If the next value of edge placement error meets convergence criteria, no further iterations are necessary. However, if it is considered that the process has not have converged, the shape of the feature is again adjusted to account for this further edge placement error and this new polygon is used to generate a new set of flux values, again using, e.g., the compact physical model, but with the new shape. These new fluxes are then used to yet again index in the table or as input variables for a model and give yet a further value of edge placement error, which is compared to the previous value of edge placement error determine whether convergence has been reached. Ultimately, after a number of iterations, the process converges to a final value of predicted EPE.

Third Approach

The first two approaches, as described above, use the initial and end times of the etch to make a single EPE prediction. In some cases, particularly for deep or high aspect ratio etches, the correlation of initial fluxes with the final EPE values may be weak. For example, the flux values might vary over the course of the etch process. The third approach addresses this concern by employing the methodology used in the first two approaches, but for multiple time snapshots, with each new iteration using the results of the previous time snapshot as the starting point for the next time snapshot.

In other words, the search method is carried out in multiple increments of time, each of which may be available as a time snapshot in the lookup table. The EPE prediction for one time increment is used to define a "mask" for the next time increment. The method may be implemented such that within each increment, either the first or the second approach is performed (i.e., iterations over etch geometry are performed within a single time increment).

Viewed another way, this approach divides the etch process into multiple portions, with each portion corresponding to a different fraction of the total time required for the etch process, and correspondingly a particular depth of the etch process. For example, if an etch process runs from start to finish over 30 seconds, it can be divided into three 10 second portions, or two 15 second portions, or a 15 second portion, a 10 second portion, and a 5 second portion, etc.

In this third approach, each of the portions is treated as a single complete etch process using, e.g., one the first two approaches to define a predicted EPE. At the end of a time snapshot, the ending edge placement error is used to define a new design layout (e.g., mask opening) for the next time snapshot, of the etch process.

Over the course of all the time snapshots, the overall edge placement error accumulates. In other words, each time snapshot generates its own edge placement error. At the end of the overall process, the total edge placement error may be read as the sum of the edge placement errors generated for each time snapshot. Alternatively, the overall position defined by the EPE of the final time increment may be read as the critical dimension at the bottom of the final etched feature portion. The final positions at the bottom of the etched feature, after the last time snapshot, are measured with respect to the mask or design layout positions at the beginning of the first time snapshot (e.g., at time equals 0). This final position also defines the overall edge placement error over the course of all the time snapshots.

Figure 28:
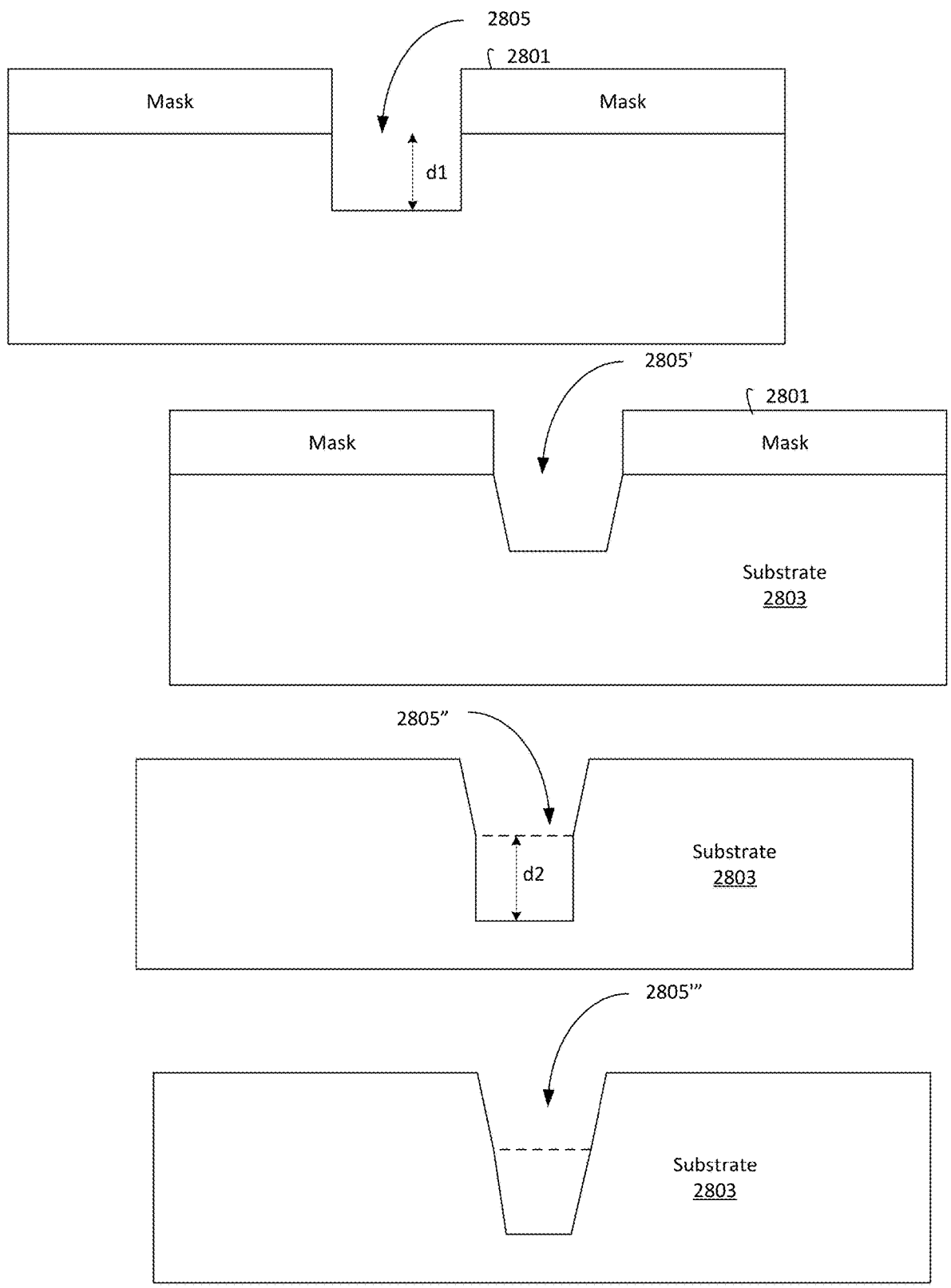

An example of this third approach is illustrated graphically in FIG. 28. The top two panels illustrate prediction of an initial or partial EPE calculated during a first time snapshot which represents a partial etch into a substrate 2803. The bottom two panels illustrate prediction of a further EPE calculated during a second time snapshot which represents the remainder of the etch into the substrate. Further partial etching at additional time snapshots are possible, but not shown in this illustration.

In the top panel, the method begins by assuming a perfectly straight etch profile to create a rectangular feature 2805 into substrate 2803. The side walls of feature 2805 are defined by the edges of a mask 2801. The depth "d1" of feature #2805 is determined by the duration of the first time snapshot (as executed with a defined set of etch conditions). This rectangular feature structure is similar to that used to start the methods in the first and second approaches, but it is only a fraction of the total etch depth, which total is greater than d1.

After forming the rectangular partial etch profile as shown in the top panel, the method determines a predicted EPE for that profile. In this regard, the method may use the first or second approaches described above, or alternatively some other approach. Application of the predicted EPE is shown in the trapezoidal feature profile 2805' of the second panel. At this point, the method is still within the first time snapshot.

The initial treatment of the second time snapshot is depicted in the third panel, where the feature is cut to a further depth of d2. This deeper portion of the feature is initially treated as a rectangular structure having vertical side walls. This produces an overall funnel shaped feature 2805''. This feature (and/or the fluxes associated with it) is then used to search the lookup table using an appropriate algorithm (e.g., the first or second approach) to generate a second EPE. That EPE is then applied to the feature 2805'' to produce a final feature 2805' (with its corresponding final CD at the bottom of the full depth feature) as shown in the fourth panel.

In an alternative approach, the second time snapshot is analyzed without including the top portion of the feature (the portion analyzed in the first time snapshot). In this approach, the first time snapshot is used to generate a first EPE, which adjusts the size (CD) of the bottom of the feature. This adjusted size of the feature bottom is then used as a starting point for the analysis during the second time snapshot. In effect, the second time snapshot analysis is given a fresh substrate with a flat top surface and a mask having an opening having the size of the adjusted feature bottom from the first time snapshot analysis. A second EPE is the generated during the second time snapshot, and the two EPEs are summed to produce the final predicted EPE. While the two analyses were performed using separate hypothetical substrates, the final feature has a full depth corresponding to the sum of the two partial depths. The final feature also has an EPE that is the sum of the two EPEs. Of course, the analysis may be performed in more than two time snapshots.

Figure 29:
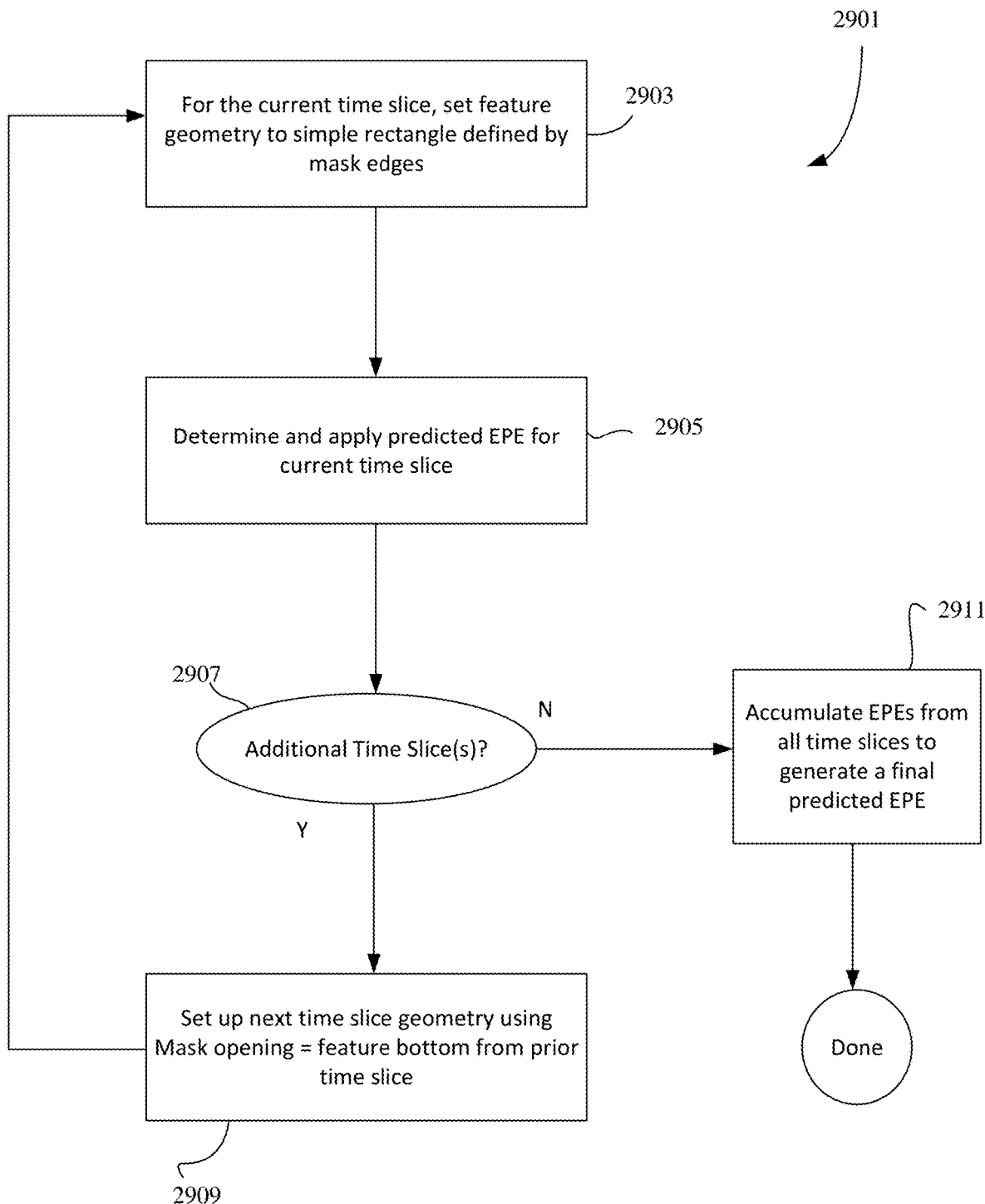

FIG. 29 presents a flow chart 2901 of an example of the third approach. The depicted process begins with an operation 2903 where for an initial time snapshot, a feature is initially defined with a rectangular profile and depth specified by the time snapshot. Using this profile, the lookup table is searched to determine a predicted EPE for the first time snapshot. See operation 2905. The newly determined EPE is immediately applied to adjust the rectangular feature to a trapezoidal feature. The process of defining an initial rectangular feature and then calculating and applying an EPE is repeated for each time snapshot. And each time the process checks to determine whether any further time snapshots are required to reach the full etch depth. See decision operation 2907. When needed, the method enters the next time snapshot by generating a mask opening having dimensions determined by the dimensions of the feature bottom from the prior time snapshot. See operation 2909. After setting the mask dimensions, process control returns to operation 2903 where the feature geometry is initialized as a rectangular structure having sidewalls defined by the "mask" from operation 2909. After all the EPEs have been determined for all time snapshots required to reach the full etch depth, process control is directed to an operation 2911, where the EPEs from all time snapshots are summed to produce the final predicted EPE.

Model Representing Information in a Lookup Table

Certain embodiments use a tool other than a lookup table to predict EPE values. In some cases the tool is a model that is configured to receive predictor variables as inputs and directly (or indirectly) provides predicted EPE values as outputs. In certain embodiments, such models operate in a manner that does not search for table entries matching predictor variables. Examples of predictor variables include those mentioned for lookup table (e.g., in-feature flux values at various feature positions), as well as geometric parameters such as line width, line pitch, feature depth, and etch time. Measured or calculated optical parameters may also be used.

In some implementations, the model is generated from a training set that may include values taken directly from an SKM model, along with the input parameters to the SKM, e.g., the various flux values and geometry values. The model may be generated using any of a number of techniques including regression techniques (e.g., partial least squares), machine learning (including deep learning), and the like. The model may have any of many different forms including a relationship such as linear or non-linear expression relating EPE to predictor values, a neural network, a classification tree, and the like. Specific examples of model forms include relationships generated using partial least squares and/or principal component analysis.

In certain embodiments, a model is valid for a small time increment but may be usable in the case where multiple time increments are used to calculate the edge placement error. Each time increment uses the model again. As an example, a model may be trained to work with time snapshots that etch to a depth of between about 10 and 80 nanometers.

In certain embodiments, the method builds a partial least squares multivariate model for correlating flux evolution over multiple time snapshots, each determining an incremental $\Delta FPE\_i$ change for a time snapshot T. Starting from initial mask shape at time=0, the model can predict $\Delta FPE$ for the next time snapshot and sum over all time snapshots to find the final EPE at target time(depth). This approach may be applicable in the simpler cases, where only a single time snapshot, which may be relatively long, is used to generate a predicted EPE from input predictor variables.

Mask Erosion

Certain embodiments of the disclosed search and analysis methods account for mask erosion occurring during an etch process. The lookup table search and EPE prediction method may do this in one or more time snapshots. Each of the various approaches described herein calculates an edge placement error at the end of a time step. During that time step, the mask may erode, thereby changing the line width or perhaps some other geometric parameter that effects in-feature fluxes.

To address mask erosion, the process may employ a separate lookup table and or model for calculating the adjustment in the position of the mask at the top of the layer to be etched. This difference or error in the mask edge position at the top of the layer to be etched may be fed back into the process for calculating edge placement error in the feature being etched. In some implementations, the mask erosion is accounted for by dividing an etch process that would otherwise be considered in one step into multiple time steps. Each time step may use a different mask opening for calculating the EPE. Another approach is to assume that mask erosion will occur during a time snapshot and setting the mask opening, for purposes of the lookup table search, to be an intermediate size between the starting and ending positions of the mask opening over the time snapshot.

Spatial Representation of Features

Another approach that may apply to some or all of the implementations, including the three approaches described above, involves the representation of a feature in terms of points in space on the feature. In some examples, the method provides predictor variable values at multiple points in a cross-section of a feature being etched.

The point locations may be provided at many be provided at various locations on a feature. For example, they can be chosen by distributing points evenly on the profile arc length (angularly distributed) or distributed evenly at fixed height differences on each sidewall and/or distributed evenly at fixed "x-direction" distances at the bottom of the feature. In some embodiments, such as some that use flux values for only an initial time snapshot, the point locations may be on the mask layers, including on the mask sidewalls and the open area at the bottom of the mask opening. When multiple time slices are used, the points may be on the mask layer and the target layer to be etched as well.

Considering FIG. 22, for example, on the left side of a feature, a point number 1 might be within a mask layer, near where the etch begins, while a point number 3 might be also on the left side of the etch feature but at the very base or foot of the etched feature. A point number 2 might be at an intermediate position on the left side of the etch profile between points 1 and 3. A point number 4 might be in the base or foot of the etched region but intermediate between the left and right sides of the etch profile. Similarly, points numbers 5, 6, and 7 might be on the right side of the etch profile. FIG. 26 shows cross-sections with multiple in-feature flux points also shown. In some implementations, the number of points under consideration is 2n+1, where n is the number of points representing one of the sides of the etch profile. Some methods employ nine or more points, some employ eleven or more points, and some even employ thirteen or more points.

Each of the points under consideration will have its own geometric normal and associated visibility features. These features may be used by the compact physical model to calculate one or more in-feature fluxes at the position of the point under consideration.

Compact Physical Model to Provide Predictor Variable Values

Another approach that is generally applicable to some or all of the approaches described herein is the use of a CPM to calculate in feature flux values. As described elsewhere herein, the CPM takes as input the global etchant flux information within the reactor, which may include some variation from center to edge of the wafer. Such variation occurs over distances that are large with respect to the size of the features being etched.

In some cases, input to the CPM also includes information about the loading of the features on the wafer and/or in-feature visibility. The CPM outputs values of in-feature flux values. As explained, it may output different values for different positions within a feature, those positions can be identified by x, y, and optionally z coordinates. In some embodiments, they can be identified using angular components such as by using polar or cylindrical coordinates. The designer of a lookup table or model for providing predicted edge placement error values may choose some subset of the in-feature flux values, as calculated by a CPM, as being most relevant for a particular process that is represented using the lookup table or a model. In one example, the designer chooses twenty-seven flux values in total, with nine flux values for ion fluxes at nine different positions within a feature. As mentioned, there may be multiple different flux species under consideration, such as ions, passivants, and radicals.

Choosing EPE Values from a LUT

Yet another methodology that can apply to many EPE prediction approaches is how to choose a particular entry in the lookup table. When searching a lookup table, there may be multiple entries that are close to the values of the search variables under consideration. In a simplest case, the closest entry, i.e. the entry with the set of parameter values closest to those used to conduct the search, is chosen for the edge placement error value. This may be appropriate when the distance between a point defined by search variables is very close to a point representing one table entry by not close to any other points representing other table entries.

Note that distance between parameter values may be chosen as, for example, a simple Euclidean distance in multidimensional parameter space. In some embodiments, the distance is scaled based upon the sensitivity of edge placement error as a function of position in the parameter space.

Another technique for determining the edge placement error from lookup table entries involves selecting multiple nearest neighbors, and then providing some kind of combination of those entries, or their edge placement error values. In the simplest case, all of the selected nearest neighbors in the lookup table have their edge placement errors averaged. In another embodiment, a weighted average is performed based upon the distance from the point in space represented by the value used index in the table. Table entries that are closer to the indexing set of parameter values are given a higher weight in the average than entry values that are further away space. This is a form of interpolation.

Some masked etch processes may involve the etching of a multilayer stack of material where the different layers in the stack may have different material compositions. Assuming this is done with one mask (i.e., the multilayer etch processes is done subject to the same pattern of photoresist, then to do an effective PPC of a design layout, one is really interested in the cumulative EPE corresponding to the entire multilayer etch process (subject to the single photoresist pattern) rather than just the EPE associated with the etching of an individual layer.

The procedures described above for calculating EPE through the use of a CPM-produced in-feature etch conditions for indexing into a ROM LUT may be used to accomplish this, however in practice, there are several variations as to how this may be done. One way is to just build a large ROM LUT which corresponds to the entire multilayer etch process. Because the ROM LUT described above may include a time/depth field (see, e.g., FIGS. 13B and 13C), this field provides a way to index into the LUT to locate the appropriate EPE, which would then be a cumulative EPE for the entire process. In other words, building the ROM this way would already, in principle, effectively account for the presence of the different material layers, their thicknesses, etc. However, it is noted that for this to be accurate in practice, it may be important to implement the iterative time/depth-slicing scheme just described with respect to FIG. 20. For instance, in the context of a multilayer stack where different layers have different material compositions and, moreover, where different etch chemistries may be used to etch through the various layers, the accuracy of the estimated EPE may be dramatically improved by matching the time/depth-slicing iterations to the depths (or etch-times) of the different layers. At these points, because the chemistries change, the EPE at the bottom of a single layer may only be well-correlated with the characteristics of IFPF at the top of that same layer, rather than at the top of the entire multilayer stack.

While using a single monolithic LUT representative of the entire multilayer etch process (in a cumulative fashion) may be effective in many circumstances, a potentially more flexible way of dealing with the multilayer stack issue is to build a set of smaller ROM LUT each of which corresponds to one of the different layers of material in the multilayer stack. Flexibility is one advantage of such an approach in that the same set of ROM LUT may be used for many different material stack configurations, so long as there is a LUT corresponding to the material composition of each layer and it has entries going down to sufficient etch time/depth to account for the thickness of the layer in a particular stack configuration. Taking the simpler case of 2 layers of different materials—and thus 2 corresponding ROM LUT—one would first index into the LUT corresponding to the top layer to calculate the EPE associated with an etch of this layer down to its base—i.e., just to the top of the layer beneath—and then, second, with this first EPE in hand, use it to compute the visibility of the underlying second layer for purposes of indexing into the second LUT to calculate a EPE at the base of the bottom layer. This latter EPE then represents a cumulative EPE for the 2-layer etch process. This is thus like a 2-step version of the iterative time/depth-slicing approach just described, but more flexible in that each step uses a separate LUT. More than 2 layers could be handled analogously with additional layer/material-specific ROM LUT, using the previously computed EPE to index into the ROM LUT for the next layer down, and so forth. With either the single or multiple ROM LUT approach for dealing with a multilayer stack, generally speaking, any of the procedures described above for calculating EPE through the use of a CPM and a ROM look-up table may be used, as would be appreciated by one having skill in the art.

However, with respect to the foregoing described treatment of multilayer etch processes using the multiple LUT (one per layer) approach, it is noted that in certain circumstances complications may arise depending on the composition of the layers and the details of the etch process(es) involved. In some embodiments, these complications may in general arise when the etching of an underlying layer (second layer, third layer, etc.) depends on some characteristic or result of the etching of one or more layers above it which are not accounted for in the layer-specific LUT corresponding to the underlying layer. For instance, the very presence of the layers above the layer being etched (i.e., the layers which have already been etched though) may change and/or affect the chemistry of the process which etches the underlying layer. If this altered chemistry was not accounted for by the EPM which was used to build the layer-specific LUT, then use of said LUT will not yield accurate estimates of the cumulative EPE. In such cases, the remedy may be building the LUT specific to the underlying layer using an EPE which does take the presence of the layers above it into account. That being said, it should also be noted that the mere shadowing effects of the layers above the layer being etched may actually be well-accounted for by the layer-specific LUT through the visibility kernel. However, for the shadowing effects of the overlying layer(s) to be well-accounted for, any changes in their shapes during the etch process operating on the underlying layer should also likely be considered.

Again, one of skill in the art should also appreciate that the layer-by-layer approach just described is a time-slicing approach similar to what is described above with respect to FIG. 20—$t_1$ corresponding to the etching through of the first layer in the stack, $t_2$ corresponding to etching through the second layer in the stack, and so forth.

Finally, it is noted that the foregoing techniques for generating proximity-corrected design layouts for photoresist for use in photomask generation and semiconductor etch operations may be implemented in a computer system. Such a computer system would typically have one or more processors, and one or more memory units, the latter of which would typically store computer-readable instructions (for execution on the one or more processors), the instructions implementing any of the foregoing methodologies. In some embodiments, such systems may operate by reading an initial design layout from a computer-readable medium, and writing the final proximity-corrected design layout to a computer-readable medium. The techniques and operations disclosed herein may also be embodied in computer-readable instructions stored on one or more computer-readable media.

Likewise, plasma etch systems for etching semiconductor substrates may include a computer system as just described, as well as a photolithography module configured to (i) receive a proximity-corrected design layout for photoresist from the computer system, (ii) form a mask from the proximity-corrected design layout, and, optionally at a later time, (iii) perform a photolithography operation using the mask to transfer a layer of photoresist to a semiconductor substrate substantially conforming to the proximity-corrected photoresist design layout. Such plasma etch systems would then also include a plasma-etcher component (e.g., with a reaction chamber, plasma generation hardware, wafer support, etc.) which is configured to generate a plasma which then contacts the semiconductor substrate and etches those portions of the substrate surface not covered with the photoresist transferred by the photolithography module. Operation (iii) may be performed repeatedly for a given mask produced in (ii).

By applying the foregoing described principles, techniques, and methodologies, a physics-aware pattern proximity correction (PPC) solution may be provided to IC device designers. For given processing recipe and material stack, EDA (electronic design automation) tools may be implemented with the capability of predicting (approximately, but with good accuracy) the etch transfer function for a given incoming design layout for photoresist—as explained with respect to FIG. 12, this has the capability of significantly lowering photomask development costs and dramatically shorten time to solution. It is further envisioned that through the foregoing described principles, techniques, and methodologies, that process window libraries may be made available from which sensitivity matrices can be generated rapidly with minimal consumption of test wafers and time-intensive physical experimentation. These may be bundled with system sales or sold separately, possibly with periodic updates for new films stacks and processes. In addition, in some embodiments, it may be possible to create designs that were made to fit a specified process rather than the process necessarily being developed to fit a given design. This potentially would allow tool selections to be made at time of design (locked-in (or locked-out) early), and thereby a level of minimum variability could be designed-in at the outset. Moreover, the ability to predict edge placement error from computational principles early on may allow for early fault-detection and classification, not otherwise easily possible.

System Controllers

A system controller may be used to control etching operations (or other processing operations) in any of the above described processing apparatuses, such as the CCP etcher apparatuses shown in FIGS. 9A-9C, and/or the ICP etcher apparatus shown in FIG. 10. In particular, the system controller may implement an optimized EPM as described above and adjust operation of an etcher apparatus in response to computed etch profiles generated using the optimized EPM (as described above).

An example of a system controller in communication with an etcher apparatus is schematically illustrated in FIG. 10. As shown in FIG. 10, system controller 1050 includes one or more memory devices 1056, one or more mass storage devices 1054, and one or more processors 1052. Processor 1052 may include one or more CPUs, ASICs, general-purpose computer(s) and/or specific purpose computer(s), one or more analog and/or digital input/output connection(s), one or more stepper motor controller board (s), etc.

In some embodiments, a system controller (e.g., 1050 in FIG. 10) controls some or all of the operations of a process tool (e.g., etcher apparatus 1000 in FIG. 10) including the operations of its individual process stations. Machine-readable system control instructions 1058 may be provided for implementing/performing the film deposition and/or etch processes described herein. The instructions may be provided on machine-readable, non-transitory media which may be coupled to and/or read by the system controller. The instructions may be executed on processor 1052—the system control instructions, in some embodiments, loaded into memory device 1056 from mass storage device 1054. System control instructions may include instructions for controlling the timing, mixture of gaseous and liquid reactants, chamber and/or station pressures, chamber and/or station temperatures, wafer temperatures, target power levels, RF power levels (e.g., DC power levels, RF bias power levels), RF exposure times, substrate pedestal, chuck, and/or susceptor positions, and other parameters of a particular process performed by a process tool.

Semiconductor substrate processing operations may employ various types of processes including, but not limited to, processes related to the etching of film on substrates (such as by atomic layer etch (ALE) operations involving plasma-activation of surface adsorbed etchants, see, e.g., U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," which is hereby incorporated by reference in its entirety for all purposes), deposition processes (such as atomic layer deposition (ALD), by plasma-activation of surface adsorbed film precursors), as well as other types of substrate processing operations.

Thus, for example, with respect to a processing apparatus for performing plasma-based etch processes, the machine-readable instructions executed by a system controller may include instructions for generating a computed etch profile from an optimized EPM and adjusting operation of the plasma generator in response to the computed etch profile.

System control instructions 1058 may be configured in any suitable way. For example, various process tool component subroutines or control objects may be written to control operation of the process tool components necessary to carry out various process tool processes. System control instructions may be coded in any suitable computer readable programming language. In some embodiments, system control instructions are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 1058 may include input/output control (IOC) sequencing instructions for controlling the various parameters described above. For example, each phase of a deposition and/or etch process or processes may include one or more instructions for execution by the system controller. The instructions for setting process conditions for a film deposition and/or etch process phase, for example, may be included in a corresponding deposition and/or etch recipe phase. In some embodiments, the recipe phases may be sequentially arranged, so that all instructions for a process phase are executed concurrently with that process phase.

Other computer-readable instructions and/or programs stored on mass storage device 1054 and/or memory device 1056 associated with system controller 1050 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal and to control the spacing between the substrate and other parts of process tool. The positioning program may include instructions for appropriately moving substrates in and out of the reaction chamber as necessary to deposit and/or etch film on the substrates.

A process gas control program may include instructions for controlling gas composition and flow rates and optionally for flowing gas into the volumes surrounding one or more process stations prior to deposition and/or etch in order to stabilize the pressure in these volumes. In some embodiments, the process gas control program may include instructions for introducing certain gases into the volume(s) surrounding the one or more process stations within a processing chamber during film deposition and/or etching operations on substrates. The process gas control program may also include instructions to deliver these gases at the same rates, for the same durations, or at different rates and/or for different durations depending on the composition of the film being deposited and/or the nature of the etching process involved. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates and/or etching of the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates and/or etching of the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on and/or etching of the substrates.

In some embodiments, there may be a user interface associated with the system controller. The user interface may include a display screen, graphical software displays of the apparatus and/or process conditions, and user input devices such as pointing devices, keyboards, touch screens, microphones, etc.

In some embodiments, parameters adjusted by system controller may relate to process conditions. Non-limiting examples include process gas compositions and flow rates, temperatures (e.g., substrate holder and showerhead temperatures), pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of the system controller from various process tool sensors. The signals for controlling the processes may be output on the analog and/or digital output connections of the process tool. Non-limiting examples of process tool sensors that may be monitored include mass flow controllers (MFCs), pressure sensors (such as manometers), temperature sensors such as thermocouples, etc. Appropriately programmed feedback and control algorithms may be used with data from these sensors to maintain process conditions.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module (employing inductively or capacitively coupled plasmas), a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Other Embodiments

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing the foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

What is claimed is:

1. A computer system for determining a layout of a lithography mask for an integrated circuit fabrication etch process, the system comprising:
   one or more processors, and
   a memory, the memory storing computer-readable instructions for execution on the one or more processors, including instructions for:
   (a) receiving a starting lithography mask layout for a feature to be etched in a partially fabricated integrated circuit;
   (b) obtaining an etch process condition for at least one location within the feature to be etched or within an opening in the mask over the feature, wherein the etch process condition is predicted to be produced during the integrated circuit fabrication etch process;
   (c) identifying an in-feature edge placement error for the feature by applying the etch process condition to a lookup table or a model that provides predictions of in-feature edge placement error caused by the integrated circuit fabrication etch process within the feature, wherein applying the etch process condition to the lookup table or the model identifies one or more putative values of in-feature edge placement error that correspond to the in-feature etch process condition; and
   (d) modifying a position of the starting lithography mask layout for the feature to compensate for the in-feature edge placement error identified in (c) by applying the etch process condition to the look up table or the model.

2. The computer system of claim 1, wherein instructions for receiving the starting lithography design layout in (a) comprise instructions for receiving the starting lithography design layout from a computer-readable medium; and
   wherein the computer-readable instructions stored in the memory for execution on the processor further include instructions for:
   (e) writing the modified lithography mask layout from (d) to the computer-readable medium.

3. The computer system of claim 1, wherein the instructions for receiving the starting lithography mask layout comprise instructions for receiving the starting lithography mask layout produced by an optical proximity correction process.

4. The computer system of claim 1, wherein the instructions for modifying the position of the starting lithography mask layout comprise instructions for providing the in-feature edge placement error identified in (c) to an optical proximity correction process.

5. The computer system of claim 1, further comprising instructions for calculating the etch process condition using process conditions expected to be produced in a plasma reactor where the integrated circuit fabrication etch process is to be performed.

6. The computer system of claim 5, wherein the instructions for calculating the etch process condition comprise instructions for applying the process conditions to a compact physical model.

7. The computer system of claim 6, wherein the compact physical model is configured to account for loading caused by features on the integrated circuit and/or visibility to plasma within the feature.

8. The computer system of claim 1, wherein the instructions for obtaining the etch process condition comprise instructions for obtaining etch process conditions for a plurality of locations within the feature or within the opening in the mask, and
   further comprising instructions for applying the etch process conditions for the plurality of locations to the lookup table or the model.

9. The computer system of claim 8, wherein the lookup table or the model is configured to identify the one or more putative values of in-feature edge placement error that correspond to the etch process conditions for the plurality of locations.

10. The computer system of claim 1, wherein the instructions for applying the etch process condition to the lookup table or the model comprise instructions for identifying a plurality of putative values of edge placement error.

11. The computer system of claim 10, further comprising instructions for interpolating between the plurality of putative values of edge placement error to provide the in-feature edge placement error identified by the instructions for applying the etch process condition to the lookup table or the model in (d).

12. The computer system of claim 1, further comprising the following instructions for execution after the instructions for (c) and before the instructions for (d):
   determining a profile of the feature to be etched from the in-feature edge placement error identified in (c);
   using the profile to obtain an updated etch process condition; and
   applying the updated etch process condition to the lookup table or the model to obtain an updated in-feature edge placement error,
   wherein the instructions for modifying the position of the starting mask layout in (d) comprise instructions for compensating for the updated edge placement error.

13. The computer system of claim 1, wherein instructions (a) (c) are performed for an initial time step of the integrated circuit fabrication etch process; and
   further comprising instructions for
      determining a profile of the feature to be etched at the end of the initial time step of the integrated circuit fabrication etch process, and
      applying the profile of the feature to repeat execution of instructions (a) (c) for a subsequent time step of the integrated circuit fabrication etch process,
   wherein the instructions for modifying the position of the starting mask layout in (d) comprise instructions for compensating for the in-feature edge placement error identified for the subsequent time step of the integrated circuit fabrication etch process.

14. A system for etching semiconductor substrates, the system comprising:
   the computer system of claim 1;
   a photolithography module configured to:
      receive the modified lithography mask layout from (d) from the computer system;
      form a mask from the modified lithography mask layout from (d); and
      perform a photolithography operation using the mask to transfer a layer of photoresist to a semiconductor substrate; and
   a plasma-etcher configured to generate a plasma which contacts the semiconductor substrate and etches those portions of the substrate surface not covered with photoresist transferred by the photolithography module.

* * * * *